US012592269B2

(12) United States Patent　(10) Patent No.: US 12,592,269 B2
Kurokawa et al.　(45) Date of Patent: Mar. 31, 2026

(54) SEMICONDUCTOR DEVICE, DISPLAY APPARATUS, DATA PROCESSING SYSTEM, AND CONTROL SYSTEM OF THE SEMICONDUCTOR DEVICE

(71) Applicant: Semiconductor Energy Laboratory Co., Ltd., Atsugi (JP)

(72) Inventors: Yoshiyuki Kurokawa, Sagamihara (JP); Masashi Fujita, Fuchu (JP); Kazuaki Ohshima, Atsugi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 83 days.

(21) Appl. No.: 18/715,300

(22) PCT Filed: Dec. 5, 2022

(86) PCT No.: PCT/IB2022/061753
§ 371 (c)(1),
(2) Date: May 31, 2024

(87) PCT Pub. No.: WO2023/111763
PCT Pub. Date: Jun. 22, 2023

(65) Prior Publication Data
US 2025/0029648 A1　Jan. 23, 2025

(30) Foreign Application Priority Data

Dec. 17, 2021　(JP) ................................. 2021-204956
Jan. 21, 2022　(JP) ................................. 2022-007524
(Continued)

(51) Int. Cl.
*G11C 11/00*　(2006.01)
*G11C 11/405*　(2006.01)
*H10B 12/00*　(2023.01)

(52) U.S. Cl.
CPC ............ *G11C 11/405* (2013.01); *H10B 12/00* (2023.02)

(58) Field of Classification Search
CPC ........ G11C 2211/5642; G11C 2213/15; G11C 2213/53; G11C 2213/74; G11C 2213/79;
(Continued)

(56) References Cited

U.S. PATENT DOCUMENTS 9,477,294 B2　10/2016　Nishijima et al.
9,971,680 B2　5/2018　Uesugi et al.
(Continued)

FOREIGN PATENT DOCUMENTS

CN　113632162 A　11/2021
JP　2013-009297 A　1/2013
(Continued)

OTHER PUBLICATIONS

International Search Report (Application No. PCT/IB2022/061753) Dated Mar. 7, 2023.
(Continued)

*Primary Examiner* — Thong Q Le
(74) *Attorney, Agent, or Firm* — Eric J. Robinson; Robinson Intellectual Property Law Office, P.C.

(57) ABSTRACT

A semiconductor device with a novel structure is provided. The semiconductor device includes a register. The register includes a flip-flop and a plurality of data retention circuits. The flip-flop includes a first transistor in which a semiconductor layer including a channel formation region is silicon, an input terminal of the flip-flop is electrically connected to each of output terminals of the data retention circuits, and an output terminal of the flip-flop is electrically connected to each of input terminals of the data retention circuits. The data retention circuits include a second transistor in which a semiconductor layer including a channel formation region is
(Continued)

an oxide semiconductor, and when the second transistor is in a non-conduction state, the data retention circuits have a function of retaining a potential corresponding to data corresponding to a plurality of tasks. A state control portion rewrites data that the flip-flop has on the basis of data retained in the data retention circuits in accordance with the plurality of tasks executed by a processor core.

9 Claims, 31 Drawing Sheets

(30)          Foreign Application Priority Data

Mar. 4, 2022     (JP) ................................. 2022-033086
Mar. 11, 2022    (JP) ................................. 2022-037769

(58) Field of Classification Search
CPC ......... G11C 7/062; G11C 7/08; G11C 11/005;
G11C 11/406; G11C 11/4074; G11C
11/4096; G11C 11/4097; G11C 11/4099;
G11C 11/413; G11C 11/417; G11C 14/00;
G11C 16/0433; G11C 16/14; G11C
17/12; G11C 2211/4065; G11C 2216/14;
G11C 7/10; G11C 8/08; G11C 11/418;
G11C 5/14; G11C 7/065; G11C 7/18;
H10B 41/70; H10B 99/00; H10B 12/00;
H10B 69/00; H10B 12/033; H10B 20/25;
H10B 41/30; H10B 51/30; H10B 10/12;
H10B 12/10; H10B 12/315; H10B 43/30;
H10B 99/14; H10B 12/01; H10B 12/48;
H10B 12/488; H10B 12/50; H10B 20/27;
H10B 20/30; H10B 41/10; H10B 41/35
See application file for complete search history.

(56)                References Cited

U.S. PATENT DOCUMENTS

| | | | | |
|---|---|---|---|---|
| 10,223,110 | B2 * | 3/2019 | Saeki | .................... G06F 9/3869 |
| 10,324,521 | B2 | 6/2019 | Nishijima et al. | |
| 2004/0222773 | A1 | 11/2004 | Gardner et al. | |
| 2012/0170355 | A1 | 7/2012 | Ohmaru et al. | |
| 2014/0068300 | A1 | 3/2014 | Nishijima et al. | |
| 2014/0108836 | A1 | 4/2014 | Nishijima et al. | |
| 2015/0363136 | A1 | 12/2015 | Uesugi et al. | |
| 2017/0139635 | A1 | 5/2017 | Jayasena et al. | |
| 2017/0351450 | A1 | 12/2017 | Brandl et al. | |
| 2022/0187871 | A1 | 6/2022 | Yamazaki et al. | |
| 2022/0350571 | A1 | 11/2022 | Yamazaki et al. | |

FOREIGN PATENT DOCUMENTS

| | | | |
|---|---|---|---|
| JP | 2014-099165 | A | 5/2014 |
| JP | 2016-015475 | A | 1/2016 |
| KR | 2015-0070167 | A | 6/2015 |
| KR | 2015-0143332 | A | 12/2015 |
| KR | 2021-0143845 | A | 11/2021 |
| WO | WO-2014/061761 | | 4/2014 |
| WO | WO-2020/194107 | | 10/2020 |
| WO | WO-2021/111250 | | 6/2021 |

OTHER PUBLICATIONS

Written Opinion (Application No. PCT/IB2022/061753) Dated Mar. 7, 2023.

* cited by examiner

| | T0 | T1 | T2 | T3 | T4 | T5 | T6 | T7 |
|---|---|---|---|---|---|---|---|---|
| CLK | | | | | | | | |
| D | D1 | D2 | D3 | D4 | D5 | D6 | D7 | D8 |
| Q | D0 | D1 | D2 | D3 | D4 | D1 | D6 | D3 |
| BK[1] | | | | | | | | |
| BK[2] | | | | | | | | |
| RE[1] | | | | | | | | |
| RE[2] | | | | | | | | |
| SN[1] | | D1 | | | | | | |
| SN[2] | | | | D3 | | | | |
| SE | | | | | | | | |

FIG. 12A
| | |
|---|---|
| BLOCK 1 (task1) | BLOCK 2 (task1) |
| BLOCK 3 (task1) | BLOCK 4 (task1) |
410
FIG. 12B
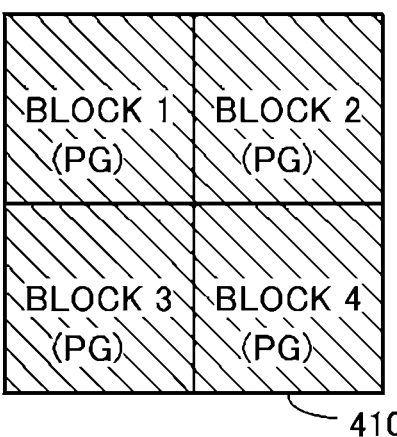
410
FIG. 12C
| | |
|---|---|
| BLOCK 1 (task2) | BLOCK 2 (task2) |
| BLOCK 3 (PG) | BLOCK 4 (PG) |
410
FIG. 12D
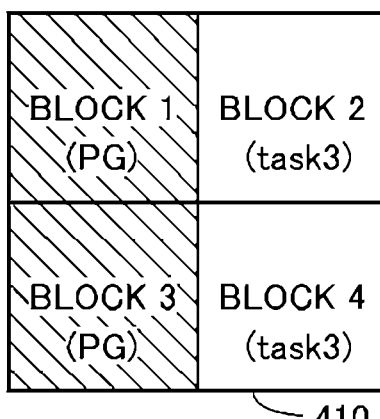
410

FIG. 15A
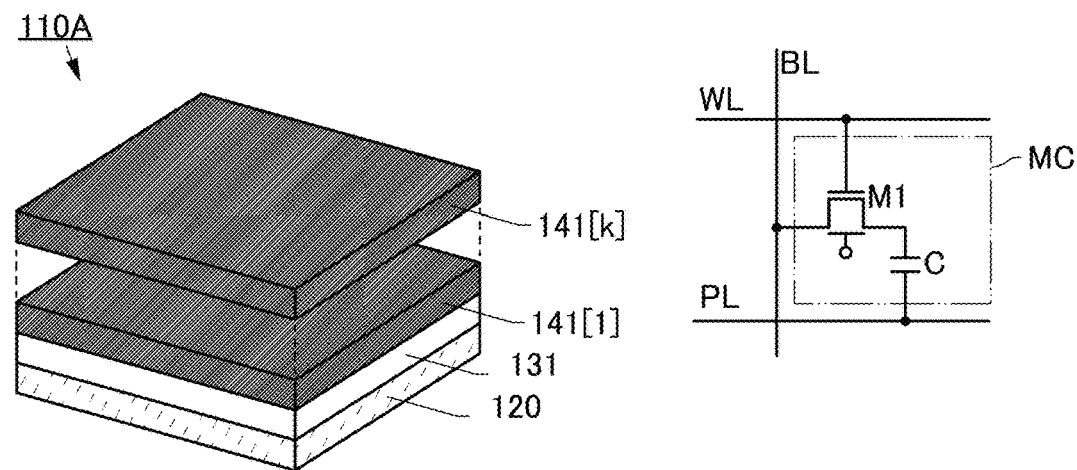
FIG. 15B
FIG. 15C
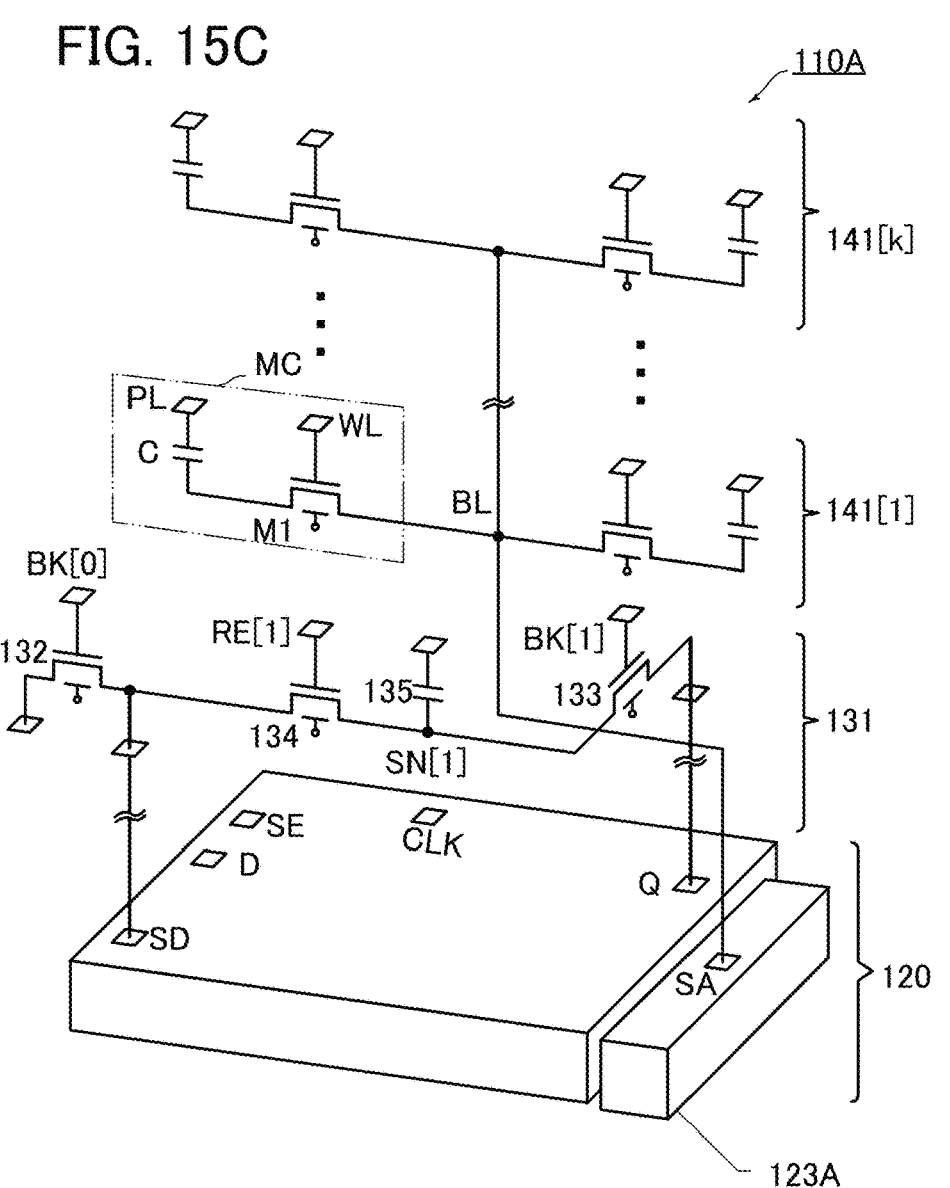

FIG. 16A
110B
FIG. 16B
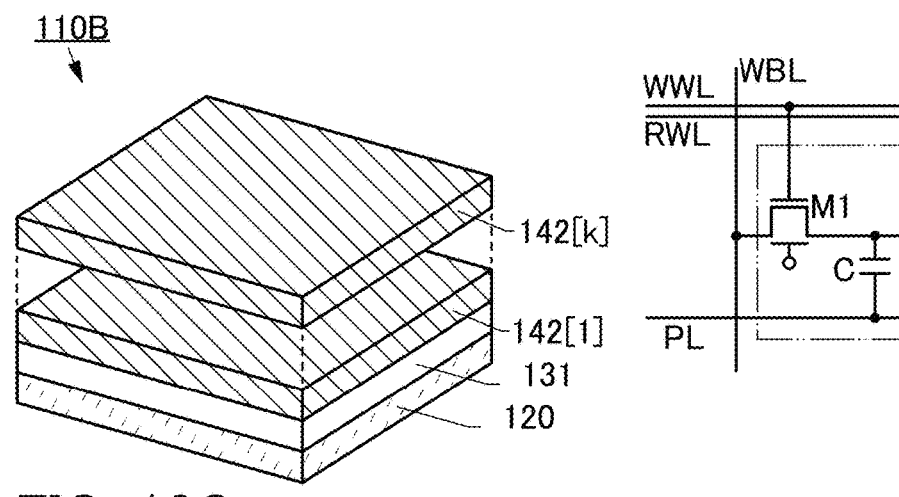
FIG. 16C
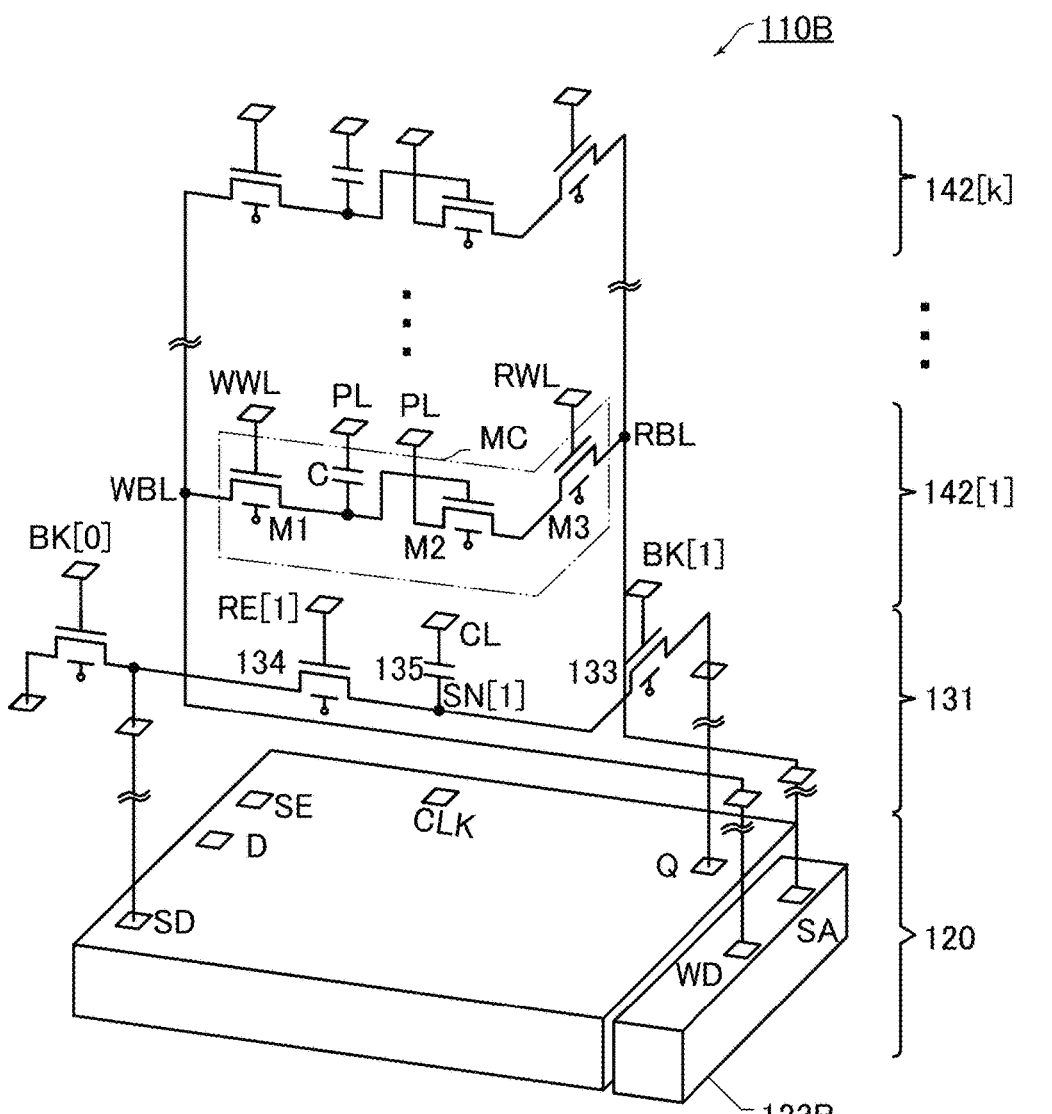

FIG. 23A
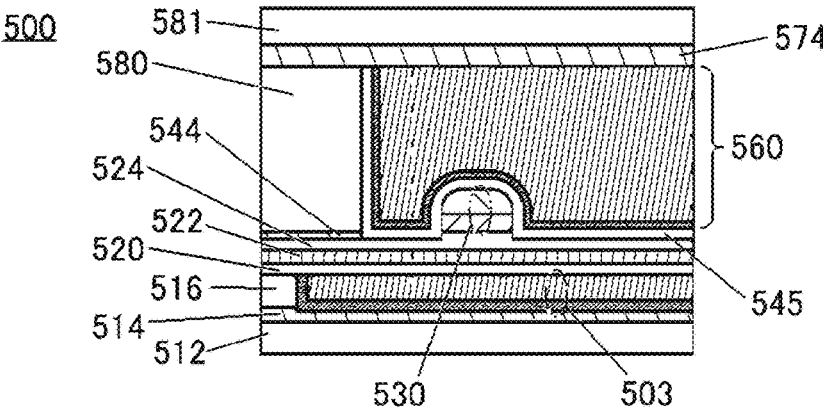
FIG. 23B
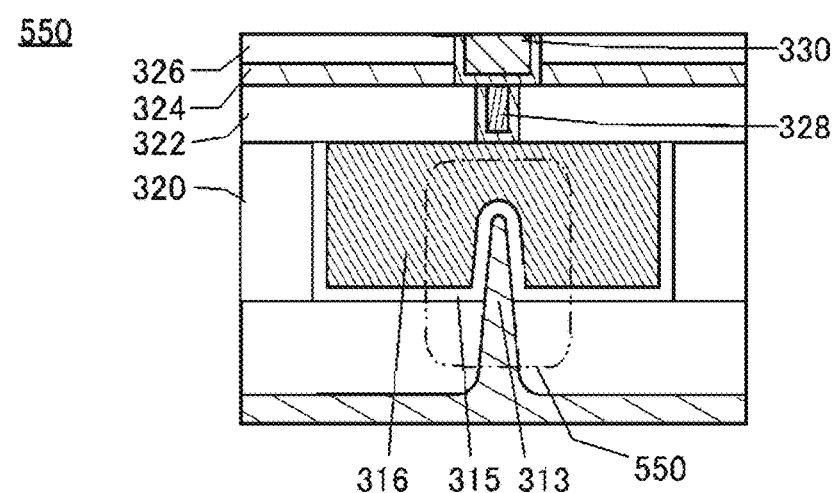
FIG. 23C

FIG. 31A
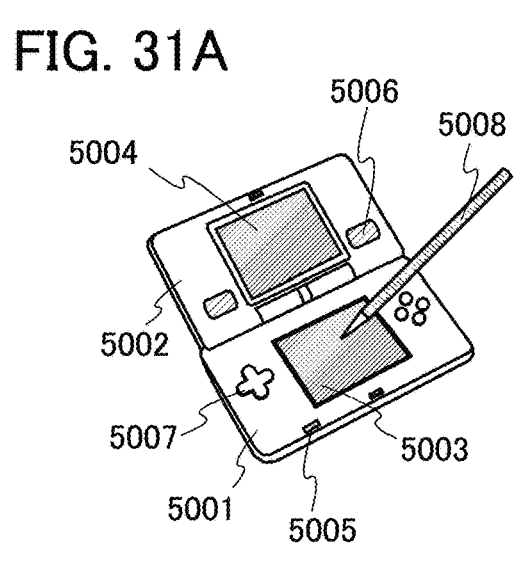
FIG. 31B
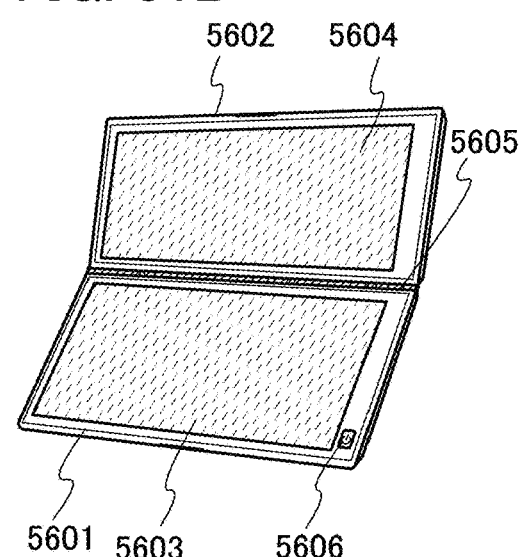
FIG. 31C
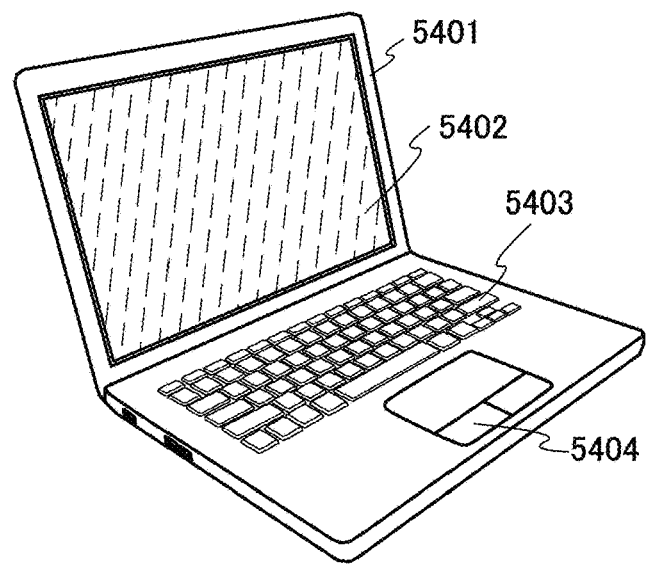
FIG. 31D
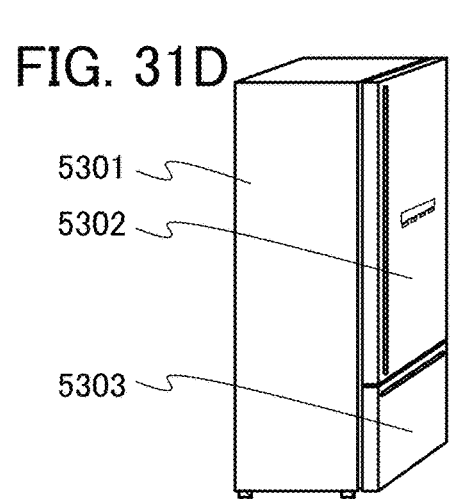
FIG. 31E
FIG. 31F
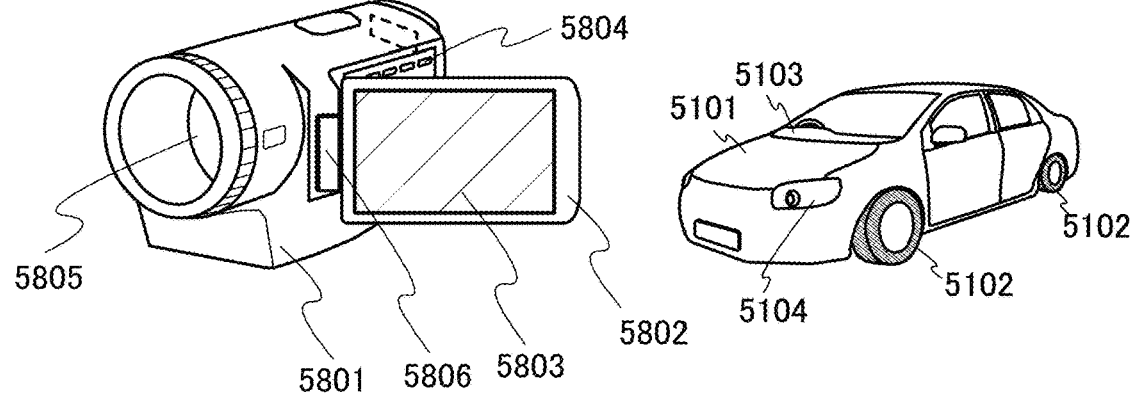

SEMICONDUCTOR DEVICE, DISPLAY APPARATUS, DATA PROCESSING SYSTEM, AND CONTROL SYSTEM OF THE SEMICONDUCTOR DEVICE

TECHNICAL FIELD

One embodiment of the present invention relates to a semiconductor device, a display apparatus, and the like.

Note that one embodiment of the present invention is not limited to the above technical field. The technical field of the invention disclosed in this specification and the like relates to an object, a method, or a manufacturing method. Furthermore, one embodiment of the present invention relates to a process, a machine, manufacture, or a composition of matter. Thus, more specifically, examples of the technical field of one embodiment of the present invention disclosed in this specification include a semiconductor device, a display apparatus, a light-emitting apparatus, a power storage device, a storage device (memory device), a driving method thereof, and a manufacturing method thereof.

BACKGROUND ART

The technical development of a semiconductor device that can retain electric charges corresponding to data by using a transistor including an oxide semiconductor in its channel formation region (OS transistor) and a transistor including silicon in its channel formation region (Si transistor) in combination has been progressing.

The semiconductor device can achieve low power consumption owing to power gating or the like by having a structure of performing saving (storing or backing up) or loading (restoring or recovering) of a program or data retained in a flip-flop or the like. Thus, the application to a semiconductor device such as a CPU (Central Processing Unit) is progressing (see Patent Document 1, for example).

In the semiconductor device such as the CPU, a series of processes (task) is executed by sequentially executing a process corresponding to a program or data.

Data necessary in a process in the semiconductor device such as the CPU or data obtained by the process is transmitted and received between a peripheral circuit and the CPU. A variety of peripheral circuits are used in accordance with the user's needs. Examples of the peripheral circuit include a DRAM (Dynamic Random Access Memory) interface, a PCI (Peripheral Component Interface), a DMA (Direct Memory Access), a network interface, and an audio interface.

In the case where a plurality of tasks is executed, each of the tasks is divided into small processing units and the processing units of each task are sequentially executed, so that it looks as if the plurality of tasks is executed at the same time. In order to execute the processes, a plurality of register banks (a set of general registers) is prepared and switching between the register banks is performed in accordance with the task so that the tasks are executed.

Also in the case where a shift of a program from a main routine to a subroutine is performed, a process of the subroutine is executed after the register bank is switched and a process of the main routine is executed after the process of the subroutine is finished and the register bank is switched to the original register bank.

REFERENCE

Patent Document

[Patent Document 1] Japanese Published Patent Application No. 2013-9297

SUMMARY OF THE INVENTION

Problems to be Solved by the Invention

In the semiconductor device such as the CPU conducting a complicated process, when a register bank lacks, data in a register corresponding to the task is temporarily written to an external memory, and in the case where the task is executed again, the data needs to be written back from the external memory to the register. In this case, energy is consumed for writing and writing back of data between the external memory and the register. Preparing a large number of register banks can inhibit energy consumption between the external memory and the register but leads to an increase in circuit layout area.

In the semiconductor device such as a CPU, when a plurality of tasks is executed, all the peripheral circuits do not need to operate for each of the tasks. For example, when data is transmitted to and received from a specific peripheral circuit in processing of the semiconductor device such as the CPU, the other peripheral circuits are basically in an idle state. Thus, a structure in which the other peripheral circuits are power gated is effective in order to reduce power consumption. However, in order to utilize peripheral circuits, various kinds of settings need to be made and setting data needs to be stored in setting registers provided in the peripheral circuits. Thus, when the peripheral circuits return from the power gating state, the setting data needs to be stored in the setting registers again. This operation causes a loss in execution of power gating and lowers an effect of reducing power consumption even when power gating is implemented.

An object of one embodiment of the present invention is to provide a novel semiconductor device or the like. Another object of one embodiment of the present invention is to provide a semiconductor device or the like with a novel structure that can inhibit an increase in circuit layout area. Another object of one embodiment of the present invention is to provide a semiconductor device or the like with a novel structure that is excellent in reducing power consumption. Another object of one embodiment of the present invention is to provide a semiconductor device or the like with a novel structure that is excellent in computing performance.

Note that the objects of one embodiment of the present invention are not limited to the objects listed above. The objects listed above do not preclude the existence of other objects. Note that the other objects are objects that are not described in this section and will be described below. The objects that are not described in this section are derived from the description of the specification, the drawings, and the like and can be extracted as appropriate from the description by those skilled in the art. Note that one embodiment of the present invention is to solve at least one of the objects listed above and/or the other objects.

Means for Solving the Problems

One embodiment of the present invention is a semiconductor device including a state control portion and a processor core. The processor core includes an arithmetic portion and a register portion including a register configured to retain data that is input to or output from the arithmetic portion. The register includes a flip-flop and a plurality of data retention circuits. The flip-flop includes a first transistor in which a semiconductor layer including a channel formation region is silicon, an input terminal of the flip-flop is electrically connected to each of output terminals of the plurality of data retention circuits, and an output terminal of the flip-flop is electrically connected to each of input terminals of the plurality of data retention circuits. The plurality of data retention circuits includes a second transistor in which a semiconductor layer including a channel formation region is an oxide semiconductor and each of the data retention circuits has a function of retaining a potential corresponding to the data corresponding to a plurality of tasks that the processor core executes when the second transistor is in a non-conduction state. The state control portion rewrites the data that the flip-flop has on the basis of the data retained in the plurality of data retention circuits in accordance with the plurality of tasks that the processor core executes.

In the semiconductor device of one embodiment of the present invention, the plurality of data retention circuits preferably includes a region overlapping with the flip-flop in a plan view.

In the semiconductor device of one embodiment of the present invention, the flip-flop is preferably provided apart from another flip-flop in a plan view.

In the semiconductor device of one embodiment of the present invention, the oxide semiconductor preferably includes In, Ga, and Zn.

In one embodiment of the present invention, the above-described semiconductor device and a memory device are preferably included, and the memory device is preferably provided over a layer including the data retention circuits.

In one embodiment of the present invention, the above-described semiconductor device preferably further includes a product-sum operation device, and a data retention portion included in the product-sum operation device is preferably provided in a layer including the data retention circuits.

One embodiment of the present invention is a display apparatus including the above-described semiconductor device and a display portion, the display portion includes a pixel circuit, and a semiconductor layer including a channel formation region in a transistor included in the pixel circuit is an oxide semiconductor.

One embodiment of the present invention is a data processing system configured to perform data processing involving switching between a plurality of tasks using the above-described semiconductor device. Even after an operation in which another task interrupts and a yet another task interrupts is executed during program processing by the plurality of tasks, processing of the original task is resumed on the basis of interrupted data.

One embodiment of the present invention is a control system of a semiconductor device involving switching between an active state and a power gating state using the above-described semiconductor device. The control system includes a plurality of peripheral circuits, a plurality of state control portions corresponding to the peripheral circuits, and a plurality of buffer registers corresponding to the state control portions. The buffer registers have a function of retaining setting data written to setting registers included in the state control portions, and switching between the active state and the power gating state in the plurality of peripheral circuits is executed by transferring the setting data from the buffer registers to the setting registers all at once.

Note that the other embodiments of the present invention are shown in the description of the following embodiments and the drawings.

Effect of the Invention

With one embodiment of the present invention, a novel semiconductor device or the like can be provided. With one embodiment of the present invention, a semiconductor device or the like with a novel structure that can inhibit an increase in circuit layout area can be provided. With one embodiment of the present invention, a semiconductor device or the like with a novel structure that is excellent in reducing power consumption can be provided. Another object of one embodiment of the present invention is to provide a semiconductor device or the like with a novel structure that is excellent in computing performance.

Note that the description of these effects does not preclude the existence of other effects. Note that one embodiment of the present invention does not need to have all the effects. Note that other effects will be apparent from the description of the specification, the drawings, the claims, and the like, and other effects can be derived from the description of the specification, the drawings, the claims, and the like.

BRIEF DESCRIPTION OF THE DRAWINGS

FIG. 4A and FIG. 4B are diagrams illustrating a structure example of a semiconductor device.

FIG. 12A to FIG. 12D are diagrams illustrating a structure example of a semiconductor device.

FIG. 15A to FIG. 15C are diagrams illustrating a structure example of a semiconductor device.

FIG. 16A to FIG. 16C are diagrams illustrating a structure example of a semiconductor device.

FIG. 17A to FIG. 17D are diagrams illustrating structure examples of a semiconductor device.

FIG. 23A to FIG. 23C are diagrams illustrating a structure example of a semiconductor device.

FIG. 31A to FIG. 31F are diagrams illustrating structure examples of electronic devices.

MODE FOR CARRYING OUT THE INVENTION

Figure 1A:
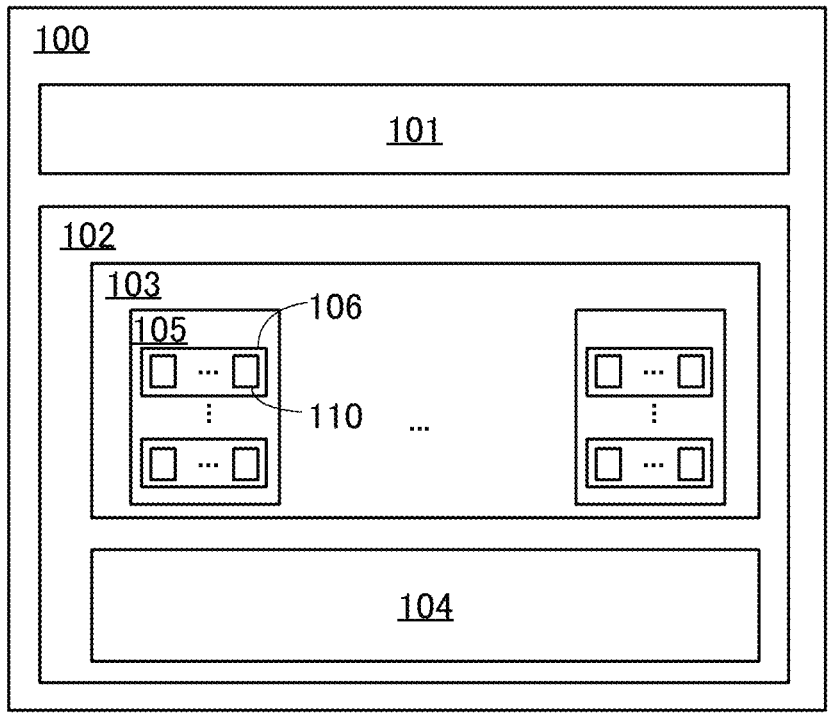
FIG. 1A and FIG. 1B are diagrams illustrating a structure example of a semiconductor device.

Embodiments are described below with reference to the drawings. However, the embodiments can be implemented with various modes, and it will be readily appreciated by those skilled in the art that modes and details can be changed in various ways without departing from the spirit and scope of the present invention. Thus, the present invention should not be interpreted as being limited to the following description of the embodiments.

In the drawings, the size, the layer thickness, or the region is exaggerated for clarity in some cases. Therefore, the size, the layer thickness, or the region is not limited to the illustrated scale. Note that the drawings schematically illustrate ideal examples, and shapes, values, and the like in embodiments of the present invention are not limited to those illustrated in the drawings.

Furthermore, unless otherwise specified, an off-state current in this specification and the like refers to a drain current of a transistor in an off state (also referred to as a non-conduction state or a cutoff state). Unless otherwise specified, an off state refers to, in an n-channel transistor, a state where a voltage $V_{gs}$ between its gate and source is lower than a threshold voltage $V_{th}$ (in a p-channel transistor, higher than $V_{th}$).

In this specification and the like, a metal oxide is an oxide of a metal in a broad sense. Metal oxides are classified into an oxide insulator, an oxide conductor (including a transparent oxide conductor), an oxide semiconductor (also simply referred to as an OS), and the like. For example, in the case where a metal oxide is used in an active layer of a transistor, the metal oxide is referred to as an oxide semiconductor in some cases. That is, an OS transistor can also be referred to as a transistor including a metal oxide or an oxide semiconductor.

Embodiment 1

In this embodiment, structure examples of a semiconductor device and a data processing system using the semiconductor device will be described.

FIG. 1A is a block diagram illustrating an example of the semiconductor device.

A semiconductor device 100 illustrated in FIG. 1A includes a state control portion 101 and a CPU core 102. The CPU core 102 includes a register portion 103 and an arithmetic portion 104. The register portion 103 includes a plurality of register banks 105. The register bank 105 includes a plurality of general registers 106. The general register 106 includes a plurality of registers 110.

The CPU core 102 is a circuit for performing arithmetic processing in the arithmetic portion 104 in accordance with program data retained in the register portion 103. The CPU core 102 is referred to as a processor core in some cases. The CPU core 102 may have a single (single-core) structure or two or more (multicore: e.g., dual-core or many-core) structures in the semiconductor device 100.

Figure 1B:
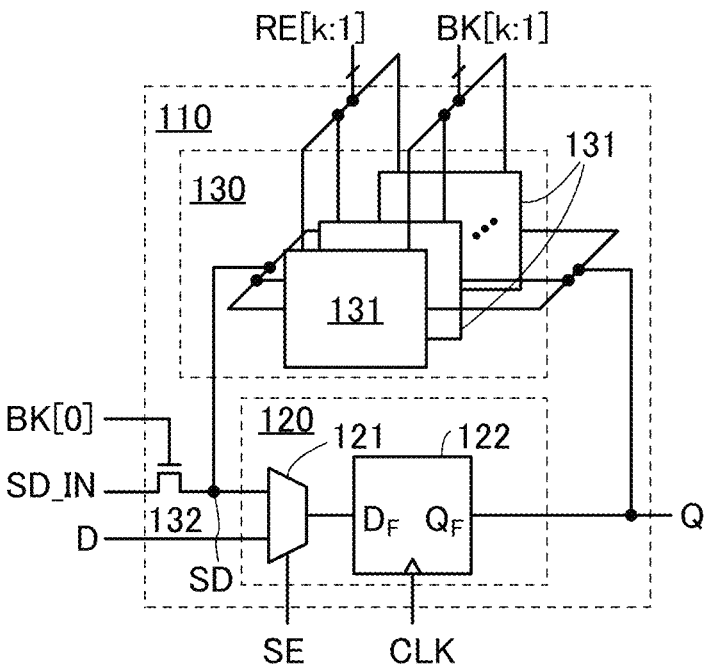

FIG. 1B is a diagram for explaining the structure of the register 110 illustrated in FIG. 1A.

The register 110 includes a scan flip-flop 120 (volatile register) and a data retention circuit 130. The scan flip-flop 120 includes a selector 121 and a flip-flop 122. The data retention circuit 130 includes memory circuits 131. The register 110 includes a transistor 132 as well.

The state control portion 101 is a circuit that outputs a control signal for performing switching between a plurality of tasks and processing the tasks in accordance with a signal such as an interrupt signal (Interrupts) input from the outside or a sleep signal generated by the CPU core 102. The state control portion 101 is simply referred to as a circuit in some cases. The state control portion 101 generates a clock signal CLK and various kinds of signals (a signal BK[0], signals BK[k:1] (k is a natural number greater than or equal to 2), signals RE[k:1], and a signal SE). The clock signal CLK and the variety of signals are input to the CPU core 102. The state control portion 101 may have a structure of outputting a signal for controlling power gating of the CPU core 102.

The signals BK[k:1] are signals that control saving (storing or backing up) of data retained in the flip-flop 122 in the scan flip-flop 120. By the data saving, the data retained in the flip-flop 122 is retained in any one of the plurality of memory circuits 131 in the data retention circuit 130. Note that the signals BK[k:1] are expressed as the signal BK[1] to the signal BK[k] in some cases.

The signals RE[k:1] are signals that control loading (restoring or recovering) of data retained in any one of the plurality of memory circuits 131 in the data retention circuit 130. By the data loading, the data retained in any one of the plurality of memory circuits 131 in the data retention circuit 130 is retained in the flip-flop 122 in the scan flip-flop 120. Note that the signals RE[k:1] are expressed as the signal RE[1] to the signal RE[k] in some cases.

The signal SE is a switch signal for the selector 121. The clock signal CLK is a signal for operating the flip-flop 122.

The register portion 103 includes the register banks 105 provided in a pipeline register, a register file, or the like. The register portion 103 is also referred to as an L1 (level 1) cache. The register portion 103 has a function of temporarily storing frequently used data.

The arithmetic portion 104 has a function of performing various kinds of arithmetic processing such as four arithmetic operations or a logic operation on the basis of data stored in the register portion 103. The arithmetic portion 104 can also be referred to as an ALU (Arithmetic logic unit). The CPU core 102 may include a circuit such as a program counter or a control circuit in addition to the register portion 103 and the arithmetic portion 104.

The register banks 105 are provided in accordance with a plurality of tasks executed by a process corresponding to a program. When switching between a plurality of tasks is controlled by the state control portion 101, switching to the register bank 105 corresponding to the task is performed; thus, a semiconductor device with improved computing performance can be provided. The general registers 106 each have a function of storing program data for executing a task and data obtained by arithmetic processing. The registers 110 correspond to storage circuits included in the general registers 106.

The register 110 retains data input from a terminal D or data input from a terminal SD of the scan flip-flop 120 in the scan flip-flop 120 and outputs the data from a terminal Q in accordance with the clock signal CLK. The data from the scan flip-flop 120, which is output from the terminal Q, is saved in any one of the plurality of memory circuits 131 included in the data retention circuit 130 by the control of the signals BK[k:1]. Data in any one of the plurality of memory circuits 131 included in the data retention circuit 130 is output to the terminal SD by the control of the signals RE[k:1], and loaded to the scan flip-flop 120.

The selector 121 has a function of supplying a signal in the terminal D or the terminal SD to the scan flip-flop 120 in accordance with the signal SE. The terminal D is a terminal that supplies data input from the outside of the register 110. The terminal SD is a terminal that supplies data input from the data retention circuit 130 or data input from a terminal SD_IN that supplies data for scan test. Data input from the terminal SD_IN is supplied through the transistor 132 whose conduction state or the non-conduction state is controlled by the signal BK[0].

Although the flip-flop 122 illustrated in FIG. 1B is a D flip-flop, the flip-flop 122 is not limited thereto. A flip-flop prepared in a standard circuit library can be used. A transistor included in the flip-flop 122 is a Si transistor, and the flip-flop 122 can retain one piece of data by including a circuit such as an inverter loop. The flip-flop 122 retains data in an input terminal DF and outputs the retained data to the terminal Q through an output terminal $Q_F$ in accordance with the clock signal CLK.

In the structure example illustrated in FIG. 1A and FIG. 1B, the circuits such as the scan flip-flop 120 other than the data retention circuit 130 are formed using Si CMOS, that is, transistors including silicon in channel formation regions (Si transistors). That is, in the semiconductor device 100, circuits other than the data retention circuit 130 are provided in a layer including Si transistors.

It is preferable to use, for the Si transistors, silicon with high crystallinity such as single crystal silicon or polycrystalline silicon in order to achieve high field-effect mobility and perform a higher-speed operation.

The data retention circuit 130 is formed using OS transistors, i.e., transistors including an oxide semiconductor in channel formation regions. An OS transistor has a characteristic of an extremely low off-state current. Accordingly, when OS transistors are particularly used as the transistors provided in the data retention circuit 130, a potential corresponding to data written to the scan flip-flop 120 can be retained for a long time. When the data retention circuit 130 has a circuit structure including OS transistors, the data retention circuit 130 can be provided to overlap with a circuit other than the data retention circuit 130, such as the scan flip-flop 120.

Examples of a metal oxide used in the OS transistors include indium oxide, gallium oxide, and zinc oxide. The metal oxide preferably includes two or three kinds selected from indium, an element M, and zinc. The element M is one or more kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium. Specifically, the element M is preferably one or more kinds selected from aluminum, gallium, yttrium, and tin.

It is particularly preferable to use an oxide containing indium (In), gallium (Ga), and zinc (Zn) (also referred to as IGZO) as the metal oxide. Alternatively, it is preferable to use an oxide containing indium, tin, and zinc (also referred to as ITZO). Further alternatively, it is preferable to use an oxide containing indium, gallium, tin, and zinc. Alternatively, it is preferable to use an oxide containing indium (In), aluminum (Al), and zinc (Zn) (also referred to as IAZO). Further alternatively, it is preferable to use an oxide containing indium (In), aluminum (Al), gallium (Ga), and zinc (Zn) (also referred to as IAGZO). Further alternatively, it is preferable to use an oxide containing indium (In), gallium (Ga), zinc (Zn), and tin (Sn) (also referred to as IGZTO).

The metal oxide used in the OS transistors may include two or more metal oxide layers with different compositions. For example, a stacked-layer structure of a first metal oxide layer having In:M:Zn=1:3:4 [atomic ratio] or a composition in the neighborhood thereof and a second metal oxide layer having In:M:Zn=1:1:1 [atomic ratio] or a composition in the neighborhood thereof and being provided over the first metal oxide layer can be favorably employed.

Alternatively, a stacked-layer structure of one selected from indium oxide, indium gallium oxide, and IGZO, and one selected from IAZO, IAGZO, and ITZO may be employed, for example.

The metal oxide used in the OS transistors preferably has crystallinity. As the oxide semiconductor having crystallinity, a CAAC (c-axis aligned crystalline)-OS, an nc (nanocrystalline)-OS, and the like are given. When the oxide semiconductor having crystallinity is used, the semiconductor device can have high reliability.

The data retention circuit 130 includes the plurality of memory circuits 131, and data can be independently saved or loaded by control of the signals BK[k:1] and control of the signals RE[k:1]. That is, the scan flip-flop 120 in a plurality of states generated in accordance with switching of the task can be stored in different memory circuits 131. In some cases, the data retention circuit 130 is simply referred to as a circuit.

The plurality of memory circuits 131 can be formed of OS transistors and capacitors. In some cases, the memory circuit 131 is simply referred to as a circuit. The OS transistors can be provided to overlap with the circuits formed using Si transistors. The plurality of memory circuits 131 can be provided over the layer including Si transistors included in the circuits such as the scan flip-flop 120 or the like. The structure of adding the memory circuits 131 by stacking a layer including OS transistors over the layer including Si transistors can inhibit an increase in layout area for the plurality of added memory circuits 131. In the plurality of memory circuits 131, electric charges can be accumulated in the capacitors by utilizing the extremely low off-state current of the OS transistors, and the plurality of memory circuits 131 can individually retain a potential corresponding to data written to the scan flip-flop 120 for a long period.

Figure 2A:
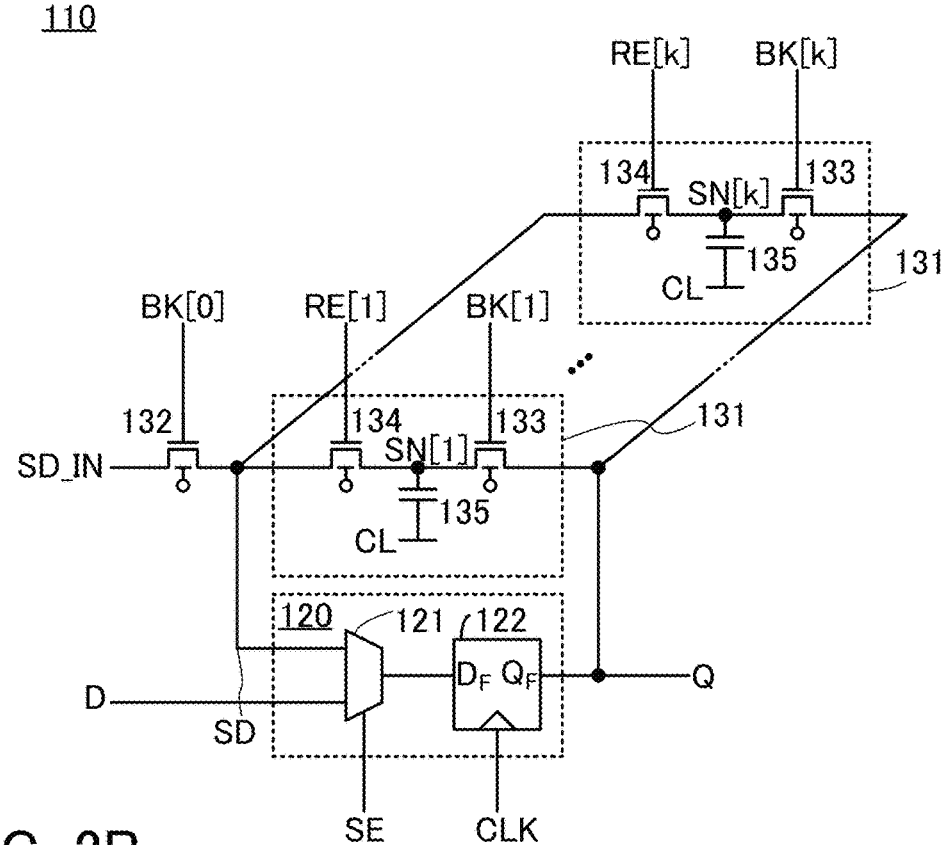
FIG. 2A and FIG. 2B are diagrams illustrating a structure example of a semiconductor device.

FIG. 2A is a diagram illustrating a circuit structure example of the memory circuits 131. The plurality of memory circuits 131 are each connected to the terminal Q and the terminal SD. In the plurality of memory circuits 131, a terminal (wiring) connected to the terminal Q is referred to as an input terminal and a terminal (wiring) connected to the terminal SD is referred to as an output terminal. The above-described output terminal $Q_F$ of the flip-flop 122 is electrically connected to the input terminal of the data retention circuit 130 (the memory circuits 131), and the input terminal DF of the flip-flop 122 is electrically connected to the output terminal of the data retention circuit 130 (the memory circuits 131).

Each of the plurality of memory circuits 131 includes a transistor 133, a transistor 134, and a capacitor 135. The other electrode of the capacitor 135 is connected to a wiring CL. The transistor 133 is provided between the capacitor 135 and the terminal Q. The transistor 134 is provided between the capacitor 135 and the terminal SD. In each of the plurality of memory circuits 131, one electrode of the capacitor 135 is illustrated as a node SN[1] to a node SN[k].

In the memory circuit 131, any one of the signal BK[1] to the signal BK[k] is supplied to a gate of the transistor 133 and any one of the signal RE[1] to the signal RE[k] is supplied to a gate of the transistor 134. The signal BK[1] to the signal BK[k] are signals for saving data retained in the flip-flop 122 to any one of the plurality of memory circuits 131. The signal RE[1] to the signal RE[k] are signals for loading data retained in any one of the plurality of memory circuits 131 to the flip-flop 122.

The transistors 133 and 134 are OS transistors. The transistors 133 and 134 have back gates in the illustrated structure. Supplying constant voltages to the back gates of the transistors 133 and 134 allows control of transistor characteristics. At least the transistors 133 and 134 are preferably OS transistors. Because of extremely low off-state currents, which are a feature of the OS transistors, a decrease in the voltages of the nodes SN[1] to SN[k] can be suppressed and almost no electric power is consumed to retain data; therefore, the memory circuits 131 included in the data retention circuit 130 have nonvolatile characteristics. Data is rewritten by charging and discharging of the capacitors 135; hence, there is theoretically no limitation on rewrite cycles of the memory circuits 131, and data can be written and read out with low energy.

In the memory circuits 131, the OS transistors function as switches. In an OS transistor, which is an n-channel transistor, when a signal supplied to a gate is set to high level (hereinafter expressed as "="H""), a conduction state (on) can be established between a source and a drain, and when the signal supplied to the gate is set to low level (hereinafter expressed as "="L""), a non-conduction state (off) can be established between the source and the drain. Furthermore, when the signal SE is set to high level (hereinafter expressed as "="H""), a signal of the terminal SD is selected in the selector 121; and when the signal SE is set to low level (hereinafter expressed as "="L""), a signal of the terminal D is selected in the selector 121.

For example, when the signal BK[1] "H" is set in the memory circuit 131, data retained in the flip-flop 122 can be written to the node SN[1] in the memory circuit 131. Similarly, when BK[2]="H", BK[3]="H", and BK[4]="H" are set, the data in the flip-flop 122 can be written to the node SN[2], the node SN[3], and the node SN[4] in the corresponding memory circuits 131. Furthermore, when RE[1]="H" and SE="H" are set, the data in the node SN[1] of the memory circuit 131 can be written back to the flip-flop 122. Similarly, when RE[2]="H", RE[3]="H", and RE[4]="H" are set, the data in the node SN[2], the node SN[3], and the node SN[4] of the corresponding memory circuits 131 can be written back to the flip-flop 122.

Figure 2B:
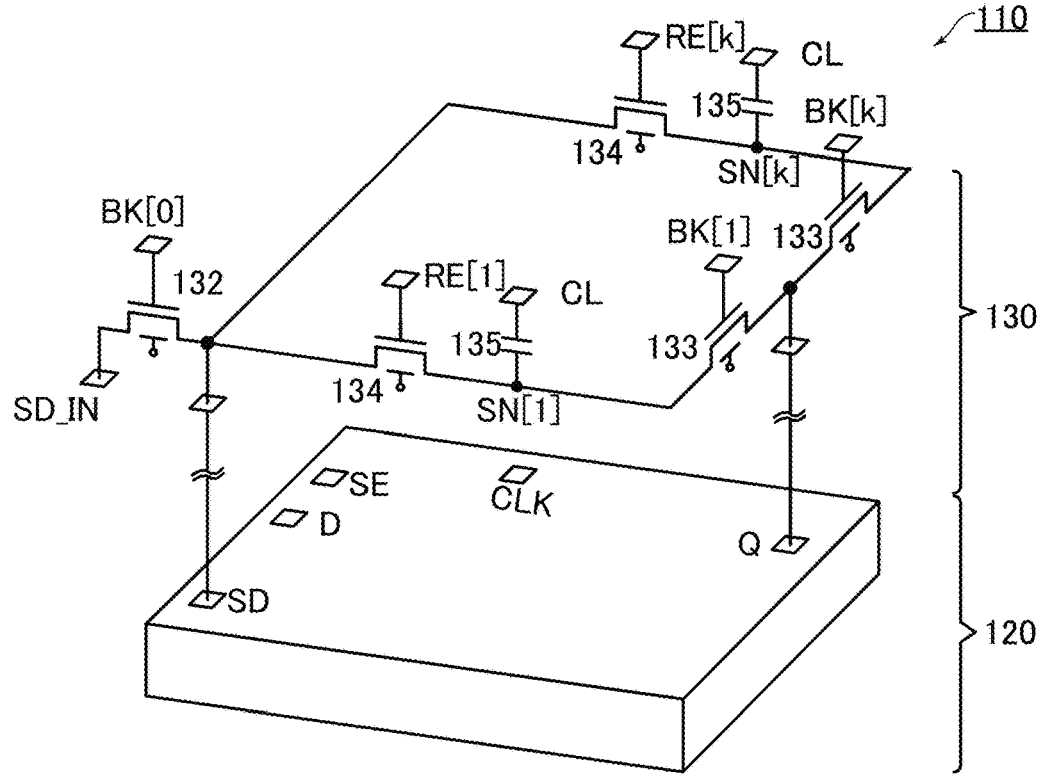

It is extremely preferable that all the transistors in the memory circuits 131 included in the data retention circuit 130 be OS transistors. As shown in FIG. 2B, the data retention circuit 130 can be stacked over the scan flip-flop 120 formed using a silicon CMOS circuit.

In FIG. 2B, the transistor 132 is illustrated as being provided in the same layer as the transistor 133 and the transistor 134. The transistor 132 is not limited to an OS transistor. An OS transistor or a Si transistor can be used as the transistor 132.

The number of elements in the data retention circuit 130 is much smaller than the number of elements in the scan flip-flop 120; thus, there is no need to change the circuit structure and layout of the scan flip-flop 120 in order to stack the data retention circuit 130. That is, the data retention circuit 130 is a circuit that has very broad utility. In addition, the data retention circuit 130 can be provided within a region where the scan flip-flop 120 is formed; thus, even when the data retention circuit 130 is incorporated, the area overhead can be zero. Since energy required for retaining data in the data retention circuit is small, it is possible to frequently save or load data in the CPU core 102.

When the data retention circuit 130 is provided, parasitic capacitance due to the transistors 133 is added to the node Q; however, the parasitic capacitance is lower than parasitic capacitance due to a logic circuit connected to the node Q and does not affect the operation of the scan flip-flop circuit 120. That is, even when a plurality of the data retention circuits 130 is provided, the performance of the register 110 does not substantially decrease.

As illustrated in FIG. 2B, in the case where the data retention circuit 130 is stacked over the scan flip-flop 120 formed using a silicon CMOS circuit, the flip-flop 122 included in the scan flip-flop 120 is preferably provided apart from the other flip-flops 122 in a plan view.

Figure 3A:
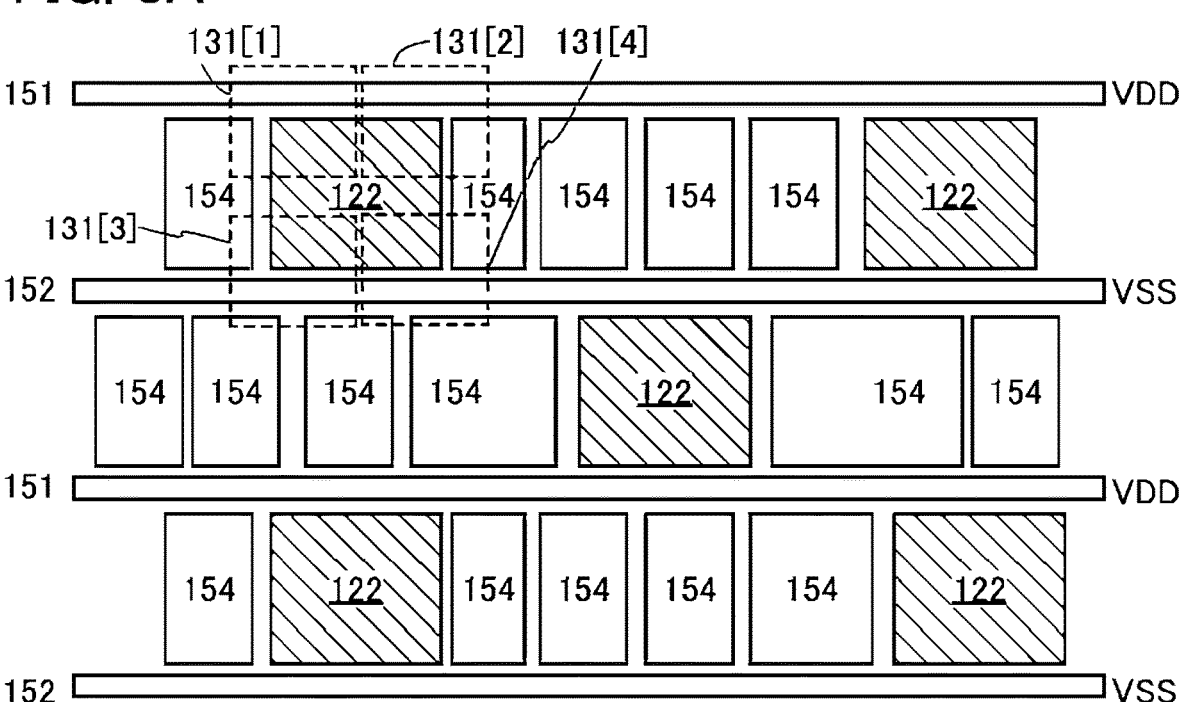
FIG. 3A and FIG. 3B are diagrams illustrating a structure example of a semiconductor device.

FIG. 3A is a diagram schematically illustrating, in a plan view, a circuit placed between wirings 151 and 152 that give power supply potentials or supply VDD and VSS. In FIG. 3A, in addition to the flip-flops 122, standard cells 154 of a combinational circuit, a sequential circuit, or the like that is provided in the same layer as the flip-flops 122 are illustrated.

With the structure in which the flip-flop 122 is provided apart from the other flip-flops 122 in a plan view as illustrated in FIG. 3A, the plurality of memory circuits 131[1] to 131[4] (shown by dotted lines in the drawing) in the upper layer can be placed without overlapping with the other flip-flops 122. Furthermore, with the structure in which the flip-flop 122 is provided apart from the other flip-flops 122 in a plan view, soft errors which is rewriting of data caused by a cosmic ray or the like can be reduced. Note that in this specification and the like, a cosmic ray means high energy radiation flying in outer space. Examples of radiation include X-rays and a neutron beam. Although outer space refers to, for example, space at an altitude greater than or equal to 100 km, outer space described in this specification and the like may include thermosphere, mesosphere, and stratosphere.

Figure 3B:
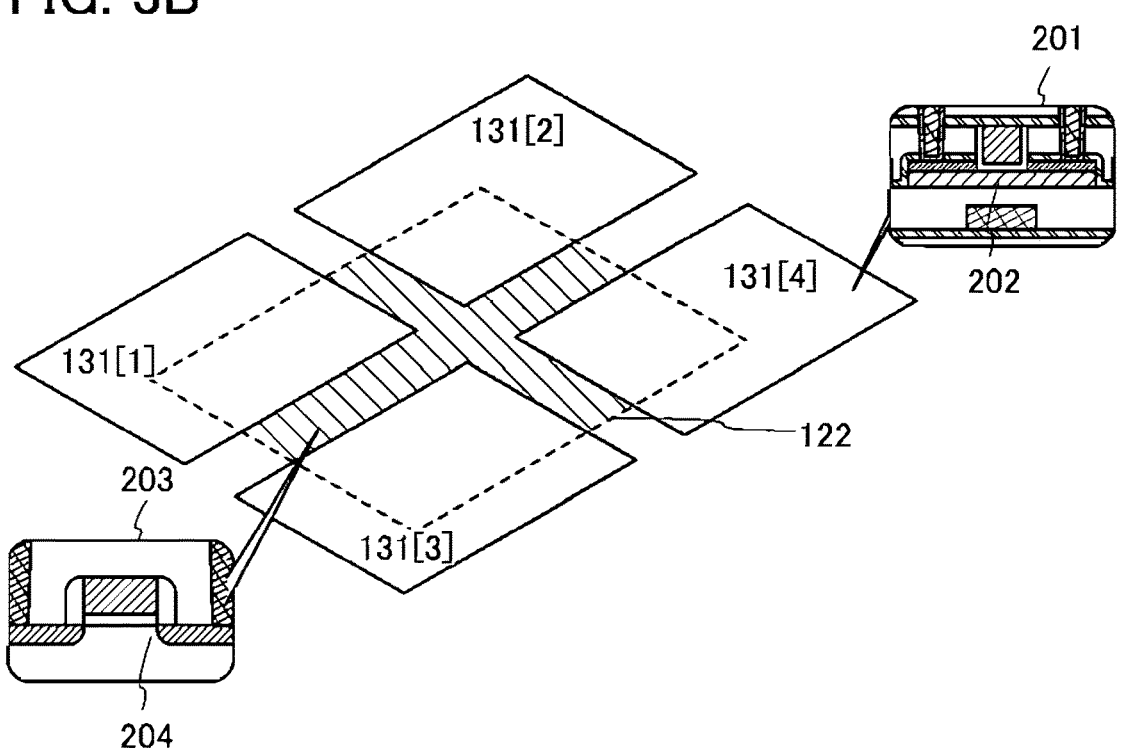

FIG. 3B is a diagram schematically illustrating the memory circuits 131[1] to 131[4] that overlap with the flip-flop 122. The flip-flop 122 includes a transistor 203 including silicon in a semiconductor layer 204 including a channel formation region, and the memory circuits 131[1] to 131[4] each include a transistor 201 including an oxide semiconductor in a semiconductor layer 202 including a channel formation region, whereby the circuits can be placed to have an overlap region. When the plurality of memory circuits 131[1] to 131[4] have a region overlapping with the flip-flop 122, the distance between the flip-flop 122 and the memory circuits 131[1] to 131[4] electrically connected to the flip-flop 122 can be shortened.

Figures 4A, 4B:
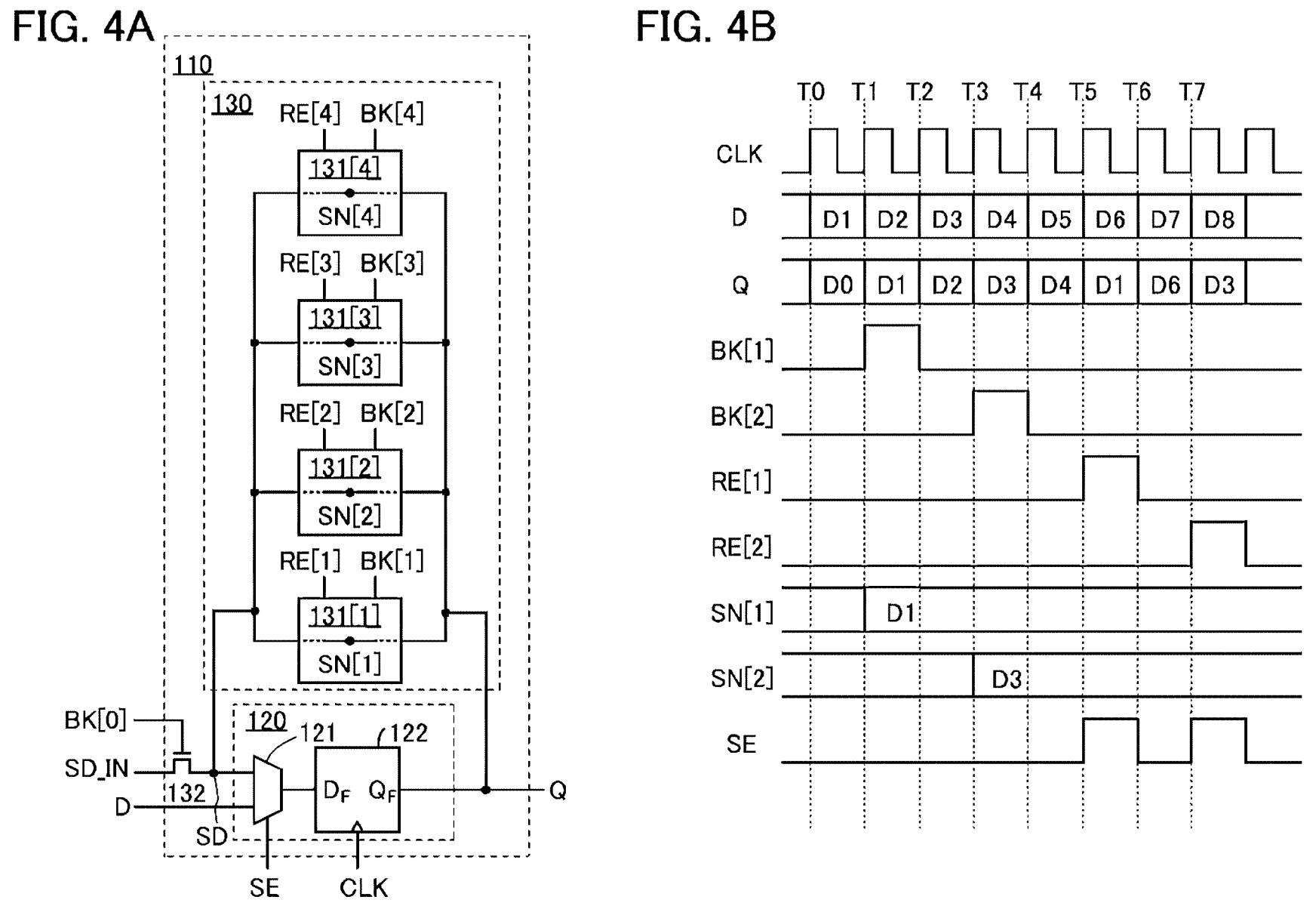

In order to explain the operation of the register 110 described with reference to FIG. 2A, FIG. 4A illustrates a structure at k=4 where four memory circuits 131 are included in the data retention circuit 130. In FIG. 4A, the nodes SN[1] to SN[4] that retain data in the memory circuits 131 (the memory circuits 131[1] to 131[4]) included in the data retention circuit 130 are illustrated. Furthermore, in FIG. 4A, the signals BK[1] to BK[4] and the signals RE[1] to RE[4] that control the memory circuits 131[1] to 131[4] are illustrated.

FIG. 4B illustrates an example of a timing chart illustrating the operation of the register 110 illustrated in FIG. 4A. Note that in FIG. 4B, T0 to T7 represent the time. FIG. 4B illustrates the clock signal CLK, the terminal D, the terminal Q, the signal BK[1], the signal BK[2], the signal RE[1], the signal RE[2], the node SN[1], the node SN[2], and the signal SE supplied to the selector 121. The flip-flop 122 stores data of the input terminal DF and performs output from the output terminal $Q_F$ in synchronization with a rising edge of the clock signal CLK (a waveform switched from the L level to the H level).

Figure 5A:
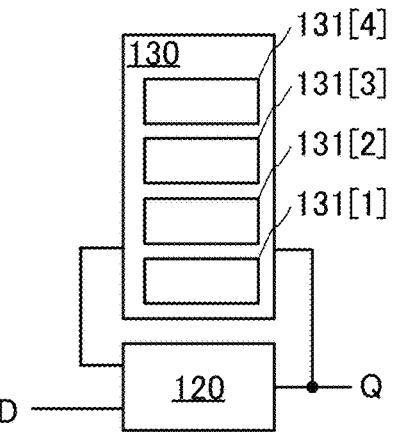
FIG. 5A to FIG. 5E are diagrams each illustrating a structure example of a semiconductor device.
Figure 5B:
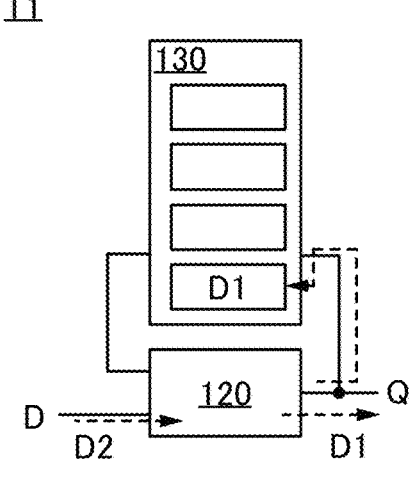
Figure 5C:
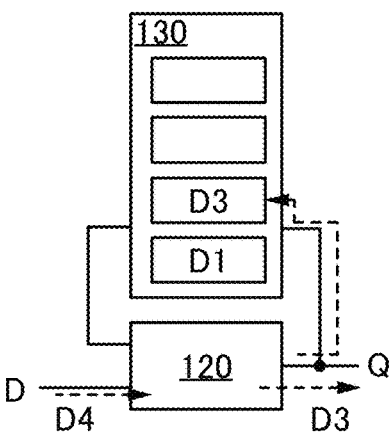
Figure 5D:
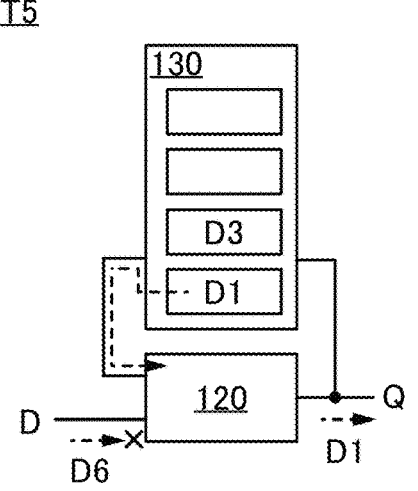
Figure 5E:
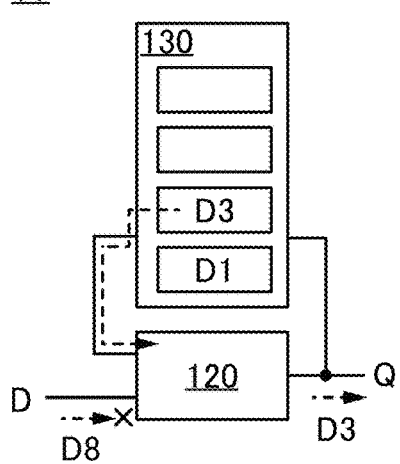

FIG. 5A to FIG. 5E are schematic diagrams of the register 110 for explaining the operation in the timing chart in FIG. 4B. FIG. 5A illustrates the scan flip-flop 120 and the memory circuits 131[1] to 131[4] included in the data retention circuit 130. FIG. 5B, FIG. 5C, FIG. 5D, and FIG. 5E are diagrams illustrating data input to and output from the scan flip-flop 120 and 131[1] to 131[4] in the data retention circuit 130 at Times T1, T3, T5, and T7 in FIG. 4B.

At Time T0, the scan flip-flop 120 stores data D0 and performs output from the output terminal $Q_F$ in synchronization with the rising edge of the clock signal CLK. Data D1 is supplied to the terminal D.

At Time T1, the scan flip-flop 120 stores the data D1 supplied to the terminal D and performs output from the output terminal $Q_F$ in synchronization with the rising edge of the clock signal CLK. At Time T1, the signal BK[1]="H", the signal RE[1]="L", and the signal SE="L" are set, so that the data D1 in the scan flip-flop 120 is retained in the memory circuit 131[1] (see FIG. 5B). Data D2 is supplied to the terminal D.

At Time T2, the scan flip-flop 120 stores the data D2 supplied to the terminal D and performs output from the output terminal $Q_F$ in synchronization with the rising edge of the clock signal CLK. Data D3 is supplied to the terminal D.

At Time T3, the scan flip-flop 120 stores the data D3 supplied to the terminal D and performs output from the output terminal $Q_F$ in synchronization with the rising edge of the clock signal CLK. At Time T3, the signal BK[2]="H", the signal RE[2]="L", and the signal SE="L" are set, so that the data D3 in the scan flip-flop 120 is retained in the memory circuit 131[2] (see FIG. 5C). Data D4 is supplied to the terminal D.

At Time T4, the scan flip-flop 120 stores the data D4 supplied to the terminal D and performs output from the output terminal $Q_F$ in synchronization with the rising edge of the clock signal CLK. Data D5 is supplied to the terminal D.

At Time T5, the scan flip-flop 120 stores the data D5 supplied to the terminal D and performs output from the output terminal $Q_F$ in synchronization with the rising edge of the clock signal CLK. At Time T5, BK[1]="L", RE[1]="H", and SE="H" are set, so that the data D1 retained in the memory circuit 131[1] can be written back to the scan flip-flop 120 (see FIG. 5D). Data D6 is supplied to the terminal D.

At Time T6, the scan flip-flop 120 stores data D6 supplied to the terminal D and performs output from the output terminal $Q_F$ in synchronization with the rising edge of the clock signal CLK. Data D7 is supplied to the terminal D.

At Time T7, the scan flip-flop 120 stores the data D7 supplied to the terminal D and performs output from the output terminal $Q_F$ in synchronization with the rising edge of the clock signal CLK. At Time T7, BK[2]="L", RE[2]="H", and SE="H" are set, so that the data D3 retained in the memory circuit 131[2] can be written back to the scan flip-flop 120 (see FIG. 5E). Data D8 is supplied to the terminal D.

As described with reference to FIG. 4B and FIG. 5B to FIG. 5E, a structure of saving the data of the interrupted task and loading the data of the task to be resumed can be formed. In one embodiment of the present invention, the saved data can be stored in the plurality of memory circuits included in the data retention circuit in accordance with the switch of the task. With this structure, data is saved and loaded in accordance with the switch between a plurality of tasks at the time when an interrupt signal is input, whereby program processing can be sequentially executed. Thus, more efficient data processing can be achieved.

Figure 6:
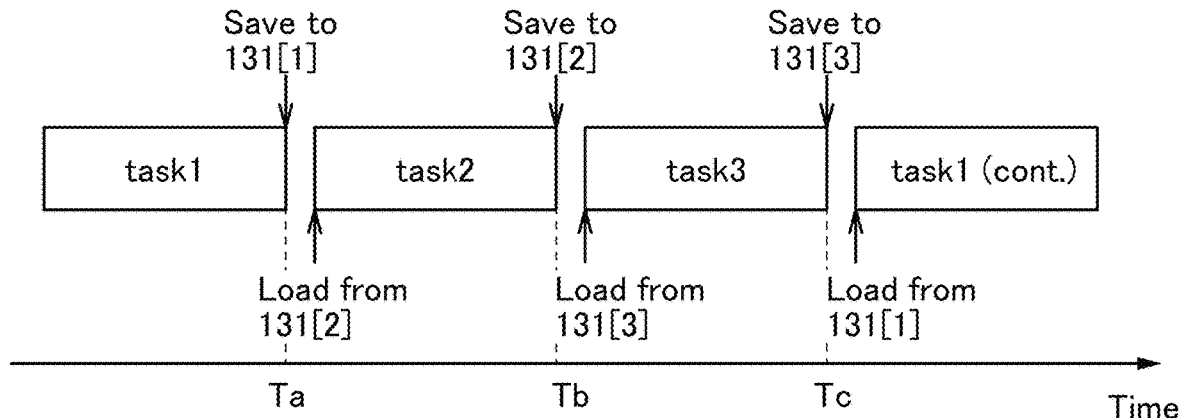
FIG. 6 is a diagram illustrating a structure example of a semiconductor device.

FIG. 6 is a timing chart of a task switching operation utilizing the register 110 illustrated in FIG. 4A and the operation of the register 110 described with reference to FIG. 4B.

At Time Ta with the state where the semiconductor device 100 is executing a task 1, the data in the scan flip-flop 120 is stored in the memory circuit 131[1] (Save to 131[1]). Then, the data in the memory circuit 131[2] is written back to the scan flip-flop 120 (Load from 131[2]). In this manner, the state of the task 1 is stored to make a state where execution of a task 2 is possible, and switching to the task 2 is performed.

At Time Tb with the state where the semiconductor device 100 is executing the task 2, the data in the scan flip-flop 120 is stored in the memory circuit 131[2] (Save to 131[2]). Then, the data in the memory circuit 131[3] is written back to the scan flip-flop 120 (Load from 131[3]). In this manner, the state of the task 2 is stored to make a state where execution of a task 3 is possible, and switching to the task 3 is performed.

At Time Tc with the state where the semiconductor device 100 is executing the task 3, the data in the scan flip-flop 120 is stored in the memory circuit 131[3] (Save to 131[3]). Then, the data in the memory circuit 131[1] is written back to the scan flip-flop 120 (Load from 131[1]). Here, the data written back from the memory circuit 131[1] to the scan flip-flop 120 is the data stored in the memory circuit 131[1] from the scan flip-flop 120 at Time Ta. That is, it is possible to execute the task 1 from where the execution was interrupted at Time Ta. In this manner, the state of the task 3 is stored to make a state where execution of the task 1 is possible, and switching to the task 1 is performed.

With the above-described structure, a semiconductor device that can reduce power consumption while being provided with a large number of register banks can be provided. In addition, a semiconductor device with improved computing performance, which can resume the process from where the last execution of the task was interrupted at the time of switching the task, can be provided.

Figure 7:
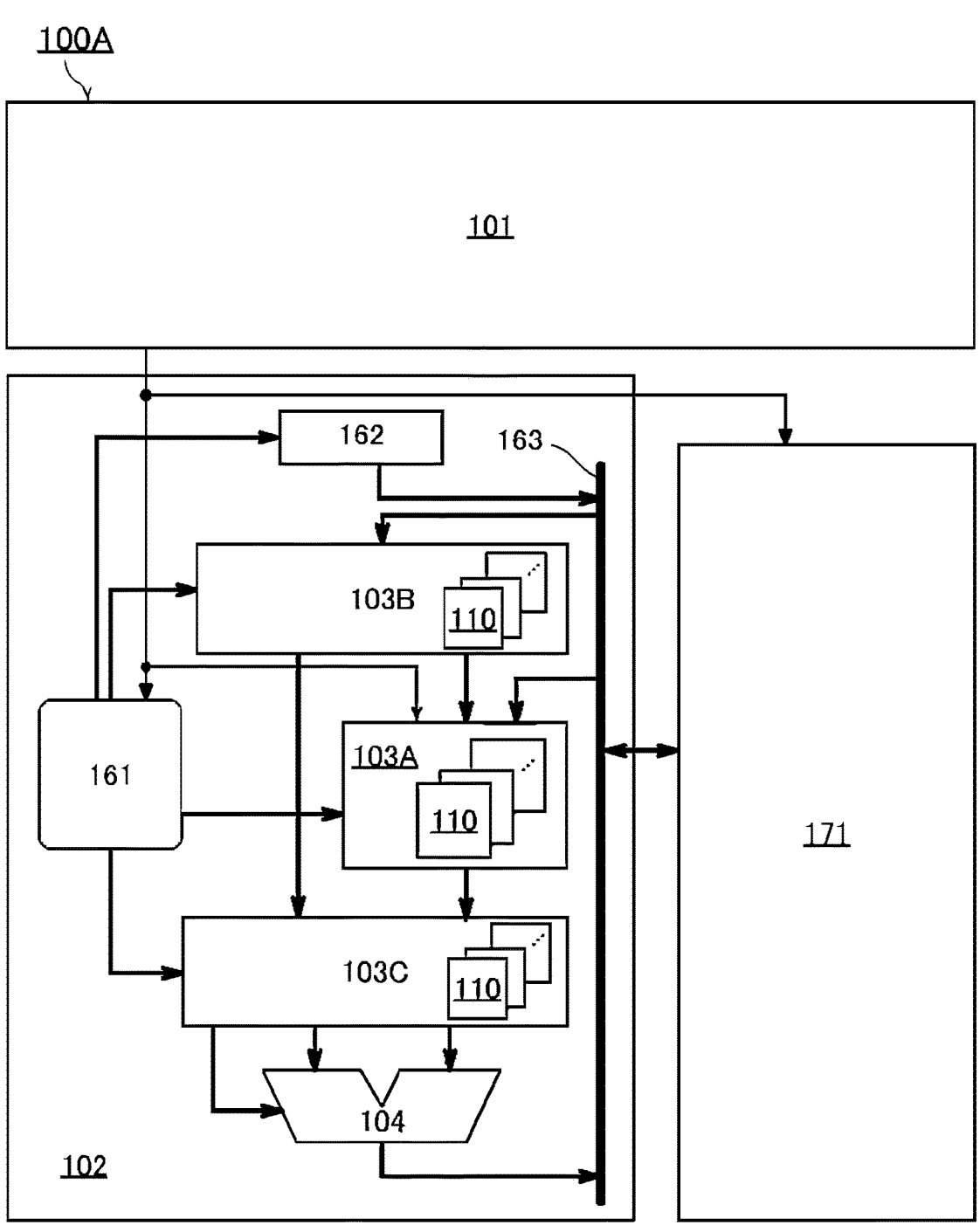
FIG. 7 is a diagram illustrating a structure example of a semiconductor device.

FIG. 7 is a block diagram of a semiconductor device 100A in which the registers 110 described above are used. In the semiconductor device 100A illustrated in FIG. 7, the state control portion 101, the CPU core 102, and a memory device 171 are illustrated. The CPU core 102 includes a control circuit 161, a PC (program counter) 162, a register file 103A, a pipeline register 103B, a pipeline register 103C, a bus interface 163, and the arithmetic portion 104. The registers 110 can be used in a general register in the register file 103A, the pipeline register 103B, the pipeline register 103C, and the like. In the register file 103A, a plurality of registers 110 form a general register, and a plurality of the general registers form a plurality of register banks.

Note that with the structure where the registers 110 are included in not only the register file but also the pipeline registers, it is also possible to restore the state of the semiconductor device to the state of the time when the task was executed previously as well as to restore the data of the general register to the data of the time when the task was executed previously. Thus, task processing continuity can be enhanced, and computing performance can be enhanced.

The control circuit 161 has a function of decoding and executing an instruction included in a program such as an input application by controlling the operations of the PC 162, the register file 103A, the pipeline register 103B, the pipeline register 103C, the arithmetic portion 104, the memory device 171, and the bus interface 163.

The control circuit 161 is provided with a storage circuit having a function of storing a program of an application or the like composed of a plurality of instructions executed in the control circuit 161 and data used in the arithmetic processing in the arithmetic portion 104.

The PC 162 is a register having a function of storing an address of an instruction to be executed next. The pipeline register 103B has a function of temporarily storing a frequently used instruction out of instructions (programs) used in the control circuit 161.

The register file 103A includes the plurality of registers 110 that form the general register and can store data read from the control circuit 161, data obtained in the middle of the arithmetic processing of the arithmetic portion 104, data obtained as a result of the arithmetic processing of the arithmetic portion 104, or the like.

In the pipeline register 103C, the register 110 can be used as a register having a function of temporarily storing data obtained in the middle of the arithmetic processing of the arithmetic portion 104, data obtained as a result of the arithmetic processing of the arithmetic portion 104, or the like. The pipeline register 103C may have a function of temporarily storing a program of an application or the like.

The bus interface 163 has a function of a data path between the CPU core 102 and devices outside the CPU core 102 (e.g., the memory device 171).

As described above, in the semiconductor device of this embodiment, even after an operation in which another task interrupts and a yet another task interrupts is executed during program processing by a task, processing of the original task can be resumed on the basis of interrupted data. Since the data for resuming the task in the processing is retained in a register inside the CPU core, no access to a stack region of an external memory such as an SRAM or a DRAM is required for data saving or loading. Therefore, even when a process of switching to a different task is performed by an interrupt of another task, the data saving or loading process can be performed efficiently without causing a lag of memory access or the like due to the switching.

The structure described above in this embodiment can be used in combination with the structures described in the other embodiments as appropriate.

Embodiment 2

In this embodiment, a control system that is of a semiconductor device and has a function of performing power gating separately on the block (CPU or a semiconductor device such as a peripheral circuit) basis in accordance with the task is described. Note that each block includes the register 110 included in the semiconductor device described in Embodiment 1. The register 110 can be used in a variety of registers such as a general register, a control register, or a setting register.

Each block can retain data in the register also during power gating and can resume the process from the state where the data in the register was set after the return from the power gating. Furthermore, the task and power gating control of each block can be switched simultaneously. Furthermore, power consumption of blocks other than the block that is contributing to actual processing of the semiconductor device can be reduced.

Only the block that is contributing to processing of the semiconductor device can be operated, and a plurality of tasks can be executed with efficient switching therebetween. Thus, the control system that is of a semiconductor device and capable of reducing power consumption during the operation can be achieved. When the task and power gating control of each block are executed without losing the computing performance, the semiconductor device can have low power consumption and high computing performance.

Figure 8A:
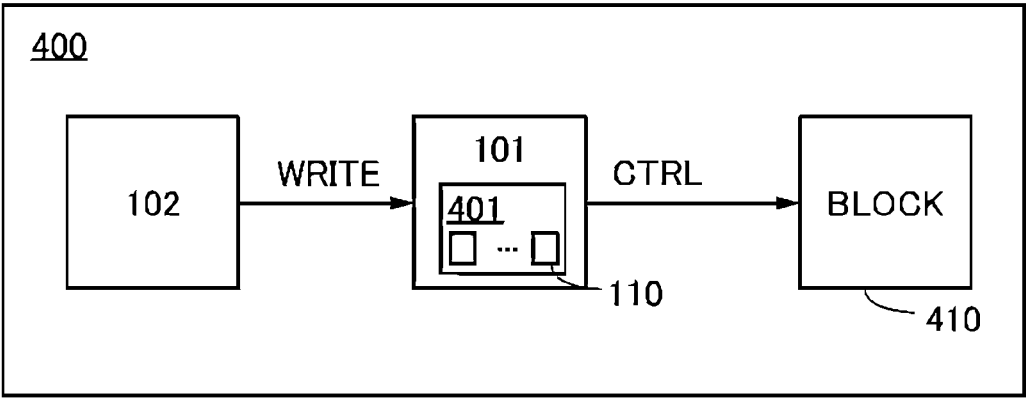
FIG. 8A and FIG. 8B are diagrams illustrating a structure example of a semiconductor device.

FIG. 8A is a diagram illustrating a control system which is of a semiconductor device and in which the above-described register 110 in Embodiment 1 is used in a setting register in the state control portion 101.

FIG. 8A is a block diagram illustrating a control system 400 of a semiconductor device. The control system 400 of a semiconductor device includes the CPU core 102, the state control portion 101, and a peripheral circuit 410 (expressed as BLOCK in the diagram) whose power gating is controlled by the state control portion 101. Note that the peripheral circuit 410 can also have a structure including the CPU core 102; the structure is of the case where the setting of the CPU core 102 itself is switched by setting data that is retained in the state control portion 101.

The state control portion 101 has a structure of outputting a signal for controlling power gating of the CPU core 102. Therefore, in the following description, the state control portion 101 is referred to as a power management unit (Power Management Unit: PMU) in some cases.

The state control portion 101 is provided with a setting register 401 including the plurality of registers 110. In response to writing of desired setting data to the setting register 401 of the state control portion 101 by the CPU core 102, a control signal group CTRL to be supplied to the peripheral circuit 410 is generated. In FIG. 8A, a signal WRITE corresponds to a signal for writing setting data from the CPU core 102 to the state control portion 101. The control signal group CTRL is output to the peripheral circuit 410. In the case where the peripheral circuit 410 is the CPU core 102, the control signal group CTRL corresponds to the signals described above in Embodiment 1 such as the signals BK, the signals RE, and the signal SE.

Figure 8B:
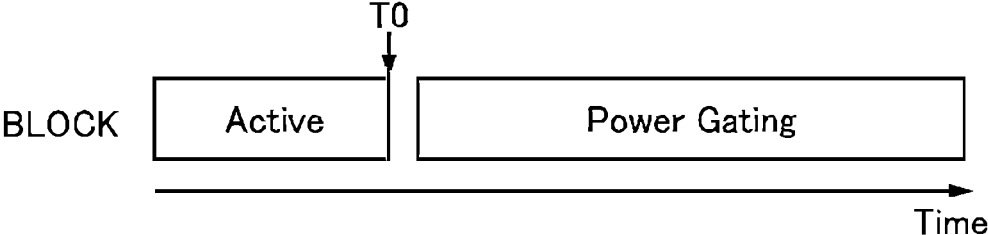

FIG. 8B is a timing chart of the control system 400 of a semiconductor device in FIG. 8A.

At Time T0, the CPU core 102 writes desired setting data to the setting register 401 of the state control portion 101, whereby the peripheral circuit 410 (BLOCK) transitions from a normal active state (Active) to a power gating state (Power Gating). Similarly, when the CPU core 102 writes desired setting data to the setting register 401 of the state control portion 101, the peripheral circuit 410 (BLOCK) transitions from a power gating state to a normal active state.

As described above, a structure where the peripheral circuit 410 (BLOCK) includes the CPU core 102 is also possible. In this case, a structure where the transition from the active state to the power gating state is executed by writing of desired setting data to the setting register 401 of the state control portion 101 by the CPU core 102 as described above is possible. A structure or the like where the transition from the power gating state to the normal active state is executed by writing of desired setting data to the setting register 401 of the state control portion 101 by an interrupt handler (not shown) in an interrupt process is possible.

FIG. 9A to FIG. 9D are diagrams illustrating a structure of the control system 400 of a semiconductor device. FIG. 9A to FIG. 9D illustrate a plurality of peripheral circuits 410 (BLOCK1 to BLOCK4) as examples. For example, a structure where BLOCK1 is a CPU core, BLOCK2 is a memory, BLOCK3 is a first interface, and BLOCK4 is a second interface is possible.

Figure 9A:
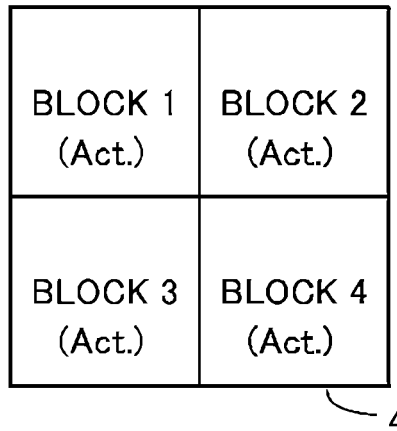
FIG. 9A to FIG. 9D are diagrams illustrating a structure example of a semiconductor device.

FIG. 9A illustrates each peripheral circuit 410 being processing a task, that is, BLOCK1 to BLOCK4 being in an active state (Act.) in the control system 400 of a semiconductor device.

Figure 9B:
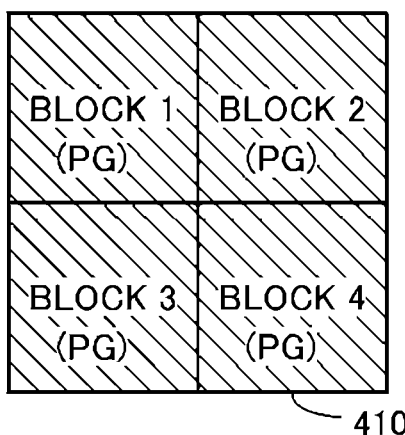

FIG. 9B illustrates each peripheral circuit 410 not being processing a task, that is, BLOCK1 to BLOCK4 being in a power gating state (PG) in the control system 400 of a semiconductor device.

The registers such as the registers 110 (general registers and pipeline registers) in the peripheral circuits 410 including the CPU core and the registers 110 (setting registers) in the state control portion 101 each have a structure including the scan flip-flop 120 and the data retention circuit 130 described above with reference to FIG. 2A and FIG. 2B in Embodiment 1. With this structure, data in the scan flip-flop 120 can be saved in the data retention circuit 130 right before the shift to the power gating state. The data can be retained also in the power gating state. In addition, in the case of a return from the power gating state to the active state, the data in the data retention circuit 130 is written back to the scan flip-flop 120, so that the process can be immediately resumed.

Figure 9C:
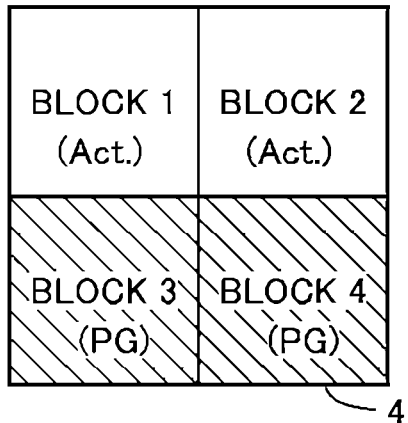

FIG. 9C illustrates BLOCK1 and BLOCK2 being in the active state and BLOCK3 and BLOCK4 being in the power gating state. For example, in the case where BLOCK1 is a CPU core, BLOCK2 is a memory, BLOCK3 is a first interface, and BLOCK4 is a second interface, FIG. 9C illustrates the state of each block of the case where the CPU core is executing task processing of data loading/storing.

Here, the blocks that are contributing to the data loading/storing are only the CPU core and the memory which are BLOCK1 and BLOCK2. In other words, the first interface and the second interface, which are BLOCK3 and BLOCK4, are not directly contributing to the task processing of data loading/storing. In the case where the blocks in the peripheral circuit 410 including the CPU core can be individually set in a power gating state (fine grain power gating), only the CPU core and the memory are made to operate, and the first interface (BLOCK3) and the second interface (BLOCK4) are set in a power gating state. With such a structure, power consumption of the first interface and the second interface can be reduced, and power consumption in the operation of the control system of a semiconductor device can be reduced.

Figure 9D:
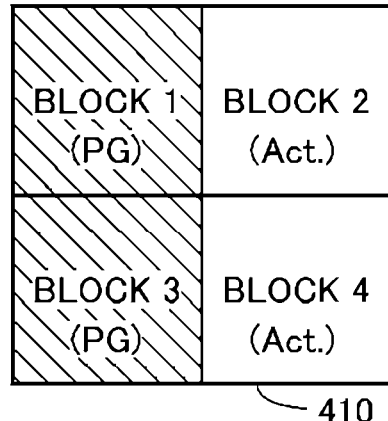

FIG. 9D illustrates BLOCK1 and BLOCK3 being in the active state and BLOCK2 and BLOCK4 being in the power gating state in the control system 400 of a semiconductor device. For example, in the case where BLOCK1 is a CPU core, BLOCK2 is a memory, BLOCK3 is a first interface, and BLOCK4 is a second interface, FIG. 9D illustrates the state of each block of the case where task processing of data transfer (direct transfer of data between the memory and an external memory device through the second interface) by direct memory access (DMA) is being executed.

Here, the blocks that are contributing to the DMA are only the memory and the second interface 2 which are BLOCK2 and BLOCK4. In other words, the CPU core and the interface 1, which are BLOCK1 and BLOCK3, are not directly contributing to the processing. In the case where the blocks in the peripheral circuit 410 including the CPU core can be individually power gated (fine grain power gating), only the memory and the second interface are made to operate, and the CPU core (BLOCK1) and the first interface (BLOCK3) are set in a power gating state. With such a structure, power consumption of the CPU core and the first interface can be reduced, and power consumption in the operation of the control system of a semiconductor device can be reduced.

Note that in the case of shifting from the state where the CPU core is executing the task processing of data loading/storing (FIG. 9C) to the state where the task processing of data transfer by the DMA is executed (FIG. 9D), a structure in which the power gating state is set after data in the scan flip-flop included in the register of the CPU core is stored in the data retention circuit included therein and in which a power supply voltage is applied after the data is restored from the data retention circuit included in a register in the second interface to the scan flip-flop included therein is possible. With such a structure, the task processing of data transfer by the DMA can be immediately executed.

Furthermore, in the case of shifting from the state where the task processing of data transfer by the DMA is executed (FIG. 3D) to the state where the CPU core is executing the task processing of data loading/storing (FIG. 3C), a structure in which power gating is set after data in the scan flip-flop is stored in the data retention circuit in the register of the second interface and in which a power supply voltage is applied after the data is restored from the data retention circuit included in the register of the CPU core to the scan flip-flop included therein is possible. With such a structure, the CPU core can immediately execute the task processing of data loading/storing.

Figure 10A:
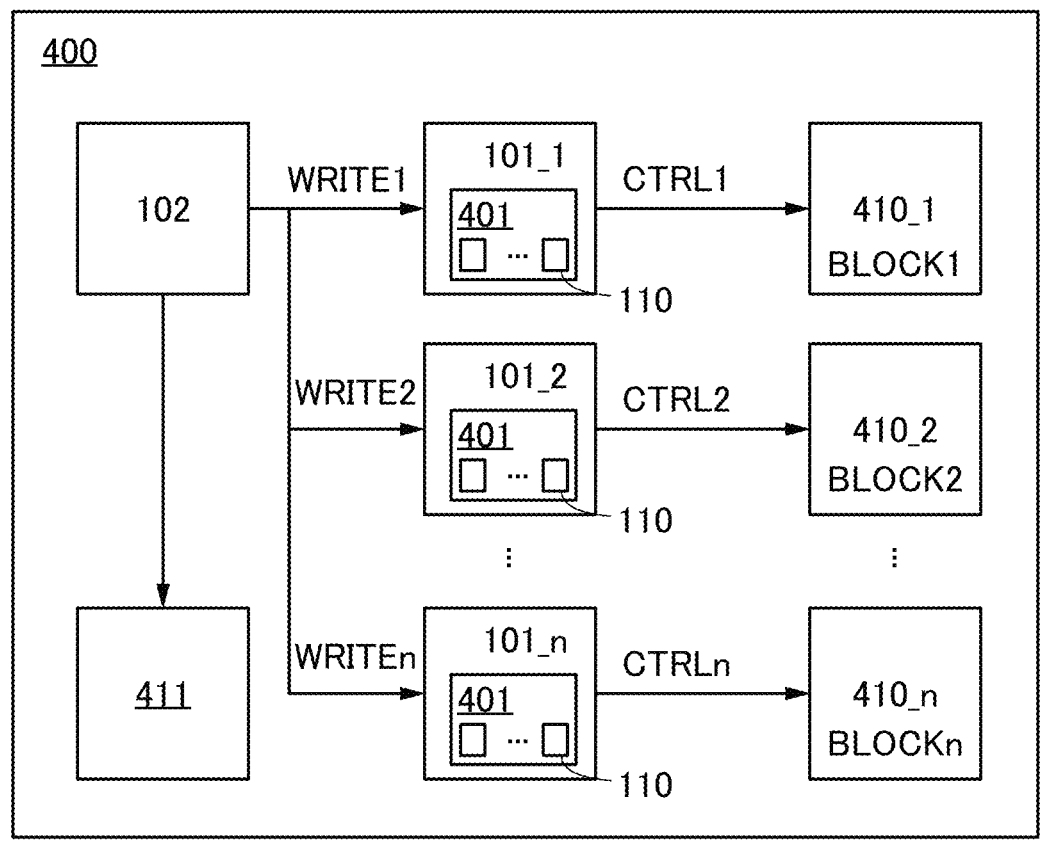
FIG. 10A and FIG. 10B are diagrams illustrating a structure example of a semiconductor device.
Figure 10B:
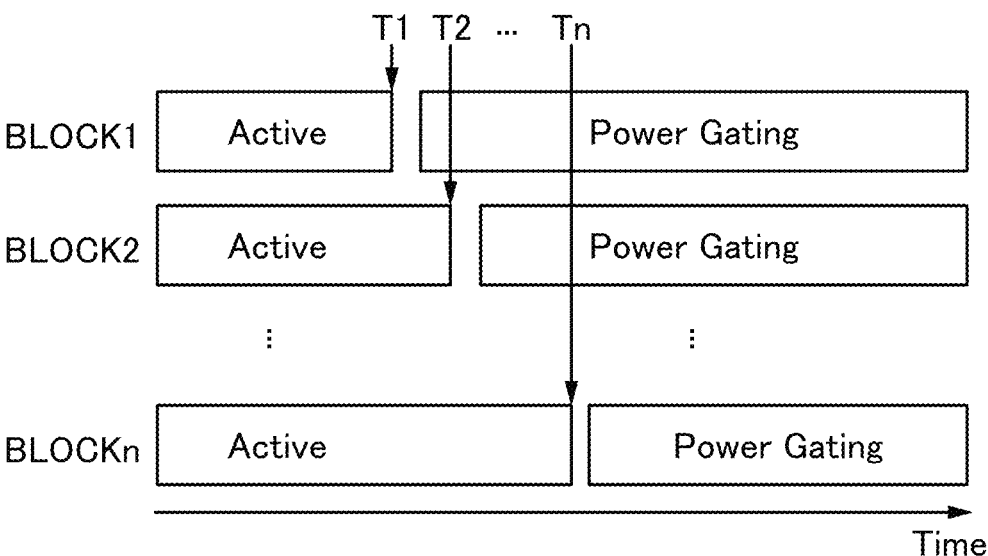

FIG. 10A and FIG. 10B are diagrams illustrating controlling a plurality of peripheral circuits including the CPU core to a power gating state in the control system of a semiconductor device.

The control to the power gating state on the block basis can be performed with a structure where a power supply signal line is separately provided for each block and a power supply control switch is provided for each power supply signal line. A structure where control of the power supply control switch is executed by rewriting control data (data indicating the power gating state of each block) of a control register is possible.

FIG. 10A is a block diagram of a control system that is of a semiconductor device and includes a plurality of blocks.

The control system 400 of a semiconductor device includes the CPU core 102, state control portions 101_1 to 101_n (n is an integer of 2 or more), peripheral circuits 410_1 to 410_n (BLOCK1 to BLOCKn) control of which to the power gating state is performed by the state control portions, and a control register 411. The state control portions 101_1 to 101_n have a function of a power management unit (PMU).

The state control portions 101_1 to 101_n are each provided with the setting register 401 including the plurality of registers 110. In response to writing of desired setting data to each of the setting registers 401 of the state control portions 101 by the CPU core 102, control signal groups CTRL1 to CTRLn to be supplied to the peripheral circuits 410 are generated. In FIG. 10A, signals WRITE1 to n correspond to setting data written to the respective setting registers 401 of the state control portions 101. The control signal groups CTRL1 to CTRLn correspond to the signals described above in Embodiment 1 such as the signals BK, the signals RE, and the signal SE.

The control register 411 has a function of retaining control data for controlling a power supply control switch provided for each block. The control register 411 can employ the structure of the register 110 including the scan flip-flop 120 and the data retention circuit 130 described with reference to FIG. 2A and FIG. 2B in Embodiment 1.

FIG. 10B is a timing chart of the control system 400 of a semiconductor device in FIG. 10A.

At Time T1, the CPU core 102 writes desired setting data to the setting register of the state control portion 101_1, whereby the peripheral circuit 410_1 (BLOCK1) transitions from a normal active state (Active) to a power gating state (Power Gating).

At Time T2, the CPU core 102 writes desired setting data to the setting register of the state control portion 1012, whereby the peripheral circuit 410_2 (BLOCK2) transitions from a normal active state (Active) to a power gating state (Power Gating).

At Time Tn, the CPU core 102 writes desired setting data to the setting register of the state control portion 101_n, whereby the peripheral circuit 410_n (BLOCKn) transitions from a normal active state (Active) to a power gating state (Power Gating).

Note that a structure where the peripheral circuits 410_1 to 410_n (BLOCK1 to BLOCKn) include the CPU core 102 is also possible. In this case, a structure where the transition from the active state to the power gating state is executed by writing of desired setting data to the setting registers 401 of the state control portions 101 by the CPU core as described above is possible. A structure or the like where the transition from the power gating state to the normal active state is executed by writing of desired setting data to the setting registers 401 of the state control portions 101 by an interrupt handler (not shown) in an interrupt process is possible.

The control of the power supply control switch (not shown) provided for each block at the time of power gating state can be executed in accordance with the control data written to the control register 411.

Figure 11A:
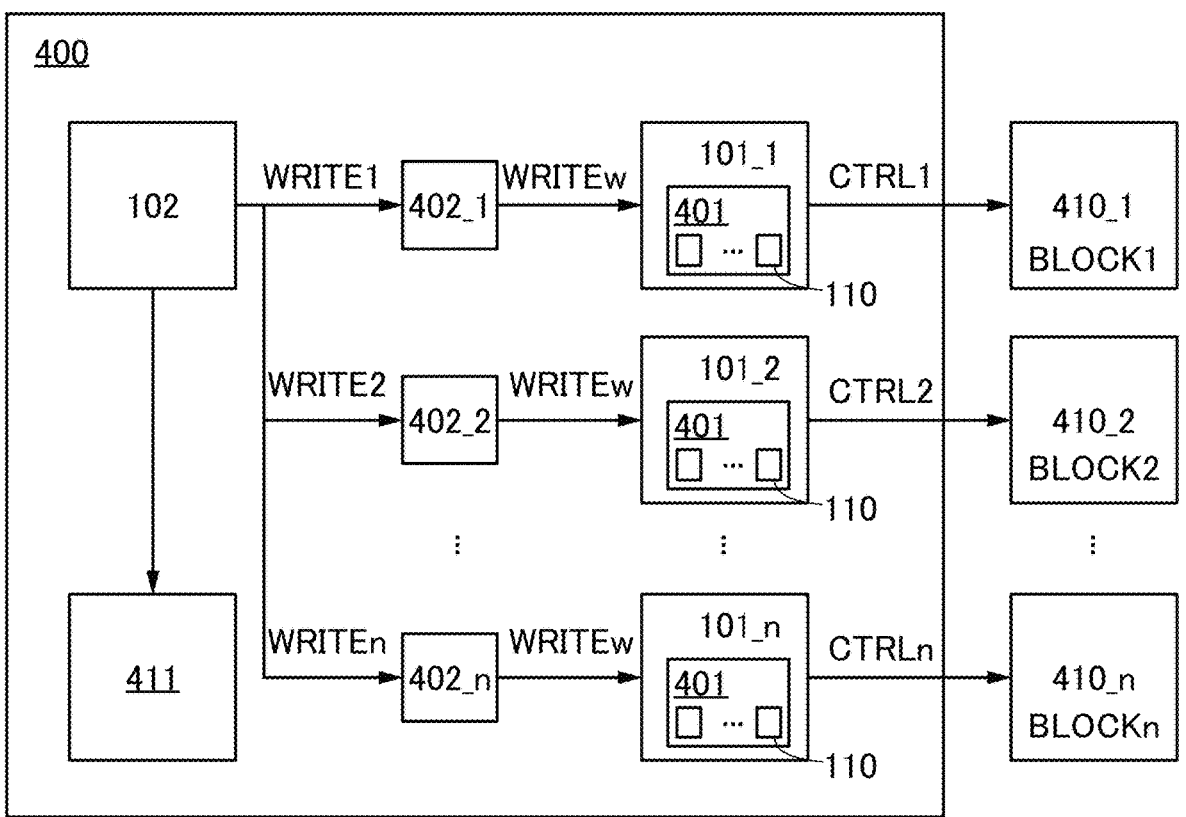
FIG. 11A and FIG. 11B are diagrams illustrating a structure example of a semiconductor device.
Figure 11B:
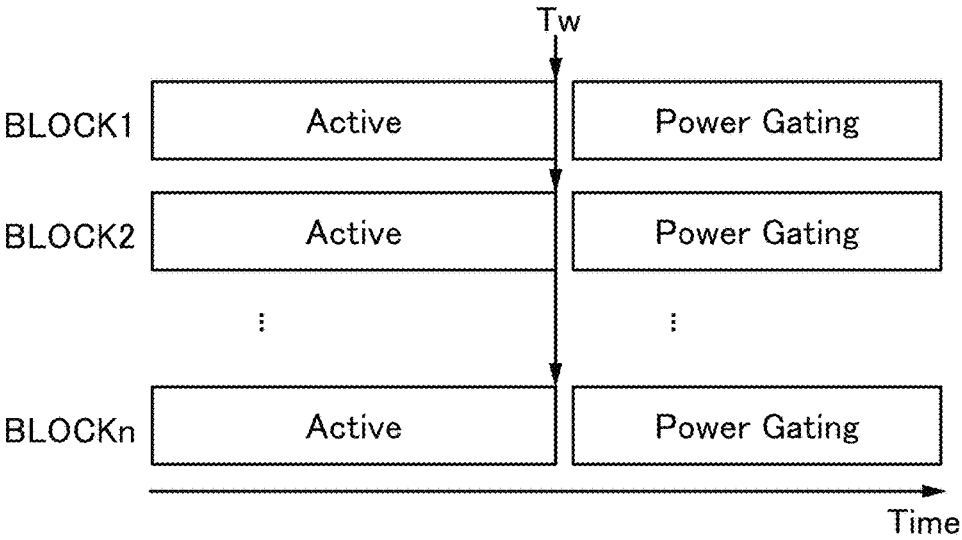

FIG. 11A and FIG. 11B are diagrams illustrating controlling the peripheral circuits including the CPU core to a power gating state in the control system of a semiconductor device. FIG. 11A and FIG. 11B are diagrams illustrating a structure of simultaneously executing power gating control of each block in the control system of a semiconductor device.

FIG. 11A is a block diagram of a control system that is of a semiconductor device and includes a plurality of blocks.

The control system 400 of a semiconductor device includes the CPU core 102, a buffer register 402_1 to a buffer register 402_n, the state control portions 101_1 to 101_n, the peripheral circuits 410_1 to 410_n (BLOCK1 to BLOCKn) control of which to the power gating state is performed by the state control portions, and the control register 411. The state control portions 101_1 to 101_n have a function of a power management unit (PMU).

The state control portions 101_1 to 101_n functioning as the PMU are each provided with the setting register 401 including the plurality of registers 110. After the CPU core 102 writes desired setting data to the buffer register 402_1, the setting data is written to the setting register 401 of the state control portion 1011, whereby the control signal group CTRL1 (e.g., BK, RE, and SE in FIG. 1) to be supplied to BLOCK1 is generated. The same applies to the buffer registers 402_2 to 402_n: after writing of desired setting data, the setting data is written to the setting registers 401 of the state control portions 101_2 to 101_n, whereby control signal groups CTRL2 to CTRLn to be supplied to BLOCK2 to BLOCKn are generated.

Signals WRITE1 to WRITEn shown in FIG. 11A correspond to signals for writing setting data from the CPU core 102 to the state control portions 101_1 to 101_n. The signals WRITE1 to WRITEn update setting data retained in the buffer registers 402_1 to 402_n as necessary. The buffer registers 402_1 to 402_n can retain the setting data by employing the structure of the register 110 including the scan flip-flop 120 and the data retention circuit 130 described with reference to FIG. 2A and FIG. 2B in Embodiment 1.

Signals WRITEw shown in FIG. 11A correspond to signals for writing the setting data retained in the buffer registers 402_1 to 402_n to each setting register 401. The signals WRITEw allow writing of the setting data retained in the buffer registers 402 to the corresponding setting registers 401. Writing of the setting data written to the buffer registers 402_1 to 402_n to the setting registers 401 of the state control portions 101_1 to 101_n can be executed by writing of desired control data from the CPU core 102 to the control register 411.

With such a structure, change of setting data in the setting register 401 in each of the state control portions 101_1 to 101_n can be executed simultaneously and the control signal groups CTRL1 to CTRLn to be supplied to the peripheral circuits 410_1 to 410_n can be generated simultaneously. Thus, control of BLOCK1 to BLOCKn, which are the peripheral circuits 410_1 to 410_n including the CPU core, to the power gating state can be executed simultaneously.

By simultaneously executing the power gating control of each block, the operation of a block that does not need to be operated can be stopped efficiently and the operation of a block that needs to be operated can be resumed efficiently; thus, the arithmetic processing can be executed with low power consumption.

The control signal groups CTRL1 to CTRLn shown in FIG. 11A correspond to the signals described above in Embodiment 1 such as the signals BK, the signals RE, and the signal SE.

FIG. 11B is a timing chart of the control system 400 of a semiconductor device in FIG. 11A.

The CPU core 102 writes first setting data to the buffer register 402_1 at the timing of the signal WRITE1 (not shown), the CPU core 102 writes second setting data to the buffer register 402_2 at the timing of the signal WRITE2 (not shown), and the CPU core 102 writes n-th setting data to the buffer register 402_n at the timing of the signal WRITEn (not shown). The signals WRITE1 to WRITEn are signals for performing writing at arbitrary times of different timings.

The setting data written to the buffer registers 402_1 to 402_n are written to the setting registers 401 of the state control portions 101_1 to 101_n at Time Tw simultaneously. Execution of rewriting the setting data at Time Tw follows writing of control data to the control register 411 by the CPU core 102 and generation of the signals WRITEw. By the update of the setting data in the state control portions 101_1 to 101_n, BLOCK1 to BLOCKn transition from a normal active state (Active) to a power gating state (Power Gating) simultaneously. In the power gating state, a power supply control switch provided for each block is controlled in accordance with the control data.

Note that a structure where any of BLOCK1 to BLOCKn includes a CPU core is also possible. In this case, a structure where the transition from the active state to the power gating state is executed by writing of desired setting data to any of the buffer registers 402_1 to 402_n by the CPU core 102 and writing of control data to the control register 411 by the CPU core 102 as described above is possible. A structure or the like where the transition from the power gating state to the normal active state is executed by writing of desired setting data to any of the buffer registers 402_1 to 402_n and writing of control data to the control register 411 by an interrupt handler (not shown) in an interrupt process is possible.

FIG. 12A to FIG. 12D and FIG. 13A and FIG. 13B are diagrams for explaining switching between a plurality of tasks in a semiconductor device that includes a plurality of blocks each formed using the register 110 provided with the data retention circuit 130 including the plurality of memory circuits 131.

FIG. 12A to FIG. 12D are diagrams illustrating a structure of the control system 400 of a semiconductor device. FIG. 12A to FIG. 12D illustrate the plurality of peripheral circuits 410 (BLOCK1 to BLOCK4) as examples.

FIG. 12A illustrates the state where the control system 400 of a semiconductor device is processing a task task1, that is, BLOCK1 to BLOCK4 being in an active state.

FIG. 12B illustrates the state where the control system 400 of a semiconductor device is not processing a task, that is, BLOCK1 to BLOCK4 being in a power gating state (PG).

FIG. 12C illustrates BLOCK1 and BLOCK2 being in the active state at the time of processing a task task2 and BLOCK3 and BLOCK4 being in the power gating state in the control system 400 of a semiconductor device.

FIG. 12D illustrates BLOCK1 and BLOCK3 being in the active state at the time of processing a task task3 and BLOCK2 and BLOCK4 being in the power gating state in the control system 400 of a semiconductor device.

Figure 13A:
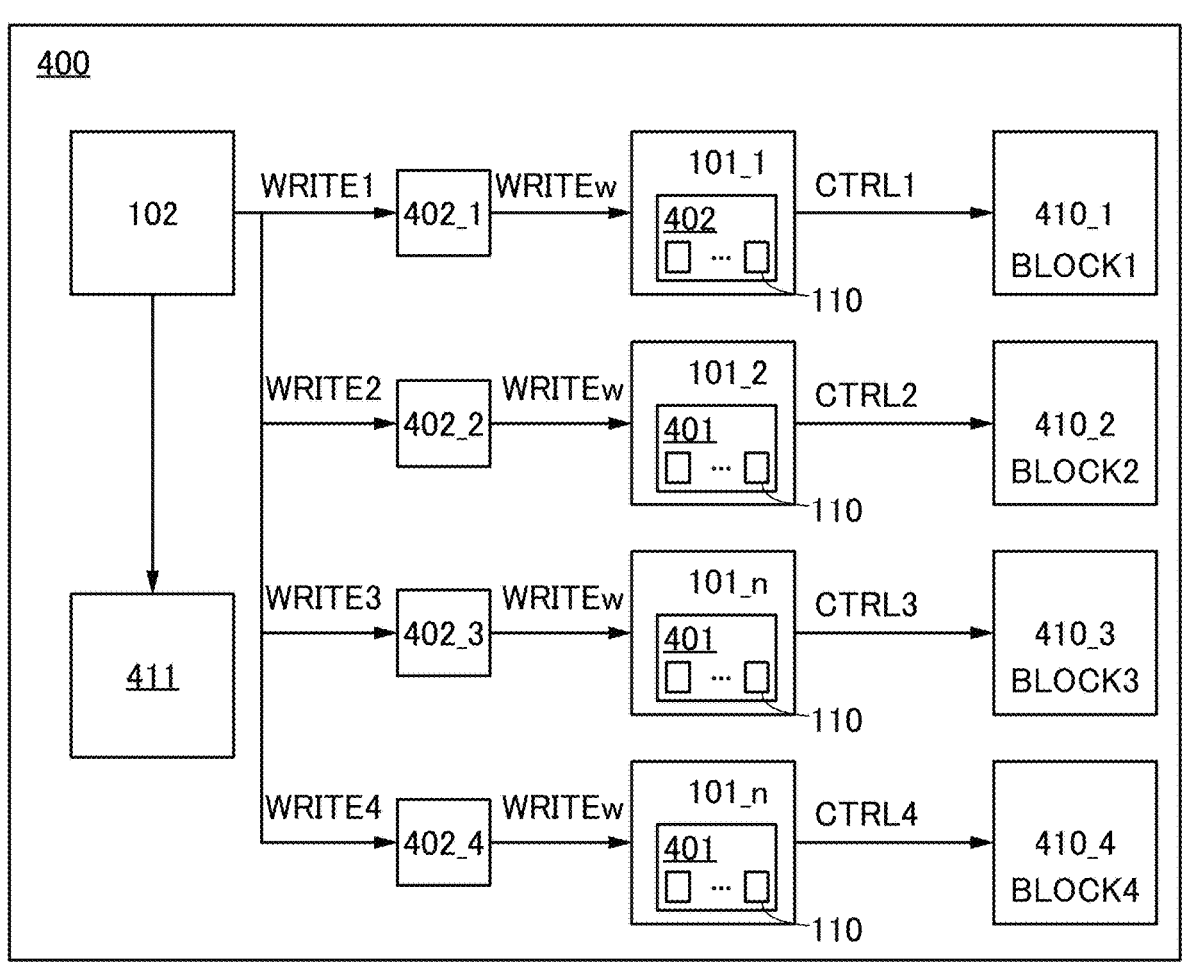
FIG. 13A and FIG. 13B are diagrams illustrating a structure example of a semiconductor device.
Figure 13B:
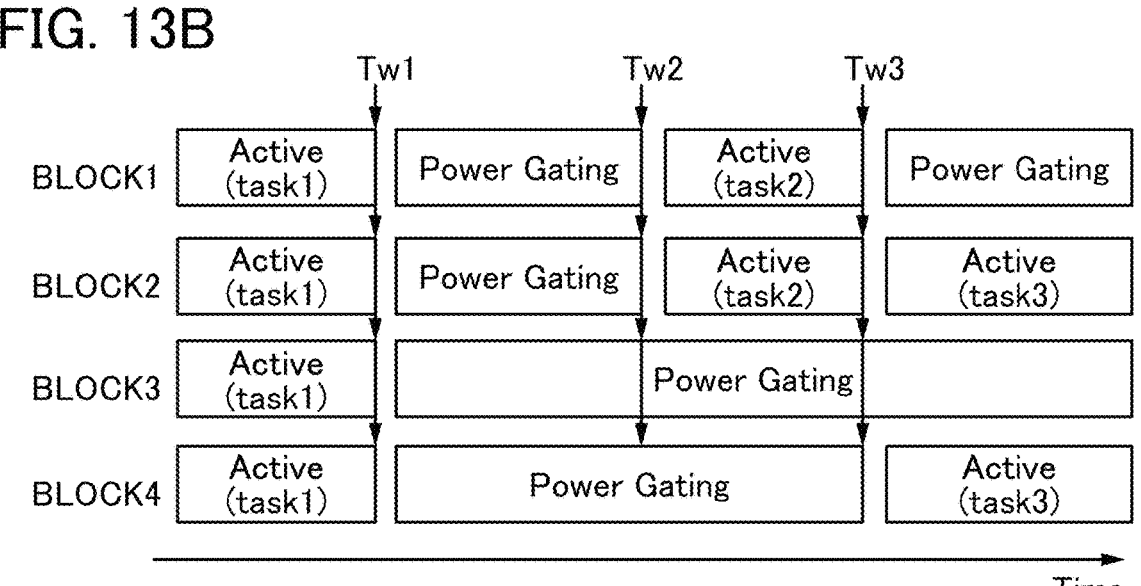

FIG. 13A and FIG. 13B are diagrams illustrating a structure of simultaneously executing control of the power gating state of each block in the control system 400 of a semiconductor device.

FIG. 13A is a block diagram of the control system 400 of a semiconductor device.

The control system 400 of a semiconductor device includes the CPU core 102, the buffer register 402_1 to the buffer register 402_4, the state control portions 101_1 to 1014, the peripheral circuits 410_1 to 410_4 (BLOCK1 to BLOCK4) control of which to the power gating state is performed by the state control portions 101_1 to 1014, and the control register 411. The state control portions 101_1 to 101_4 have a function of a power management unit (PMU).

The state control portions 101_1 to 101_4 functioning as the PMU are each provided with the setting register 401 including the plurality of registers 110. After the CPU core 102 writes desired setting data to the buffer registers 402_1 to 4024, the setting data is written to the setting registers 401 included in the state control portions 101_1_1 to 1014, whereby the control signal groups CTRL1 to CTRL4 to be supplied to the peripheral circuits 410_1 to 410_4 are generated.

Signals WRITE1 to WRITE4 shown in FIG. 13A correspond to signals for writing setting data from the CPU core 102 to the state control portions 101_1 to 101_4. The signals WRITE1 to WRITE4 update setting data retained in the buffer registers 402_1 to 402_4 as necessary. The buffer registers 402_1 to 402_4 can retain the setting data by employing the structure of the register 110 in Embodiment 1.

Signals WRITEw shown in FIG. 13A correspond to signals for writing the setting data retained in the buffer registers 402_1 to 402_4 to each setting register 401. The signals WRITEw allow writing of the setting data retained in the buffer registers 402 to the corresponding setting registers 401. Writing of the setting data written to the buffer registers 402_1 to 402_4 to the setting registers 401 of the state control portions 101_1 to 101_4 can be executed by writing of desired control data from the CPU core 102 to the control register 411.

With such a structure, change of setting data in the setting register 401 in each of the state control portions 101_1 to 101_4 can be executed simultaneously and the control signal groups CTRL1 to CTRL4 to be supplied to BLOCK1 to BLOCK4 can be generated simultaneously. Thus, control of BLOCK1 to BLOCK4 to the power gating state can be executed simultaneously. By simultaneously executing the control of each block to the power gating state, the operation of a block that does not need to be operated can be stopped efficiently and the operation of a block that needs to be operated can be resumed efficiently; thus, the arithmetic processing can be executed with low power consumption.

FIG. 13B is a timing chart illustrating the execution of switching between the tasks in FIG. 12A to FIG. 12D in the semiconductor device.

The initial state corresponds to FIG. 12A, where BLOCK1 to BLOCK4 are executing the task task1.

At a timing before Time Tw1, the CPU core 102 writes first setting data to the buffer register 402_1 to the buffer register 402_4. At Time Tw1, the CPU core 102 writes control data to the control register. In accordance with the control data written at Time Tw1, the first setting data retained in the buffer register 402_1 to the buffer register 402_4 is individually written to the setting registers 401 of the state control portions 101_1 to 101_4. In BLOCK1 to BLOCK4, data corresponding to the task1 is stored in the data retention circuit 130 in each register 110, and BLOCK1 to BLOCK4 transition to the power gating state. In other words, the transition to the state in FIG. 12B takes place.

At a timing between Time Tw1 and Time Tw2, the CPU core 102 writes second setting data to the buffer register 402_1 to the buffer register 402_4. At Time Tw2, the CPU core 102 writes control data to the control register. In accordance with the control data written at Time Tw2, the second setting data retained in the buffer register 402_1 to the buffer register 402_4 is individually written to the setting registers 401 of the state control portions 101_1 to 101_4. In BLOCK1 and BLOCK2, data corresponding to the task2 stored in the data retention circuit 130 in each register 110 is stored in the scan flip-flop 120, and BLOCK1 and BLOCK2 transition to the active state. Furthermore, BLOCK3 and BLOCK4 are kept their transition state, that is, the power gating state. In other words, the transition to the state in FIG. 12C takes place.

At a timing between Time Tw2 and Time Tw3, the CPU core 102 writes third setting data to the buffer register 402_1 to the buffer register 402_4. At Time Tw2, the CPU core 102 writes control data to the control register. In accordance with the control data written at Time Tw2, the third setting data retained in the buffer register 402_1 to the buffer register 402_4 is individually written to the setting registers 401 of the state control portions 101_1 to 101_4. In BLOCK1, data corresponding to the task2 is stored in the data retention circuit 130 in each register 110, and BLOCK1 transitions to the power gating state. In BLOCK2, data corresponding to the task2 is stored in the data retention circuit 130 in each register 110, and data corresponding to the task3 stored in the data retention circuit 130 is stored in the scan flip-flop 120. Furthermore, BLOCK3 is kept its transition state, that is, the power gating state. Moreover, in BLOCK4, data corresponding to the task3 stored in the data retention circuit 130 in each register 110 is stored in the scan flip-flop 120, and BLOCK4 transitions to the active state. In other words, the transition to the state in FIG. 12D takes place.

Note that a structure where any of BLOCK1 to BLOCK4 includes a CPU core is also possible. In this case, a structure where the transition from the active state to the power gating state is executed by writing of desired setting data to any of the buffer registers 402_1 to 402_4 and writing of control data to the control register 411 by the CPU core 102 as described above is possible. A structure or the like where the transition from the power gating state to the normal active state is executed by writing of desired setting data to any of the buffer register 402_1 to the buffer register 402_4 and writing of control data to the control register 411 by an interrupt handler (not shown) in an interrupt process is possible.

With the above-described structure, a low-power-consumption and high-computing-performance control system of a semiconductor device, where only the block that is contributing to processing of the control system of a semiconductor device can be operated and a plurality of tasks can be executed with efficient switching therebetween, can be provided.

The configuration, structure, method, and the like described in this embodiment can be used in appropriate combination with the configurations, structures, methods, and the like described in the other embodiments, examples, and the like.

Embodiment 3

In this embodiment, application examples of the semiconductor device described in the above embodiment and structures of the semiconductor device that can be used in combination with a memory device are described. As examples, structure examples of the semiconductor device including stacked transistors and structure examples in which the semiconductor device including stacked transistors and a memory device are combined are described. With this structure, the flexibility in design of the semiconductor device can be increased. Stacking transistors can increase the degree of integration of the semiconductor device.

Figure 14A:
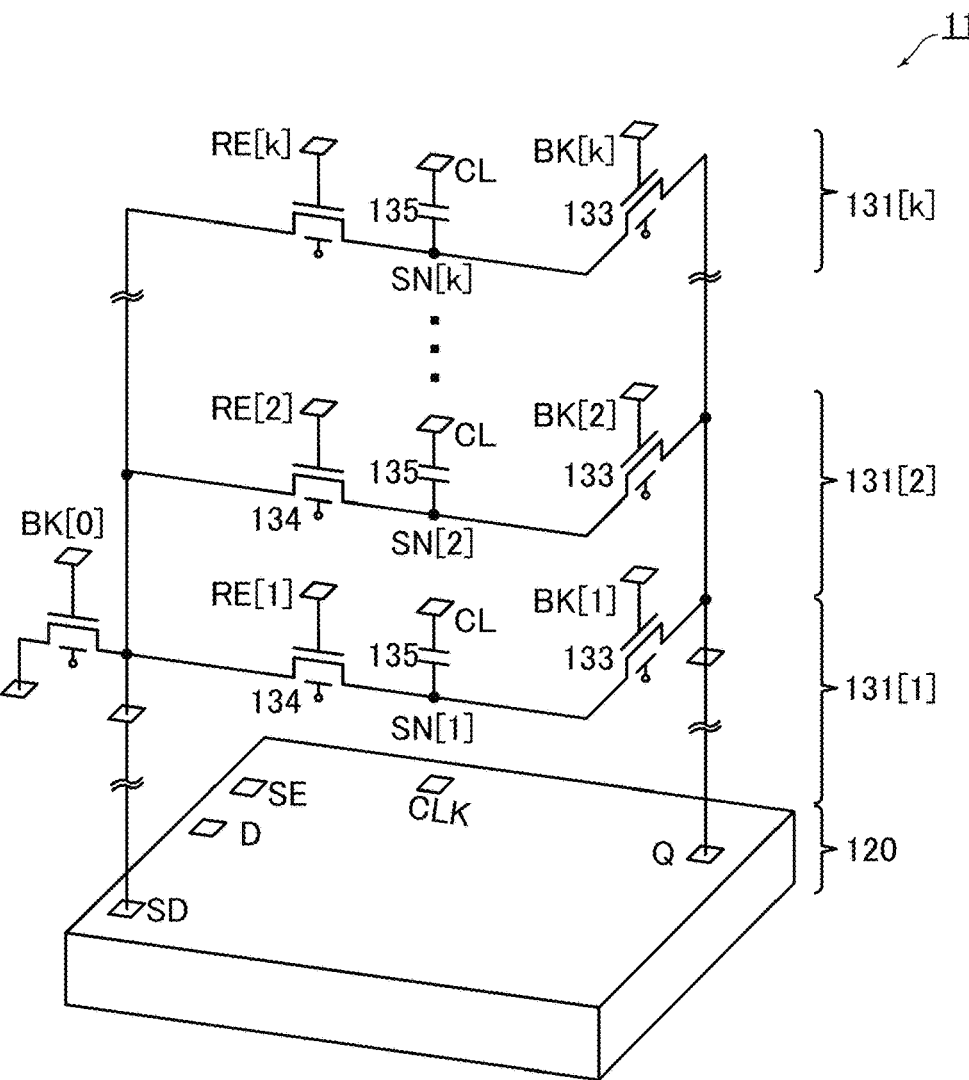
FIG. 14A and FIG. 14B are diagrams illustrating a structure example of a semiconductor device.

In the register 110 included in the semiconductor device 100 described above in Embodiment 1, the memory circuits 131 included in the data retention circuit 130 can be provided in stacked layers each including transistors. For example, as in a register 110A illustrated in FIG. 14A, the plurality of memory circuits 131 (the memory circuits 131[1] and 131[2] to 131[$k$] are illustrated in FIG. 14A, k is an integer of 2 or more) can be stacked in different layers over the scan flip-flop 120 formed using a silicon CMOS circuit. With this structure, the plurality of memory circuits 131 can be provided within a region where the scan flip-flop 120 is formed; thus, even when the plurality of memory circuits 131 are incorporated, the area overhead of the register 110A can be preferably zero.

Figure 14B:
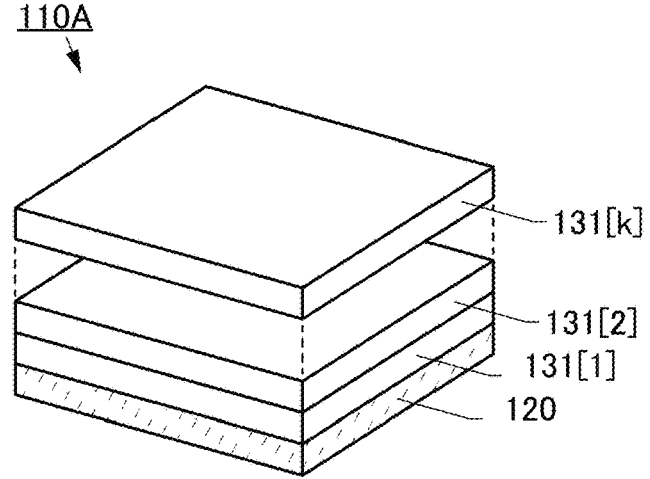

In the register 110A, k (k is an integer of 2 or more) layers of the memory circuits 131[1] to 131[$k$] can be stacked over the scan flip-flop 120 as illustrated in FIG. 14B.

The plurality of memory circuits 131 provided over the scan flip-flop 120 may be memory circuits having a different circuit structure. As a memory circuit that can be provided in a layer above the memory circuits 131 over the scan flip-flop 120, a DOSRAM which is a memory circuit including OS transistors is preferable, for example.

FIG. 15A illustrates a schematic diagram of the register 110A in which memory circuits 141[1] to 141[$k$] being layers including DOSRAM memory cells are stacked in layers further above the memory circuit 131 over the scan flip-flop 120. As illustrated, k (k is an integer of 2 or more) layers of the memory circuits 141[1] to 141[$k$] can be stacked over the memory circuit 131. Note that the DOSRAM memory cells provided over the scan flip-flop 120 may have a structure in which one memory cell is provided in each layer or a structure in which a plurality of memory cells is provided in each layer.

A DOSRAM (registered trademark) is an abbreviation for "Dynamic Oxide Semiconductor RAM", which indicates a RAM including 1T (transistor) 1C (capacitor)-type memory cells. The DOSRAM is a DRAM formed using an OS transistor, and the DOSRAM is a memory that temporarily stores information sent from the outside. The DOSRAM is a memory utilizing a low off-state current of an OS transistor.

FIG. 15B illustrates an example of a circuit structure of a memory cell MC included in the DOSRAM. The memory cell MC illustrated in FIG. 15B includes a transistor M1 and a capacitor C. As the transistor M1, an OS transistor can be used. FIG. 15B illustrates a wiring WL, a wiring BL, and a wiring PL connected to the elements included in the memory cell MC. The wiring WL is a wiring functioning as a word line. The wiring BL is a wiring functioning as a bit line. The wiring PL is a wiring functioning as a capacitor line. The wiring PL can function as a wiring that supplies a potential to a back gate of the transistor M1.

FIG. 15C is a schematic diagram in which the memory circuits 141[1] to 141[$k$] being the layers including DOSRAM memory cells MC are stacked in the layers further above the memory circuit 131 over the scan flip-flop 120 illustrated in FIG. 15A. Although not illustrated, the memory circuit 131 can have a structure in which a plurality of memory circuits is provided in the same layer or a structure in which a plurality of memory circuits is stacked as described above.

In FIG. 15C, a driver circuit 123A that performs data writing and reading to/from the DOSRAM is provided in the same layer as the scan flip-flop 120 formed using the silicon CMOS circuit. The driver circuit 123A includes a terminal SA connected to the wiring BL. The terminal SA is a terminal connected to a circuit such as a sense amplifier circuit.

With the structure illustrated in FIG. 15A and FIG. 15C, what is called an SoC (System on Chip), in which the semiconductor device 100 functioning as a CPU and the DOSRAM being a memory device are tightly coupled, can be achieved. Since a wiring connecting the devices that perform data transfer can be shortened, heat generation and an increase in power consumption can be inhibited. Since the DOSRAM that is a memory device and provided to have a stacked-layer structure can have large data capacity, when the DOSRAM is used as a large cache memory or a main memory, the performance of the semiconductor device can be increased.

Furthermore, the plurality of memory circuits 131 provided over the scan flip-flop 120 may be memory circuits having a different circuit structure. As a memory circuit that can be provided in a layer above the memory circuits 131 over the scan flip-flop 120, a NOSRAM that is a memory circuit including OS transistors is preferable, for example.

FIG. 16A illustrates a schematic diagram of a register 110B in which memory circuits 142[1] to 142[$k$] being layers including NOSRAM memory cells are stacked in layers further above the memory circuit 131 over the scan flip-flop 120. As illustrated, k (k is an integer of 2 or more) layers of the memory circuits 142[1] to 142[$k$] can be stacked over the memory circuit 131. Note that the NOSRAM memory cells provided over the scan flip-flop 120 may have a structure in which one memory cell is provided in each layer or a structure in which a plurality of memory cells is provided in each layer.

NOSRAM (registered trademark) is an abbreviation for "Nonvolatile Oxide Semiconductor Random Access Memory (RAM)". A NOSRAM is a memory in which its memory cell is a 2-transistor (2T) or 3-transistor (3T) gain cell, and its access transistor is an OS transistor. A current flowing between a source and a drain in an off state, that is, a leakage current, is extremely low in an OS transistor. The NOSRAM can be used as a nonvolatile memory by retaining electric charges corresponding to data in the memory cell, using characteristics of an extremely low leakage current. In particular, the NOSRAM is capable of reading out retained data without destruction (non-destructive reading), and thus is suitable for arithmetic processing in which only a data reading operation is repeated many times.

FIG. 16B illustrates an example of a circuit structure of a memory cell MC included in the NOSRAM. The memory cell MC illustrated in FIG. 16B includes transistors M1 to M3 and a capacitor C. As the transistors M1 to M3, OS transistors can be used. FIG. 16B illustrates a wiring WWL, a wiring RWL, a wiring WBL, a wiring RBL, and a wiring PL connected to the elements included in the memory cell MC. The wiring WWL is a wiring functioning as a write word line. The wiring RWL is a wiring functioning as a read word line. The wiring WBL is a wiring functioning as a write bit line. The wiring RBL is a wiring functioning as a read bit line. The wiring PL is a wiring functioning as a capacitor line. The wiring PL can function as a wiring that supplies a potential to a back gate of the transistor M1.

FIG. 16C is a schematic diagram in which the memory circuits 142[1] to 142[$k$] being the layers including NOSRAM memory cells MC are stacked in the layers further above the memory circuit 131 over the scan flip-flop 120 illustrated in FIG. 16A. Although not illustrated, the memory circuit 131 can have a structure in which a plurality of memory circuits is provided in the same layer or a structure in which a plurality of memory circuits is stacked as described above.

In FIG. 16C, a driver circuit 123B that performs data writing and reading to/from the NOSRAM is provided in the same layer as the scan flip-flop 120 formed using the silicon CMOS circuit. The driver circuit 123B includes a terminal WD connected to the wiring WBL and a terminal SA connected to the wiring RBL. The terminal WD is a terminal that supplies data to be written to the memory cell MC. The terminal SA is a terminal connected to a circuit such as a sense amplifier circuit.

With the structure illustrated in FIG. 16A and FIG. 16C, what is called an SoC, in which the semiconductor device 100 functioning as a CPU and the NOSRAM being a memory device are tightly coupled, can be achieved. Since a wiring connecting the devices that perform data transfer can be shortened, heat generation and an increase in power consumption can be inhibited. Since the NOSRAM that is a memory device and provided to have a stacked-layer structure can have large data capacity, when the NOSRAM is used as a large cache memory, a main memory, or a storage memory, the performance of the semiconductor device can be increased.

Figures 17A, 17B, 17C, 17D:
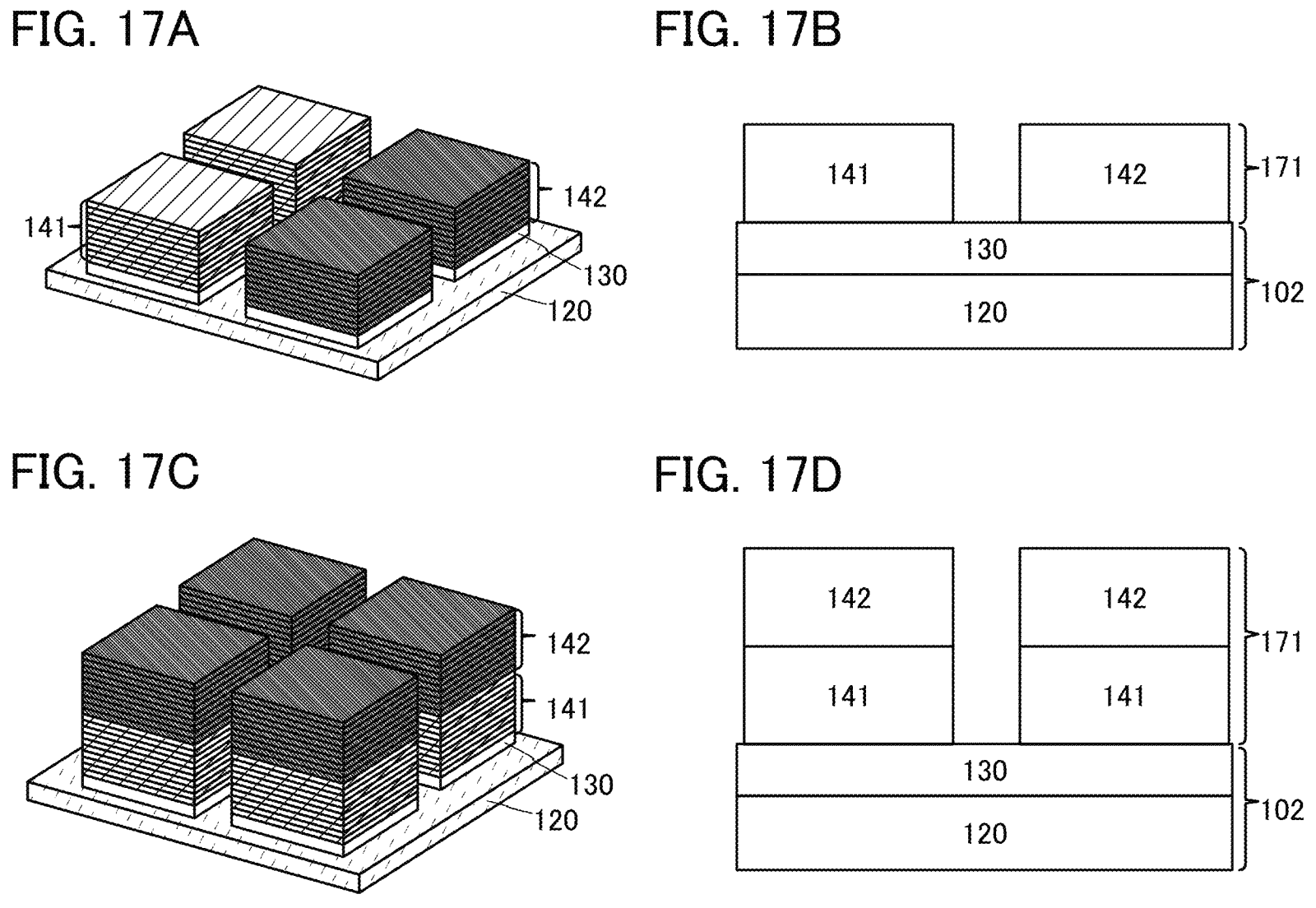

FIG. 17A is a diagram illustrating an example in which the semiconductor device using the structure in FIG. 15A or FIG. 16A is integrated in an SoC. FIG. 17A illustrates a structure in which a layer including the data retention circuit 130, which can be provided in a layer including OS transistors, is provided over a layer including the scan flip-flop 120 which can be provided on a silicon substrate, and a layer including the memory circuit 141 functioning as the DOSRAM and a layer including the memory circuit 142 functioning as the NOSRAM are provided over the layer including the data retention circuit 130.

FIG. 17B is a block diagram corresponding to the structure example illustrated in FIG. 17A. FIG. 17B illustrates the scan flip-flop 120 and the data retention circuit 130, which form the CPU core 102, and the memory circuit 141 functioning as the DOSRAM and the memory circuit 142 functioning as the NOSRAM, which form the memory device 171. With the structure illustrated in FIG. 17A and FIG. 17B, what is called an SoC, in which the CPU core 102 and the memory device 171 are tightly coupled, can be achieved. Since a wiring connecting the devices that perform data transfer can be shortened, heat generation and an increase in power consumption can be inhibited. Since the NOSRAM that is a memory device and provided to have a stacked-layer structure can have large data capacity, when the NOSRAM is used as a large cache memory, a main memory, or a storage memory, the performance of the semiconductor device can be increased.

FIG. 17C is a diagram illustrating an example different from that of FIG. 17A in which the semiconductor device using the structure in FIG. 15A or FIG. 16A is integrated in an SoC. FIG. 17A illustrates a structure in which a layer including the data retention circuit 130, which can be provided in a layer including OS transistors, is provided over a layer including the scan flip-flop 120 which can be provided on a silicon substrate, a layer including the memory circuit 141 functioning as the DOSRAM is provided over the layer including the data retention circuit 130, and a layer including the memory circuit 142 functioning as the NOSRAM is provided over the layer including the memory circuit 141.

FIG. 17D is a block diagram corresponding to the structure example illustrated in FIG. 17C. FIG. 17D illustrates the scan flip-flop 120 and the data retention circuit 130, which form the CPU core 102, and the memory circuit 141 functioning as the DOSRAM and the memory circuit 142 functioning as the NOSRAM, which form the memory device 171. With the structure illustrated in FIG. 17C and FIG. 17D, what is called an SoC, in which the CPU core 102 and the memory device 171 are tightly coupled, can be achieved. Since a wiring connecting the devices that perform data transfer can be shortened, heat generation and an increase in power consumption can be inhibited. Since the NOSRAM that is a memory device and provided to have a stacked-layer structure can have large data capacity, when the NOSRAM is used as a large cache memory, a main memory, or a storage memory, the performance of the semiconductor device can be increased.

Embodiment 4

In one embodiment of the present invention, a variation of the semiconductor device including a stacked memory device described in Embodiment 3 is described.

Figure 18A:
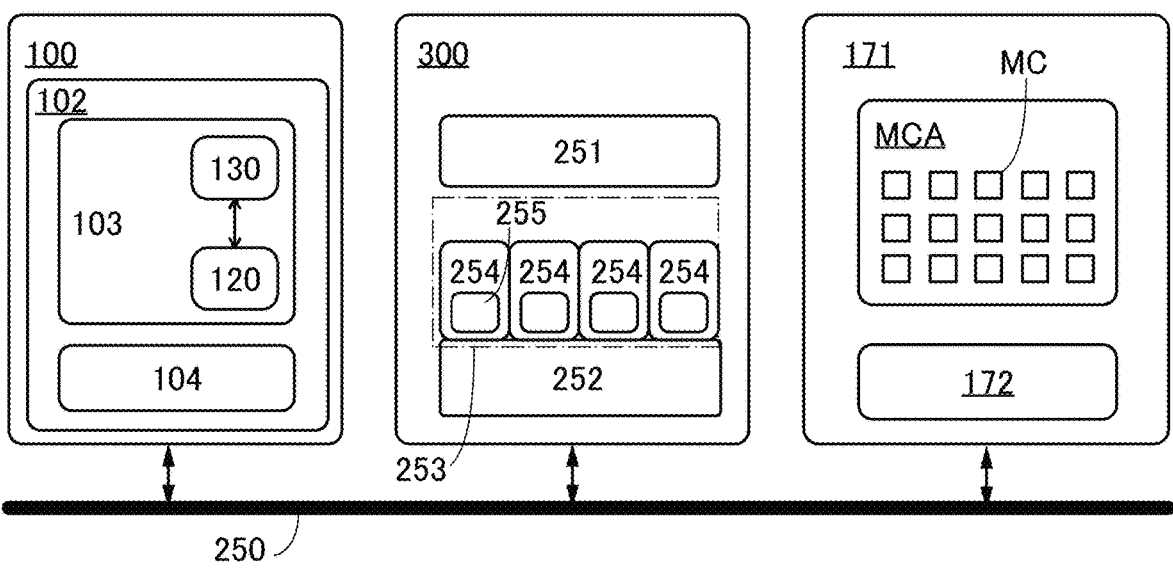
FIG. 18A and FIG. 18B are diagrams illustrating a structure example of a semiconductor device.

FIG. 18A illustrates a block diagram in which the semiconductor device 100 functioning as a CPU, the memory device 171, and a product-sum operation device 300 are connected through a bus 250. The semiconductor device 100 and the product-sum operation device 300 have a function of performing an arithmetic operation for executing a program. The product-sum operation device 300 is referred to as an accelerator or a GPU (Graphics Processing Unit) in some cases.

The CPU core 102 is illustrated in the semiconductor device 100 illustrated in FIG. 18A. The CPU core 102 includes the register portion 103 and the arithmetic portion 104. The register portion 103 is provided with the scan flip-flop 120 and the data retention circuit 130. For the components included in the semiconductor device 100, the description of the components described in Embodiment 1 and the like can be referred to.

The memory device 171 illustrated in FIG. 18A is an OS memory including OS transistors such as a NOSRAM or a DOSRAM. The memory device 171 includes, as well as a memory cell array MCA including a plurality of memory cells MC, a driver circuit 172 for driving the memory cell array MCA. Since OS transistors used as the transistors included in the memory cells MC can be provided to be stacked, the memory device can include the memory cells MC provided with the plurality of stacked transistors. The driver circuit 172 preferably includes a Si transistor because a high-speed operation is required.

The product-sum operation device 300 includes a device memory 251, a shared memory 252, and an arithmetic portion 253. The device memory 251 and the shared memory 252 are each referred to as an on-site memory in some cases. The device memory 251 and the shared memory 252 can be OS memories including OS transistors, such as a NOSRAM or a DOSRAM. When OS transistors are used as the transistors included in the device memory 251 and the shared memory 252, the OS transistors and the memory cell array MCA included in the memory device 171 can be provided to be stacked.

The product-sum operation device 300 has a function of executing a program called from a host program. The product-sum operation device 300 can perform parallel processing of matrix operation in graphics processing, parallel processing of product-sum operation of a neural network, and parallel processing of floating-point operation in a scientific computation, for example.

The device memory 251 stores a program (also referred to as kernel or a kernel program) executed by the product-sum operation device 300 and data processed by the product-sum operation device 300. The device memory 251 is connected to the shared memory 252 through a memory bus (not illustrated).

The shared memory 252 has a function of retaining data of a digital value or an analog value that is input to or output from the arithmetic portion 253.

The arithmetic portion 253 has a function of performing arithmetic processing using data with a digital value or an analog value. The arithmetic portion 253 includes a plurality of arithmetic units 254. The arithmetic units 254 each have a function of performing any one of processings such as an integer arithmetic operation, a single precision floating-point arithmetic operation, and a double precision floating-point arithmetic operation, using data retained in a data retention portion 255. The plurality of arithmetic units 254 basically executes the same instruction.

In the semiconductor device 100 functioning as a CPU, the memory device 171, and the product-sum operation device 300 illustrated in FIG. 18A, when OS transistors are used as the transistors included in the data retention circuit 130, the device memory 251, the shared memory 252, the arithmetic portion 253, and the memory cell array MCA, a layer including OS transistors can be provided to be stacked in a direction (also referred to as a z direction) perpendicular to a substrate surface where the Si transistors are provided.

Figure 18B:
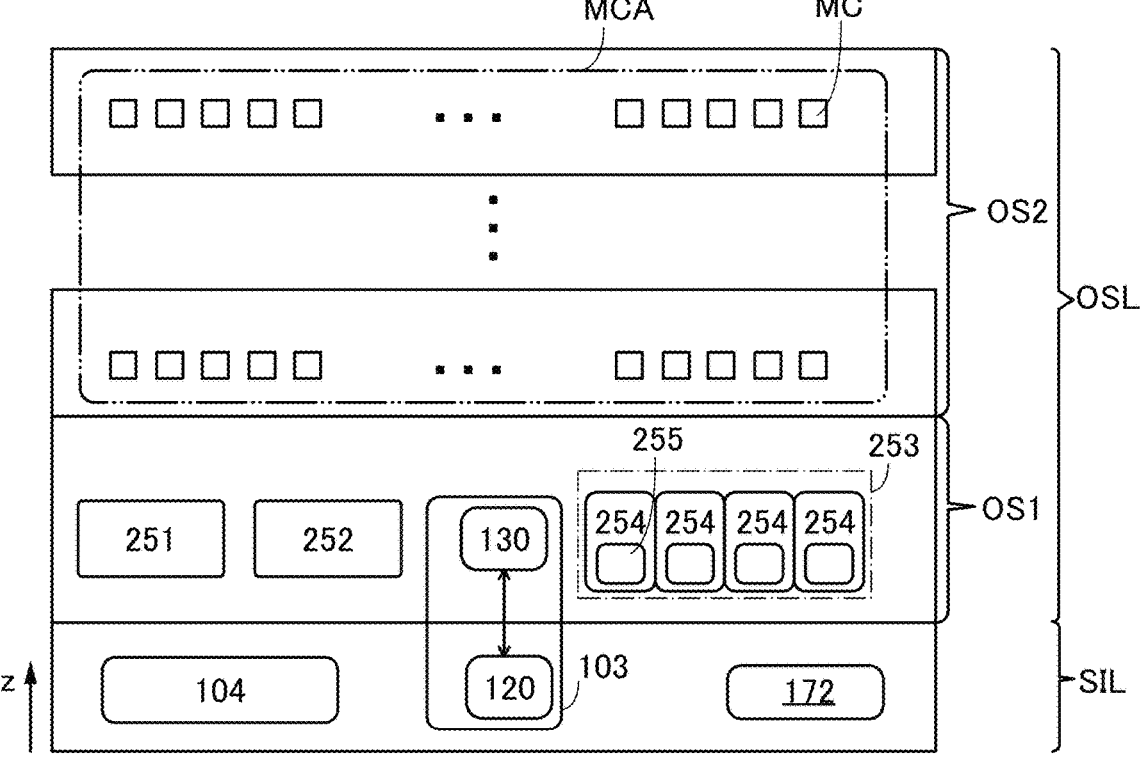

FIG. 18B is a schematic cross-sectional diagram in which a layer including Si transistors and the layer including OS transistors are stacked, schematically illustrating the arrangement of the components illustrated in FIG. 18A. In FIG. 18B, the layer SIL including Si transistors and the layer OSL including OS transistors are provided to be stacked in the z direction. In the layer OSL including OS transistors, a plurality of layers including OS transistors can be provided to be stacked; a layer OS1 and a layer OS2 are illustrated as an example. The layer OS2 is illustrated as consisting of a plurality of layers stacked. Note that a wiring layer or the like can be provided between the layers including transistors as appropriate.

In the schematic cross-sectional diagram illustrated in FIG. 18B, the arithmetic portion 104 and the scan flip-flop 120 included in the semiconductor device 100 and the driver circuit 172 included in the memory device 171 can be provided in the layer SIL. In the layer OS1 provided over the layer SIL, the device memory 251, the shared memory 252, and the arithmetic portion 253 included in the product-sum operation device 300 and the data retention circuit 130 included in the semiconductor device 100 can be provided. Furthermore, the memory cell array MCA can be provided in the layer OS2 provided over the layer OS1. Since the memory cells MC included in the memory cell array MCA can be provided in a plurality of stacked layers, the density of memory cells MC placed per unit area can be increased.

As illustrated in FIG. 18B, each circuit included in the product-sum operation device 300 and each circuit included in the memory device 171 can be stacked over the layer SIL where a SiCMOS circuit can be provided. By the structure of placing the circuits in an integrated manner in the three-dimensional direction as illustrated in FIG. 18B, parasitic capacitance can be reduced as compared with a stacked-layer structure using a through silicon via (TSV), for example. Power consumption needed for charging and discharging wirings can be reduced. Consequently, the arithmetic processing efficiency can be improved.

Figure 19A:
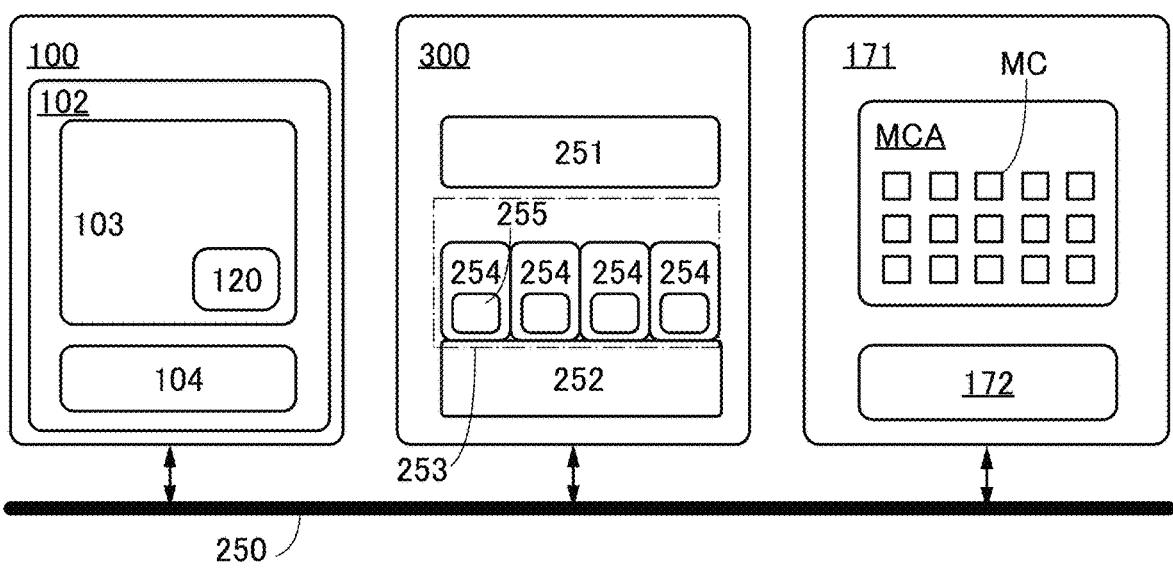
FIG. 19A and FIG. 19B are diagrams illustrating a structure example of a semiconductor device.

Although FIG. 18A and FIG. 18B each illustrate the structure in which the register portion 103 includes the data retention circuit 130, the data retention circuit 130 may be omitted. A structure example of a block diagram in that case is illustrated in FIG. 19A. Note that the description for FIG. 18A applies to each component.

Figure 19B:
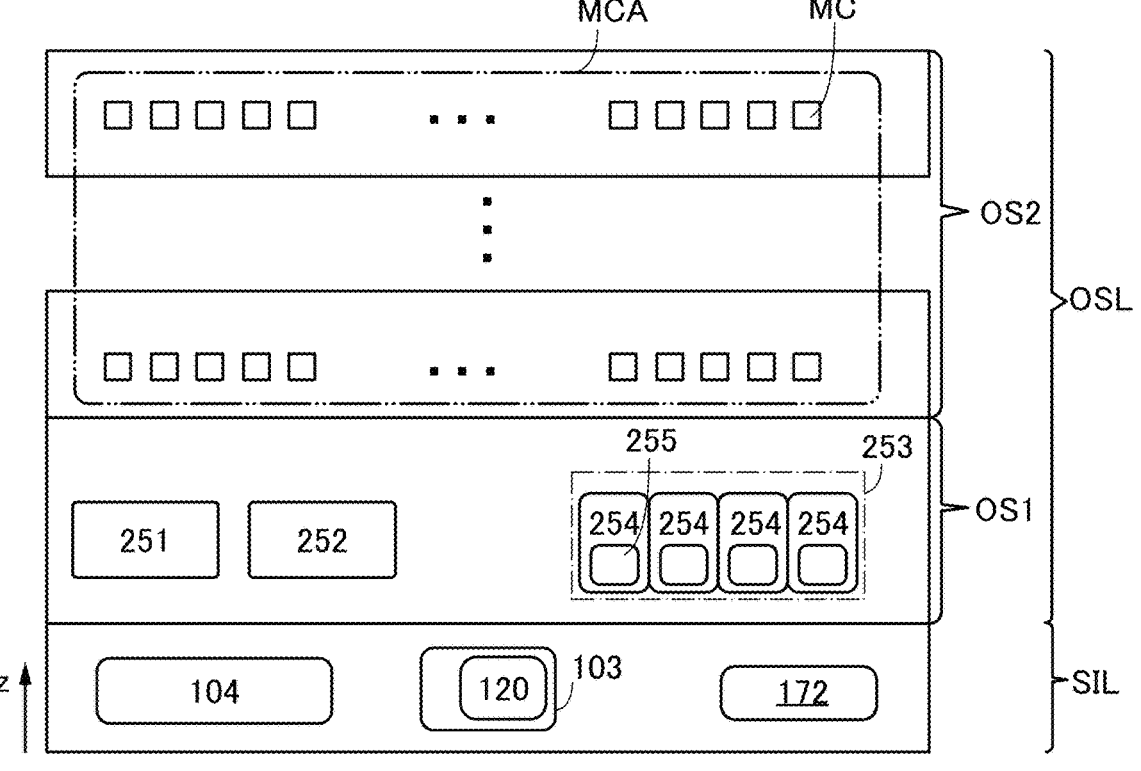

FIG. 19B is a schematic cross-sectional diagram corresponding to the block diagram in FIG. 19A. By the structure of placing the circuits in an integrated manner in the three-dimensional direction as illustrated in FIG. 19B, parasitic capacitance can be reduced as compared with a stacked-layer structure using a through silicon via, for example. Power consumption needed for charging and discharging wirings can be reduced. Consequently, the arithmetic processing efficiency can be improved.

Figure 20A:
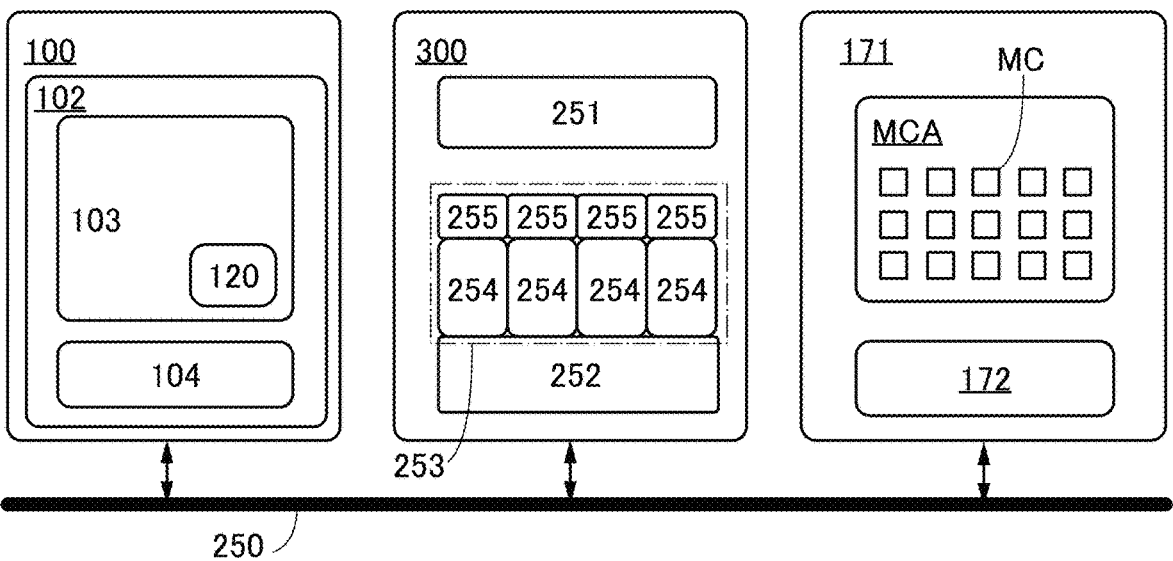
FIG. 20A and FIG. 20B are diagrams illustrating a structure example of a semiconductor device.

Although FIG. 18A and FIG. 18B illustrate the structure where the arithmetic units 254 and the data retention portions 255 included in the arithmetic portion 253 are provided in the layer OS1 including OS transistors, the arithmetic units 254 may be provided in the layer including Si transistors. A structure example of a block diagram in that case is illustrated in FIG. 20A. Note that the description for FIG. 18A applies to each component.

Figure 20B:
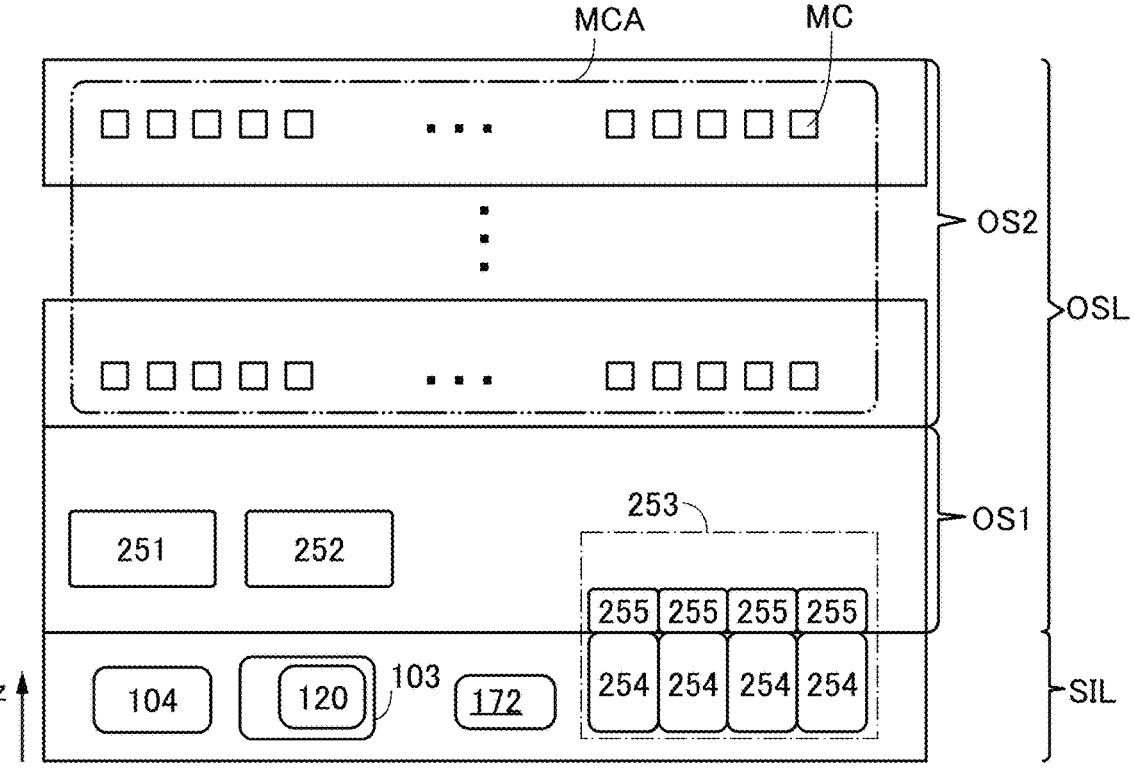

FIG. 20B is a schematic cross-sectional diagram corresponding to the block diagram in FIG. 20A. By the structure of placing the circuits in an integrated manner in the three-dimensional direction as illustrated in FIG. 20B, parasitic capacitance can be reduced as compared with a stacked-layer structure using a through silicon via, for example. Power consumption needed for charging and discharging wirings can be reduced. Consequently, the arithmetic processing efficiency can be improved.

Figures 21A, 21B, 21C:
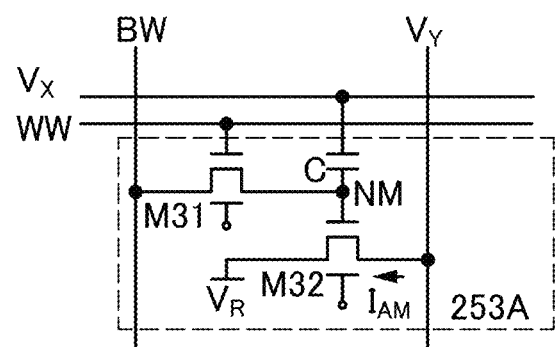
FIG. 21A to FIG. 21C are diagrams illustrating a structure example of a semiconductor device.

In the case where the arithmetic portion 253 includes the arithmetic units 254 and the data retention portion 255 in the layer OS1 including OS transistors as described with reference to FIG. 18A and FIG. 18B, the arithmetic portion 253 preferably has a structure in which the arithmetic units 254 and the data retention portion 255 integrate with each other. For example, an arithmetic portion 253A illustrated in FIG. 21A is an example of a circuit having a function of a data retention portion and an arithmetic unit. The arithmetic portion 253A illustrated in FIG. 21A is a circuit performing a product-sum operation of first data and second data.

The arithmetic portion 253A includes a transistor M31, a transistor M32, and a capacitor C. Note that the transistors M31 and M32 are OS transistors. The use of an OS transistor as the transistor M31 can suppress a leakage current of the transistor M31. Therefore, data necessary for the calculation can be retained for a long time in a node NM as electric charges, so that a product-sum operation circuit with high calculation accuracy can be obtained. The elements connected to the node NM can make the node NM function as the data retention portion 255. The use of an OS transistor also as the transistor M32 allows the transistor M32 to be formed concurrently with the transistor M31, thereby reducing the number of manufacturing steps of the product-sum operation circuit.

In the arithmetic portion 253A, a first terminal of the transistor M31 is electrically connected to a gate of the transistor M32. A first terminal of the transistor M32 is electrically connected to a wiring $V_R$. A first terminal of the capacitor C is electrically connected to the gate of the transistor M32.

In the arithmetic portion 253A, a second terminal of the transistor M31 is electrically connected to a wiring BW, and a gate of the transistor M31 is electrically connected to a wiring WW. A second terminal of the transistor M32 is electrically connected to a wiring $V_Y$, and a second terminal of the capacitor C is electrically connected to a wiring $V_X$. Note that in FIG. 21A, a current flowing from the wiring $V_Y$ to the second terminal of the transistor M32 is referred to as $I_{AM}$.

In the arithmetic portion 253A, electric charges corresponding to data is retained in the node NM and a potential of the wiring $V_X$ is changed, whereby the potential of the gate of the transistor M32 in an electrically floating state can be changed, so that the multiplication result of the currents $I_{AM}$ flowing through the transistor M32 can be obtained. By adding the currents $I_{AM}$ flowing through the plurality of arithmetic portions 253A, the product-sum operation for the sum of the multiplication results can be executed.

In the case where the arithmetic units 254 and the data retention portions 255 are different circuits as described with reference to FIG. 20A and FIG. 20B, a structure in which the data retention portions 255 are provided in the layer OS1 including OS transistors and the arithmetic units 254 are provided in the layer SIL including Si transistors is preferable. For example, an arithmetic portion 253B illustrated in FIG. 21B is an example of a circuit having a function of a data retention portion and an arithmetic unit. The arithmetic portion 253B illustrated in FIG. 21B includes the data retention portion 255 provided in the layer OS1 and the arithmetic units 254 provided in the layer SIL.

A memory cell including an OS transistor, such as a NOSRAM, can be used as the data retention portion 255. The circuit structure of the data retention circuit 255 illustrated in FIG. 21B corresponds to a NOSRAM of a 3-transistor (3T) gain cell. The NOSRAM can be used as a nonvolatile memory by retaining electric charges corresponding to data in the memory cell, using characteristics of an extremely low leakage current.

The arithmetic unit 254 includes a readout circuit 41 supplied with a signal of the wiring RBL, a bit product-sum operation unit 42, an accumulator 43, a latch circuit 44, and an encoding circuit 45 for outputting an output signal Q.

Each circuit included in the arithmetic unit 254 includes a Si transistor and can be provided in the layer SIL. The memory cell included in the data retention portion 255 includes OS transistors and can be provided in the layer OS1. Thus, as illustrated in FIG. 21C, in the structure in which the layer SIL and the layer OS1 are provided to be stacked, regions where the circuits are provided are placed to overlap with each other. The wiring RBL that connects the arithmetic unit 254 and the data retention portion 255 is provided in a direction (the z direction) perpendicular to the surface of the layer SIL. The wiring RWL is a wiring that can be provided in an opening portion provided in an insulating layer, and microfabrication of the wiring RWL is possible. Therefore, the wiring RWL can cause smaller parasitic capacitance than a wiring or the like using a through silicon via or the like. As a result, electric power required for charging and discharging of the wiring can be reduced and power can be saved.

The circuit area can be reduced by the circuit structure specialized for the product-sum operation illustrated in FIG. 21B and FIG. 21C. Thus, power consumption can be reduced owing to a reduction in circuit area.

This embodiment can be implemented in combination with the other embodiments described in this specification as appropriate.

Embodiment 5

In this embodiment, structures of transistors that can be used in the semiconductor device described in the above embodiments will be described. For example, a structure in which transistors having different electrical characteristics are provided to be stacked will be described. With the structure, the flexibility in design of the semiconductor device can be increased. When transistors having different electrical characteristics are provided to be stacked, the integration degree of the semiconductor device can be increased.

Figure 22:
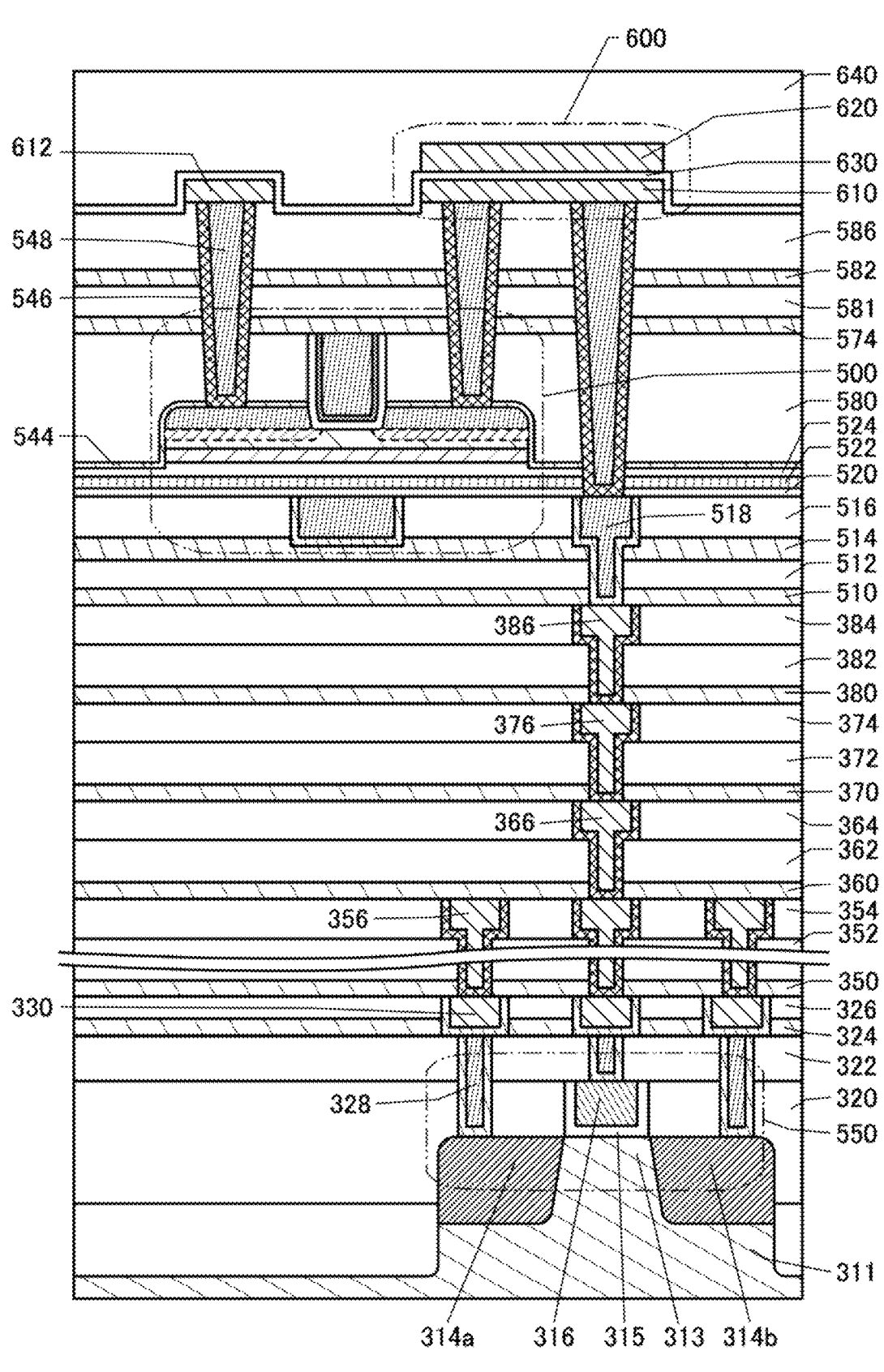
FIG. 22 is a diagram illustrating a structure example of a semiconductor device.

FIG. 22 illustrates part of a cross-sectional structure of a semiconductor device. The semiconductor device illustrated in FIG. 22 includes a transistor 550, a transistor 500, and a capacitor 600. FIG. 23A is a cross-sectional view of the transistor 500 in the channel length direction, FIG. 23B is a cross-sectional view of the transistor 500 in the channel width direction, and FIG. 23C is a cross-sectional view of the transistor 550 in the channel width direction. For example, the transistor 500 corresponds to the OS transistor described in the above embodiment and the transistor 550 corresponds to the Si transistor.

In FIG. 22, the transistor 500 is provided above the transistor 550, and the capacitor 600 is provided above the transistor 550 and the transistor 500.

The transistor 550 is provided in and on a substrate 311 and includes a conductor 316, an insulator 315, a semiconductor region 313 that is part of the substrate 311, and a low-resistance region 314a and a low-resistance region 314b functioning as a source region and a drain region.

As illustrated in FIG. 23C, the top surface and the side surface in the channel width direction of the semiconductor region 313 of the transistor 550 are covered with the conductor 316 with the insulator 315 positioned therebetween. Such a Fin-type transistor 550 can have an increased effective channel width and thus have improved on-state characteristics. In addition, contribution of the electric field of the gate electrode can be increased, so that the off-state characteristics of the transistor 550 can be improved.

Note that the transistor 550 may be either a p-channel transistor or an n-channel transistor.

It is preferable that a region of the semiconductor region 313 where a channel is formed, a region in the vicinity thereof, the low-resistance regions 314a and 314b functioning as the source and drain regions, and the like contain a semiconductor such as a silicon-based semiconductor, further preferably single crystal silicon. Alternatively, a material containing Ge (germanium), SiGe (silicon germanium), GaAs (gallium arsenide), GaAlAs (gallium aluminum arsenide), or the like may be contained. Silicon whose effective mass is adjusted by applying stress to the crystal lattice and thereby changing the lattice spacing may be contained. Alternatively, the transistor 550 may be a high electron mobility transistor (HEMT) with GaAs and GaAlAs, or the like.

The low-resistance regions 314a and 314b contain an element that imparts n-type conductivity, such as arsenic or phosphorus, or an element that imparts p-type conductivity, such as boron, in addition to a semiconductor material used for the semiconductor region 313.

The conductor 316 functioning as a gate electrode can be formed using a semiconductor material such as silicon containing the element that imparts n-type conductivity, such as arsenic or phosphorus, or the element that imparts p-type conductivity, such as boron, or a conductive material such as a metal material, an alloy material, or a metal oxide material.

Note that a material used for a conductor determines the work function; thus, selecting the material of the conductor can adjust the threshold voltage of a transistor. Specifically, titanium nitride, tantalum nitride, or the like is preferably used for the conductor. Furthermore, in order to ensure the conductivity and embeddability, a stacked layer of metal materials such as tungsten and aluminum is preferably used for the conductor. In particular, tungsten is preferably used in terms of heat resistance.

The transistor 550 may be formed using a SOI (Silicon on Insulator) substrate or the like.

As the SOI substrate, any of the following substrates may be used: a SIMOX (Separation by Implanted Oxygen) substrate formed in such a manner that an oxygen ion is implanted into a mirror-polished wafer, and then, an oxide layer is formed at a certain depth from the surface and defects generated in a surface layer are eliminated by high-temperature annealing, and an SOI substrate formed by a Smart-Cut method in which a semiconductor substrate is cleaved by utilizing growth of a minute void, which is formed by implantation of a hydrogen ion, by heat treatment; an ELTRAN method (registered trademark: Epitaxial Layer Transfer); or the like. A transistor formed using a single crystal substrate contains a single crystal semiconductor in a channel formation region.

An insulator 320, an insulator 322, an insulator 324, and an insulator 326 are provided to be stacked sequentially to cover the transistor 550.

The insulator 320, the insulator 322, the insulator 324, and the insulator 326 are formed using, for example, silicon oxide, silicon oxynitride, silicon nitride oxide, silicon nitride, aluminum oxide, aluminum oxynitride, aluminum nitride oxide, or aluminum nitride.

Note that in this specification, silicon oxynitride refers to a material that has a higher oxygen content than a nitrogen content, and silicon nitride oxide refers to a material that has a higher nitrogen content than an oxygen content. Moreover, in this specification, aluminum oxynitride refers to a material that has a higher oxygen content than a nitrogen content, and aluminum nitride oxide refers to a material that has a higher nitrogen content than an oxygen content.

The insulator 322 may function as a planarization film for eliminating a level difference caused by the transistor 550 or the like underlying the insulator 322. For example, the top surface of the insulator 322 may be planarized by planarization treatment using a chemical mechanical polishing (CMP) method or the like to increase the level of planarity.

The insulator 324 is preferably formed using a film having a barrier property that prevents hydrogen, impurities, or the like from diffusing from the substrate 311, the transistor 550, or the like into a region where the transistor 500 is provided.

For the film having a barrier property against hydrogen, for example, silicon nitride deposited by a CVD method can be used. Here, diffusion of hydrogen into a semiconductor element including an oxide semiconductor, such as the transistor 500, degrades the characteristics of the semiconductor element in some cases. Therefore, a film that inhibits hydrogen diffusion is preferably provided between the transistor 500 and the transistor 550. Specifically, the film that inhibits hydrogen diffusion is a film from which a small amount of hydrogen is released.

The amount of released hydrogen can be measured by thermal desorption spectroscopy (TDS), for example. The amount of hydrogen released from the insulator 324 that is converted into hydrogen atoms per unit area of the insulator 324 is less than or equal to $1 \times 10^{16}$ atoms/cm$^2$, preferably less than or equal to $5 \times 10^{15}$ atoms/cm$^2$ in TDS analysis in a film-surface temperature range of 50° C. to 500° C., for example.

Note that the dielectric constant of the insulator 326 is preferably lower than that of the insulator 324. For example, the dielectric constant of the insulator 326 is preferably lower than 4, further preferably lower than 3. For example, the dielectric constant of the insulator 326 is preferably less than or qual to 0.7 times that of the insulator 324, further preferably less than or qual to 0.6 times that of the insulator 324. In the case where a material with a low dielectric constant is used for an interlayer film, the parasitic capacitance between wirings can be reduced.

A conductor 328, a conductor 330, and the like that are connected to the capacitor 600 or the transistor 500 are embedded in the insulators 320, 322, 324, and 326. Note that the conductor 328 and the conductor 330 each function as a plug or a wiring. A plurality of conductors functioning as plugs or wirings are collectively denoted by the same reference numeral in some cases. In this specification and the like, a wiring and a plug connected to the wiring may be a single component. That is, part of a conductor functions as a wiring in some cases, and part of a conductor functions as a plug in other cases.

As a material for each of the plugs and wirings (e.g., the conductor 328 and the conductor 330), a conductive material such as a metal material, an alloy material, a metal nitride material, or a metal oxide material can be used in a single-layer structure or a stacked-layer structure. It is preferable to use a high-melting-point material that has both heat resistance and conductivity, such as tungsten or molybdenum, and it is particularly preferable to use tungsten. Alternatively, a low-resistance conductive material such as aluminum or copper is preferably used. The use of a low-resistance conductive material can reduce wiring resistance.

A wiring layer may be provided over the insulator 326 and the conductor 330. For example, an insulator 350, an insulator 352, and an insulator 354 are stacked sequentially in FIG. 22. Furthermore, a conductor 356 is formed in the insulator 350, the insulator 352, and the insulator 354. The conductor 356 has a function of a plug or a wiring that is connected to the transistor 550. Note that the conductor 356 can be formed using a material similar to that for the conductor 328 and the conductor 330.

Note that for example, the insulator 350 is preferably formed using an insulator having a barrier property against hydrogen, like the insulator 324. Furthermore, the conductor 356 preferably includes a conductor having a barrier property against hydrogen. The conductor having a barrier property against hydrogen is formed particularly in an opening portion of the insulator 350 having a barrier property against hydrogen. In such a structure, the transistor 550 and the transistor 500 can be separated by a barrier layer, so that the hydrogen diffusion from the transistor 550 into the transistor 500 can be inhibited.

Note that as the conductor having a barrier property against hydrogen, tantalum nitride is preferably used, for example. By stacking tantalum nitride and tungsten, which has high conductivity, hydrogen diffusion from the transistor 550 can be inhibited while the conductivity of a wiring is ensured. In that case, a tantalum nitride layer having a barrier property against hydrogen is preferably in contact with the insulator 350 having a barrier property against hydrogen.

A wiring layer may be provided over the insulator 354 and the conductor 356. For example, an insulator 360, an insulator 362, and an insulator 364 are stacked sequentially in FIG. 22. Furthermore, a conductor 366 is formed in the insulator 360, the insulator 362, and the insulator 364. The conductor 366 functions as a plug or a wiring. Note that the conductor 366 can be formed using a material similar to that for the conductor 328 and the conductor 330.

Note that for example, the insulator 360 is preferably formed using an insulator having a barrier property against hydrogen, like the insulator 324. Furthermore, the conductor 366 preferably includes a conductor having a barrier property against hydrogen. The conductor having a barrier property against hydrogen is formed particularly in an opening portion of the insulator 360 having a barrier property against hydrogen. In such a structure, the transistor 550 and the transistor 500 can be separated by a barrier layer, so that the hydrogen diffusion from the transistor 550 into the transistor 500 can be inhibited.

A wiring layer may be provided over the insulator 364 and the conductor 366. For example, an insulator 370, an insulator 372, and an insulator 374 are stacked sequentially in FIG. 22. Furthermore, a conductor 376 is formed in the insulator 370, the insulator 372, and the insulator 374. The conductor 376 functions as a plug or a wiring. Note that the conductor 376 can be formed using a material similar to that for the conductor 328 and the conductor 330.

Note that for example, the insulator 370 is preferably formed using an insulator having a barrier property against hydrogen, like the insulator 324. Furthermore, the conductor 376 preferably includes a conductor having a barrier property against hydrogen. The conductor having a barrier property against hydrogen is formed particularly in an opening portion of the insulator 370 having a barrier property against hydrogen. In such a structure, the transistor 550 and the transistor 500 can be separated by a barrier layer, so that the hydrogen diffusion from the transistor 550 into the transistor 500 can be inhibited.

A wiring layer may be provided over the insulator 374 and the conductor 376. For example, an insulator 380, an insulator 382, and an insulator 384 are stacked sequentially in FIG. 22. Furthermore, a conductor 386 is formed in the insulator 380, the insulator 382, and the insulator 384. The conductor 386 functions as a plug or a wiring. Note that the conductor 386 can be formed using a material similar to that for the conductor 328 and the conductor 330.

Note that for example, the insulator 380 is preferably formed using an insulator having a barrier property against hydrogen, like the insulator 324. Furthermore, the conductor 386 preferably includes a conductor having a barrier property against hydrogen. The conductor having a barrier property against hydrogen is formed particularly in an opening portion of the insulator 380 having a barrier property against hydrogen. In such a structure, the transistor 550 and the transistor 500 can be separated by a barrier layer, so that the hydrogen diffusion from the transistor 550 into the transistor 500 can be inhibited.

Although the wiring layer including the conductor 356, the wiring layer including the conductor 366, the wiring layer including the conductor 376, and the wiring layer including the conductor 386 are described above, the semiconductor device of this embodiment is not limited thereto. The number of wiring layers similar to the wiring layer including the conductor 356 may be three or less, or five or more.

An insulator 510, an insulator 512, an insulator 514, and an insulator 516 are stacked sequentially over the insulator 384. A material having a barrier property against oxygen, hydrogen, or the like is preferably used for any of the insulator 510, the insulator 512, the insulator 514, and the insulator 516.

For example, each of the insulator 510 and the insulator 514 is preferably formed using a film having a barrier property which prevents hydrogen, impurities, or the like from diffusing from the substrate 311, a region where the transistor 550 is provided, or the like into a region where the transistor 500 is provided. Therefore, each of the insulator 510 and the insulator 514 can be formed using a material similar to that for the insulator 324.

For the film having a barrier property against hydrogen, for example, silicon nitride deposited by a CVD method can be used. Here, diffusion of hydrogen into a semiconductor element including an oxide semiconductor, such as the transistor 500, degrades the characteristics of the semiconductor element in some cases. Therefore, a film that inhibits hydrogen diffusion is preferably provided between the transistor 500 and the transistor 550. Specifically, the film that inhibits hydrogen diffusion is a film from which a small amount of hydrogen is released.

For the film having a barrier property against hydrogen used for each of the insulator 510 and the insulator 514, for example, a metal oxide such as aluminum oxide, hafnium oxide, or tantalum oxide is preferably used.

In particular, aluminum oxide has an excellent blocking effect that prevents permeation of both oxygen and impurities such as hydrogen and moisture that cause a change in electrical characteristics of the transistor. Accordingly, the use of aluminum oxide can prevent entry of impurities such as hydrogen and moisture into the transistor 500 during and after a manufacturing process of the transistor. In addition, release of oxygen from the oxide contained in the transistor 500 can be prevented. Therefore, aluminum oxide is suitably used for a protective film of the transistor 500.

The insulator 512 and the insulator 516 can be formed using a material similar to that for the insulator 320, for example. In the case where a material with a relatively low dielectric constant is used for these insulators, the parasitic capacitance between wirings can be reduced. A silicon oxide film, a silicon oxynitride film, or the like can be used for the insulator 512 and the insulator 516, for example.

A conductor 518, a conductor included in the transistor 500 (e.g., a conductor 503), and the like are embedded in the insulator 510, the insulator 512, the insulator 514, and the insulator 516. Note that the conductor 518 functions as a plug or a wiring that is connected to the capacitor 600 or the transistor 550. The conductor 518 can be formed using a material similar to that for the conductor 328 and the conductor 330.

In particular, the conductor 518 in a region in contact with the insulator 510 and the insulator 514 is preferably a conductor having a barrier property against oxygen, hydrogen, and water. In such a structure, the transistor 550 and the transistor 500 can be separated by a layer having a barrier property against oxygen, hydrogen, and water, so that the hydrogen diffusion from the transistor 550 into the transistor 500 can be inhibited.

The transistor 500 is provided over the insulator 516.

As illustrated in FIGS. 23A and 23B, the transistor 500 includes the conductor 503 placed so as to be embedded in the insulator 514 and the insulator 516, an insulator 520 placed over the insulator 516 and the conductor 503, an insulator 522 placed over the insulator 520, an insulator 524 placed over the insulator 522, an oxide 530a placed over the insulator 524, an oxide 530b placed over the oxide 530a, a conductor 542a and a conductor 542b placed apart from each other over the oxide 530b, an insulator 580 that is placed over the conductor 542a and the conductor 542b and has an opening overlapping with an area between the conductor 542a and the conductor 542b, an insulator 545 placed on a bottom surface and a side surface of the opening, and a conductor 560 that is placed on a formation surface of the insulator 545.

As illustrated in FIGS. 23A and 23B, an insulator 544 is preferably placed between the insulator 580 and the oxide 530a, the oxide 530b, the conductor 542a, and the conductor 542b. In addition, as illustrated in FIGS. 23A and 23B, the conductor 560 preferably includes a conductor 560a provided inside the insulator 545 and a conductor 560b provided to be embedded inside the conductor 560a. Moreover, as illustrated in FIGS. 23A and 23B, an insulator 574 is preferably placed over the insulator 580, the conductor 560, and the insulator 545.

In this specification and the like, the oxide 530a and the oxide 530b may be collectively referred to as an oxide 530.

The transistor 500 has, in the region where the channel is formed and its vicinity, a structure in which the oxide 530a and the oxide 530b are stacked; however, the present invention is not limited thereto. For example, a single layer of the oxide 530b or a stacked-layer structure of three or more layers may be provided.

Although the conductor 560 has a two-layer structure in the transistor 500, the present invention is not limited thereto. For example, the conductor 560 may have a single-layer structure or a stacked-layer structure of three or more layers. The transistor 500 illustrated in FIG. 22 and FIG. 23A is just an example and is not limited to the structure illustrated therein, and an appropriate transistor can be used in accordance with a circuit structure, a driving method, or the like.

Here, the conductor 560 functions as a gate electrode of the transistor, and the conductor 542a and the conductor 542b function as a source electrode and a drain electrode. As described above, the conductor 560 is embedded in the opening of the insulator 580 and the region sandwiched between the conductor 542a and the conductor 542b. The positions of the conductor 560, the conductor 542a, and the conductor 542b with respect to the opening of the insulator 580 are selected in a self-aligned manner. That is, in the transistor 500, the gate electrode can be positioned between the source electrode and the drain electrode in a self-aligned manner. Therefore, the conductor 560 can be formed without an alignment margin, resulting in a reduction in the footprint of the transistor 500. Accordingly, miniaturization and high integration of the semiconductor device can be achieved.

In addition, since the conductor 560 is formed in the region between the conductor 542a and the conductor 542b in a self-aligned manner, the conductor 560 has neither a region overlapping with the conductor 542a nor a region overlapping with the conductor 542b. Thus, parasitic capacitance between the conductor 560 and the conductors 542a and 542b can be reduced. As a result, the transistor 500 can have increased switching speed and excellent frequency characteristics.

The conductor 560 functions as a first gate (also referred to as a top gate) electrode in some cases. The conductor 503 functions as a second gate (also referred to as a bottom gate) electrode in some cases. In that case, by changing a potential applied to the conductor 503 independently of a potential applied to the conductor 560, the threshold voltage of the transistor 500 can be controlled. In particular, when a negative potential is applied to the conductor 503, the threshold voltage of the transistor 500 can be increased to higher than 0 V, and the off-state current can be reduced. Thus, a drain current when a potential applied to the conductor 560 is 0 V can be smaller in the case where a negative potential is applied to the conductor 503 than in the case where the negative potential is not applied to the conductor 503.

The conductor 503 is placed to overlap with the oxide 530 and the conductor 560. Accordingly, in the case where potentials are applied to the conductor 560 and the conductor 503, an electric field generated from the conductor 560 and an electric field generated from the conductor 503 are connected, thereby covering the channel formation region in the oxide 530.

In this specification and the like, a transistor structure in which a channel formation region is electrically surrounded by the electric field of a first gate electrode is referred to as a surrounded channel (S-channel) structure. The S-channel structure disclosed in this specification and the like is different from a Fin structure or a planar structure. The S-channel structure disclosed in this specification and the like can be regarded as a kind of the Fin structure. In this specification and the like, the Fin structure refers to a structure in which at least two surfaces (specifically, two surface, three surfaces, four surfaces, or the like) of a channel are covered with a gate electrode. With the use of the Fin structure or the S-channel structure, a transistor with high resistance to a short-channel effect, i.e., a transistor in which a short-channel effect is unlikely to occur, can be obtained.

When the transistor has the above-described S-channel structure, the channel formation region can be electrically surrounded. Since the S-channel structure is a structure with the electrically surrounded channel formation region, the S-channel structure is, in a sense, equivalent to a GAA (Gate All Around) structure or a LGAA (Lateral Gate All Around) structure. In the transistor having any of the S-channel structure, GAA structure, and LGAA structure, the channel formation region that is formed at the interface between the oxide 530 and the gate insulator or in the vicinity of the interface can spread throughout the entire bulk of the oxide 530. Consequently, the density of current flowing through the transistor can be improved, so that the on-state current or the field-effect mobility of the transistor can be expected to increase.

The conductor 503 has a structure similar to that of the conductor 518; a conductor 503a is formed in contact with an inner wall of the opening in the insulator 514 and the insulator 516, and a conductor 503b is formed on the inner side. Although the transistor 500 having a structure in which the conductor 503a and the conductor 503b are stacked is described, the present invention is not limited thereto. For example, the conductor 503 may have a single-layer structure or a stacked-layer structure of three or more layers.

The conductor 503a is preferably formed using a conductive material having a function of inhibiting diffusion of impurities such as a hydrogen atom, a hydrogen molecule, a water molecule, and a copper atom (a conductive material through which the above impurities are less likely to pass). Alternatively, the conductor 503a is preferably formed using a conductive material having a function of inhibiting diffusion of oxygen (e.g., at least one of oxygen atoms, oxygen molecules, and the like) (a conductive material through which the above oxygen is less likely to pass). Note that in this specification, a function of inhibiting diffusion of impurities or oxygen means a function of inhibiting diffusion of any one or all of the above impurities and the above oxygen.

For example, when the conductor 503a has a function of inhibiting diffusion of oxygen, the conductivity of the conductor 503b can be prevented from being lowered because of oxidation.

In the case where the conductor 503 also functions as a wiring, the conductor 503b is preferably formed using a conductive material with high conductivity that contains tungsten, copper, or aluminum as its main component. Although the conductor 503 has a stacked layer of the conductor 503a and the conductor 503b in this embodiment, the conductor 503 may have a single-layer structure.

The insulator 520, the insulator 522, and the insulator 524 function as a second gate insulating film.

Here, an insulator containing oxygen more than that in the stoichiometric composition is preferably used as the insulator 524 in contact with the oxide 530. Such oxygen is easily released from the film by heating. In this specification and the like, oxygen released by heating is sometimes referred to as excess oxygen. That is, a region containing excess oxygen (also referred to as an "excess-oxygen region") is preferably formed in the insulator 524. When such an insulator containing excess oxygen is provided in contact with the oxide 530, oxygen vacancies (also referred to as Vo) in the oxide 530 can be reduced, leading to an improvement in reliability of the transistor 500. When hydrogen enters the oxygen vacancies in the oxide 530, such defects (hereinafter, referred to as VoH in some cases) serve as donors and generate electrons serving as carriers in some cases. In other cases, bonding of part of hydrogen to oxygen bonded to a metal atom generates electrons serving as carriers. Thus, a transistor including an oxide semiconductor that contains a large amount of hydrogen is likely to have normally-on characteristics. Moreover, hydrogen in an oxide semiconductor is easily transferred by a stress such as heat or an electric field; thus, a large amount of hydrogen in an oxide semiconductor might reduce the reliability of a transistor. In one embodiment of the present invention, VoH in the oxide 530 is preferably reduced as much as possible so that the oxide 530 becomes a highly purified intrinsic or substantially highly purified intrinsic oxide. In order to obtain such an oxide semiconductor with sufficiently reduced VoH, it is important to remove impurities such as moisture and hydrogen in the oxide semiconductor (this treatment is also referred to as "dehydration" or "dehydrogenation treatment") and supply oxygen to the oxide semiconductor to fill oxygen vacancies (this treatment is also referred to as "oxygen adding treatment"). When an oxide semiconductor with sufficiently reduced impurities such as VoH is used for a channel formation region of a transistor, the transistor can have stable electrical characteristics.

As the insulator including the excess-oxygen region, specifically, an oxide material that releases part of oxygen by heating is preferably used. An oxide that releases oxygen by heating is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in TDS (Thermal Desorption Spectroscopy) analysis. In the TDS analysis, the film-surface temperature is preferably higher than or equal to 100° C. and lower than or equal to 700° C., or higher than or equal to 100° C. and lower than or equal to 400° C.

One or more of heat treatment, microwave treatment, and RF treatment may be performed in a state in which the insulator including the excess-oxygen region and the oxide 530 are in contact with each other. By the treatment, water or hydrogen in the oxide 530 can be removed. For example, in the oxide 530, dehydrogenation can be performed when a reaction in which a bond of VoH is cut occurs, i.e., a reaction of "VoH→Vo+H" occurs. Part of hydrogen generated at this time is bonded to oxygen to be H$_2$O, and removed from the oxide 530 or an insulator near the oxide 530 in some cases. In other cases, part of hydrogen is gettered by the conductor 542.

For the microwave treatment, for example, an apparatus including a power supply that generates high-density plasma or an apparatus including a power supply that applies RF to the substrate side is suitably used. For example, the use of an oxygen-containing gas and high-density plasma enables high-density oxygen radicals to be generated, and application of the RF to the substrate side allows the oxygen radicals generated by the high-density plasma to be efficiently introduced into the oxide 530 or an insulator in the vicinity of the oxide 530. The microwave treatment is performed under a pressure of 133 Pa or higher, preferably 200 Pa or higher, further preferably 400 Pa or higher. As a gas introduced into an apparatus for performing the microwave treatment, for example, oxygen and argon are used and the oxygen flow rate ratio ($O_2/(O_2+Ar)$) is lower than or equal to 50%, preferably higher than or equal to 10% and lower than or equal to 30%.

In a manufacturing process of the transistor 500, the heat treatment is preferably performed with the surface of the oxide 530 exposed. For example, the heat treatment is performed at a temperature higher than or equal to 100° C. and lower than or equal to 450° C., preferably higher than or equal to 350° C. and lower than or equal to 400° C. The heat treatment is performed in a nitrogen gas atmosphere, an inert gas atmosphere, or an atmosphere containing an oxidizing gas at 10 ppm or more, 1% or more, or 10% or more. For example, the heat treatment is preferably performed in an oxygen atmosphere. Accordingly, oxygen can be supplied to the oxide 530 to reduce oxygen vacancies (Vo). The heat treatment may be performed under a reduced pressure. Alternatively, the heat treatment may be performed in such a manner that heat treatment is performed in a nitrogen gas atmosphere or an inert gas atmosphere, and then another heat treatment is performed in an atmosphere containing an oxidizing gas at 10 ppm or more, 1% or more, or 10% or more in order to compensate for released oxygen. Alternatively, the heat treatment may be performed in such a manner that heat treatment is performed in an atmosphere containing an oxidizing gas at 10 ppm or more, 1% or more, or 10% or more, and then another heat treatment is successively performed in a nitrogen gas atmosphere or an inert gas atmosphere.

Note that the oxygen adding treatment performed on the oxide 530 can promote a reaction in which oxygen vacancies in the oxide 530 are filled with supplied oxygen, i.e., a reaction of "Vo+O→null". Furthermore, hydrogen remaining in the oxide 530 reacts with supplied oxygen, so that the hydrogen can be removed as $H_2O$ (dehydration). This can inhibit recombination of hydrogen remaining in the oxide 530 with oxygen vacancies and formation of VoH.

In the case where the insulator 524 includes an excess-oxygen region, the insulator 522 preferably has a function of inhibiting diffusion of oxygen (e.g., oxygen atoms and oxygen molecules) (it is preferable that oxygen be less likely to pass through the insulator 522).

The insulator 522 preferably has a function of inhibiting diffusion of oxygen, impurities, or the like, in which case diffusion of oxygen contained in the oxide 530 to the insulator 520 side is prevented. In addition, the conductor 503 can be inhibited from reacting with oxygen in the insulator 524, the oxide 530, or the like.

The insulator 522 preferably has a single-layer structure or a stacked-layer structure using an insulator containing what is called a high-k material such as aluminum oxide, hafnium oxide, an oxide containing aluminum and hafnium (hafnium aluminate), tantalum oxide, zirconium oxide, lead zirconate titanate (PZT), strontium titanate ($SrTiO_3$), or (Ba,Sr)$TiO_3$ (BST), for example. With miniaturization and high integration of a transistor, a problem such as generation of a leakage current sometimes arises because of a thin gate insulating film. When a high-k material is used for an insulator functioning as the gate insulating film, a gate potential at the time of operating the transistor can be reduced while the physical thickness of the gate insulating film is kept.

It is particularly preferable to use an insulator containing an oxide of one or both of aluminum and hafnium, which is an insulating material having a function of inhibiting diffusion of impurities, oxygen, and the like (an insulating material through which the above oxygen is less likely to pass). Aluminum oxide, hafnium oxide, an oxide containing aluminum and hafnium (hafnium aluminate), or the like is preferably used for the insulator containing an oxide of one or both of aluminum and hafnium. The insulator 522 formed of such a material functions as a layer that inhibits release of oxygen from the oxide 530 or entry of impurities such as hydrogen from the periphery of the transistor 500 into the oxide 530.

Alternatively, aluminum oxide, bismuth oxide, germanium oxide, niobium oxide, silicon oxide, titanium oxide, tungsten oxide, yttrium oxide, or zirconium oxide may be added to the insulator, for example. Alternatively, the insulator may be subjected to nitriding treatment. Silicon oxide, silicon oxynitride, or silicon nitride may be stacked over the insulator.

It is preferable that the insulator 520 be thermally stable. For example, silicon oxide and silicon oxynitride are preferred because of their thermal stability. Furthermore, combination of an insulator which is a high-k material and silicon oxide or silicon oxynitride enables the insulator 520 to have a stacked-layer structure that is thermally stable and has a high dielectric constant.

Note that the transistor 500 in FIGS. 23A and 23B includes the insulator 520, the insulator 522, and the insulator 524 as the second gate insulating film having a three-layer structure; however, the second gate insulating film may have a single-layer structure, a two-layer structure, or a stacked-layer structure of four or more layers. In that case, the stacked layers are not necessarily formed of the same material and may be formed of different materials.

In the transistor 500, a metal oxide functioning as an oxide semiconductor is used as the oxide 530 including a channel formation region. For example, as the oxide 530, a metal oxide such as an In-M-Zn oxide (M is one or more of aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is preferably used.

The metal oxide functioning as an oxide semiconductor may be formed by a sputtering method or an atomic layer deposition (ALD) method. Note that the metal oxide functioning as an oxide semiconductor will be described in detail in another embodiment.

The metal oxide functioning as the channel formation region in the oxide 530 has a band gap of 2 eV or more, preferably 2.5 eV or more. The use of a metal oxide having such a wide band gap can reduce the off-state current of a transistor.

When the oxide 530a is provided below the oxide 530b in the oxide 530, impurities can be inhibited from diffusing into the oxide 530b from the components formed below the oxide 530a.

The oxide 530 preferably has a structure including a plurality of oxide layers that differ in the atomic ratio of metal atoms. Specifically, the atomic ratio of the element M to constituent elements in the metal oxide used as the oxide 530$a$ is preferably greater than that in the metal oxide used as the oxide 530$b$. Moreover, the atomic ratio of the element M to In in the metal oxide used as the oxide 530$a$ is preferably greater than that in the metal oxide used as the oxide 530$b$. Moreover, the atomic ratio of In to the element M in the metal oxide used as the oxide 530$b$ is preferably greater than that in the metal oxide used as the oxide 530$a$.

The energy of the conduction band minimum of the oxide 530$a$ is preferably higher than that of the oxide 530$b$. In other words, the electron affinity of the oxide 530$a$ is preferably smaller than that of the oxide 530$b$.

Here, the energy level of the conduction band minimum is gradually varied at a junction portion of the oxide 530$a$ and the oxide 530$b$. In other words, the energy level of the conduction band minimum at a junction portion of the oxide 530$a$ and the oxide 530$b$ is continuously varied or continuously connected. To vary the energy level gradually, the density of defect states in a mixed layer formed at the interface between the oxide 530$a$ and the oxide 530$b$ is preferably made low.

Specifically, when the oxide 530$a$ and the oxide 530$b$ contain the same element (as a main component) in addition to oxygen, a mixed layer with a low density of defect states can be formed. For example, in the case where the oxide 530$b$ is an In—Ga—Zn oxide, it is preferable to use an In—Ga—Zn oxide, a Ga—Zn oxide, gallium oxide, or the like as the oxide 530$a$.

At this time, the oxide 530$b$ serves as a main carrier path. When the oxide 530$a$ has the above structure, the density of defect states at the interface between the oxide 530$a$ and the oxide 530$b$ can be made low. Thus, the influence of interface scattering on carrier conduction is small, and the transistor 500 can have a high on-state current.

The conductor 542$a$ and the conductor 542$b$ functioning as the source electrode and the drain electrode are provided over the oxide 530$b$. For the conductor 542$a$ and the conductor 542$b$, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements as its component; an alloy containing a combination of the above metal elements; or the like. For example, tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like is preferably used. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. Furthermore, a metal nitride film such as a tantalum nitride film is preferable because it has a barrier property against hydrogen or oxygen.

Although the conductor 542$a$ and the conductor 542$b$ have a single-layer structure in FIG. 23A, they may have a stacked-layer structure of two or more layers. For example, a tantalum nitride film and a tungsten film may be stacked. Alternatively, a titanium film and an aluminum film may be stacked. Other examples include a two-layer structure in which an aluminum film is stacked over a tungsten film, a two-layer structure in which a copper film is stacked over a copper-magnesium-aluminum alloy film, a two-layer structure in which a copper film is stacked over a titanium film, and a two-layer structure in which a copper film is stacked over a tungsten film.

Other examples include a three-layer structure in which a titanium film or a titanium nitride film and an aluminum film or a copper film are stacked so that the aluminum film or the copper film overlaps with the titanium film or the titanium nitride film and a titanium film or a titanium nitride film is further stacked thereover and a three-layer structure in which a molybdenum film or a molybdenum nitride film and an aluminum film or a copper film are stacked so that the aluminum film or the copper film overlaps with the molybdenum film or the molybdenum nitride film and a molybdenum film or a molybdenum nitride film is further stacked thereover. Note that a transparent conductive material containing indium oxide, tin oxide, or zinc oxide may be used.

As illustrated in FIG. 23A, a region 543$a$ and a region 543$b$ are sometimes formed as low-resistance regions at and near the interface between the oxide 530 and the conductor 542$a$ (the conductor 542$b$). In that case, the region 543$a$ functions as one of a source region and a drain region, and the region 543$b$ functions as the other of the source region and the drain region. A channel formation region is formed in a region sandwiched between the region 543$a$ and the region 543$b$.

When the conductor 542$a$ (the conductor 542$b$) is provided in contact with the oxide 530, the oxygen concentration in the region 543$a$ (the region 543$b$) sometimes decrease. In addition, a metal compound layer that contains the metal contained in the conductor 542$a$ (the conductor 542$b$) and the component of the oxide 530 is sometimes formed in the region 543$a$ (the region 543$b$). In such cases, the region 543$a$ (the region 543$b$) has increased carrier density to be a low-resistance region.

The insulator 544 is provided to cover the conductor 542$a$ and the conductor 542$b$ and inhibits oxidation of the conductor 542$a$ and the conductor 542$b$. Here, the insulator 544 may be provided to cover the side surface of the oxide 530 and to be in contact with the insulator 524.

A metal oxide containing one or two or more of hafnium, aluminum, gallium, yttrium, zirconium, tungsten, titanium, tantalum, nickel, germanium, neodymium, lanthanum, magnesium, and the like can be used as the insulator 544. For the insulator 544, silicon nitride oxide or silicon nitride can be used, for example.

It is particularly preferable to use, as the insulator 544, aluminum oxide, hafnium oxide, an oxide containing aluminum and hafnium (hafnium aluminate), or the like that is an insulator containing an oxide of one or both of aluminum and hafnium. In particular, hafnium aluminate has higher heat resistance than a hafnium oxide film and thus is less likely to be crystallized by heat treatment in a later step. Note that the insulator 544 is not necessarily provided when the conductor 542$a$ and the conductor 542$b$ are oxidation-resistant materials or materials that do not significantly lose the conductivity even after absorbing oxygen. Design is determined as appropriate in consideration of required transistor characteristics.

The insulator 544 can inhibit impurities such as water and hydrogen contained in the insulator 580 from diffusing into the oxide 530$b$. Moreover, the oxidation of the conductor 542 due to excess oxygen contained in the insulator 580 can be inhibited.

The insulator 545 functions as a first gate insulating film. The insulator 545 is preferably formed using an insulator which contains excess oxygen and from which oxygen is released by heating, like the insulator 524.

Specifically, any of silicon oxide, silicon oxynitride, silicon nitride oxide, silicon nitride, silicon oxide to which fluorine is added, silicon oxide to which carbon is added, silicon oxide to which carbon and nitrogen are added, and porous silicon oxide each containing excess oxygen can be used. In particular, silicon oxide and silicon oxynitride, which have thermal stability, are preferable.

When an insulator containing excess oxygen is provided as the insulator 545, oxygen can be effectively supplied from the insulator 545 to the channel formation region of the oxide 530b. As in the insulator 524, the concentration of impurities such as water and hydrogen in the insulator 545 is preferably lowered. The thickness of the insulator 545 is preferably greater than or equal to 1 nm and less than or equal to 20 nm.

Furthermore, in order that excess oxygen contained in the insulator 545 can be efficiently supplied to the oxide 530, a metal oxide may be provided between the insulator 545 and the conductor 560. The metal oxide preferably inhibits diffusion of oxygen from the insulator 545 into the conductor 560. Providing the metal oxide that inhibits diffusion of oxygen inhibits diffusion of excess oxygen from the insulator 545 into the conductor 560. That is, a reduction in the amount of excess oxygen supplied to the oxide 530 can be suppressed. Moreover, oxidization of the conductor 560 due to excess oxygen can be suppressed. The metal oxide is formed using a material that can be used for the insulator 544.

Note that the insulator 545 may have a stacked-layer structure like the second gate insulating film. With miniaturization and high integration of a transistor, a problem such as generation of a leakage current sometimes arises because of a thin gate insulating film. Thus, when an insulator functioning as a gate insulating film has a stacked-layer structure of a high-k material and a thermally stable material, a gate potential at the time of operating the transistor can be reduced while the physical thickness of the gate insulating film is kept. Furthermore, the stacked-layer structure can be thermally stable and have a high dielectric constant.

Although the conductor 560 functioning as the first gate electrode has a two-layer structure in FIGS. 23A and 23B, the conductor 560 may have a single-layer structure or a stacked-layer structure of three or more layers.

The conductor 560a is preferably formed using a conductive material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom. Alternatively, the conductor 560a is preferably formed using a conductive material having a function of inhibiting diffusion of oxygen (e.g., at least one of oxygen atoms, oxygen molecules, and the like). When the conductor 560a has a function of inhibiting diffusion of oxygen, the conductivity of the conductor 560b can be prevented from being lowered because of oxidization due to oxygen contained in the insulator 545. As a conductive material having a function of inhibiting diffusion of oxygen, for example, tantalum, tantalum nitride, ruthenium, ruthenium oxide, or the like is preferably used. The conductor 560a can be formed using an oxide semiconductor that can be used for the oxide 530. In that case, when the conductor 560b is formed by a sputtering method, the conductor 560a can have a reduced electric resistance and become a conductor. Such a conductor can be referred to as an OC (Oxide Conductor) electrode.

Furthermore, the conductor 560b is preferably formed using a conductive material containing tungsten, copper, or aluminum as its main component. The conductor 560b also functions as a wiring and thus is preferably a conductor having high conductivity. For example, a conductive material containing tungsten, copper, or aluminum as its main component can be used. The conductor 560b may have a stacked-layer structure, for example, a stacked-layer structure of titanium or titanium nitride and any of the above conductive materials.

The insulator 580 is provided over the conductor 542a and the conductor 542b with the insulator 544 positioned therebetween. The insulator 580 preferably includes an excess-oxygen region. For example, the insulator 580 preferably contains silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. In particular, silicon oxide and silicon oxynitride, which have thermal stability, are preferable. Silicon oxide and porous silicon oxide are particularly preferable because an excess-oxygen region can be formed easily in a later step.

The insulator 580 preferably includes an excess-oxygen region. When the insulator 580 from which oxygen is released by heating is provided, oxygen in the insulator 580 can be efficiently supplied to the oxide 530. The concentration of impurities such as water and hydrogen in the insulator 580 is preferably lowered.

The opening of the insulator 580 is formed to overlap with a region between the conductor 542a and the conductor 542b. Thus, the conductor 560 is formed to be embedded in the opening of the insulator 580 and the region sandwiched between the conductor 542a and the conductor 542b.

The gate length needs to be short for miniaturization of the semiconductor device without a reduction in the conductivity of the conductor 560. When the conductor 560 is made thick to achieve this, the conductor 560 might have a shape with a high aspect ratio. Even when having a shape with a high aspect ratio, the conductor 560 can be formed without collapsing during the process because the conductor 560 is provided to be embedded in the opening of the insulator 580 in this embodiment.

The insulator 574 is preferably provided in contact with the top surfaces of the insulator 580, the conductor 560, and the insulator 545. When the insulator 574 is formed by a sputtering method, the insulator 545 and the insulator 580 can include an excess-oxygen region. Therefore, oxygen can be supplied from the excess-oxygen region to the oxide 530.

For example, a metal oxide containing one or two or more of hafnium, aluminum, gallium, yttrium, zirconium, tungsten, titanium, tantalum, nickel, germanium, magnesium, and the like can be used as the insulator 574.

In particular, aluminum oxide has a high barrier property, and even a thin aluminum oxide film having a thickness greater than or equal to 0.5 nm and less than or equal to 3.0 nm can inhibit diffusion of hydrogen and nitrogen. Thus, aluminum oxide deposited by a sputtering method can serve as not only an oxygen supply source but also a barrier film against impurities such as hydrogen.

The insulator 581 functioning as an interlayer film is preferably provided over the insulator 574. As in the insulator 524 or the like, the concentration of impurities such as water and hydrogen in the insulator 581 is preferably lowered.

A conductor 540a and a conductor 540b are provided in the openings formed in the insulator 581, the insulator 574, the insulator 580, and the insulator 544. The conductor 540a and the conductor 540b are provided to face each other with the conductor 560 positioned therebetween. The conductor 540a and the conductor 540b have a structure similar to that of a conductor 546 and a conductor 548 described later.

An insulator 582 is provided over the insulator 581. A material having a barrier property against oxygen, hydrogen, or the like is preferably used for the insulator 582. Thus, the insulator 582 can be formed using a material similar to that for the insulator 514. For the insulator 582, a metal oxide such as aluminum oxide, hafnium oxide, or tantalum oxide is preferably used, for example.

In particular, aluminum oxide has an excellent blocking effect that prevents permeation of oxygen and impurities such as hydrogen and moisture that cause a change in electrical characteristics of the transistor. Accordingly, the use of aluminum oxide can prevent entry of impurities such as hydrogen and moisture into the transistor 500 during and after a manufacturing process of the transistor. In addition, release of oxygen from the oxide contained in the transistor 500 can be prevented. Therefore, aluminum oxide is suitably used for a protective film of the transistor 500.

An insulator 586 is provided over the insulator 582. The insulator 586 can be formed using a material similar to that for the insulator 320. In the case where a material with a relatively low dielectric constant is used for these insulators, the parasitic capacitance between wirings can be reduced. For example, a silicon oxide film, a silicon oxynitride film, or the like can be used for the insulator 586.

The conductor 546, the conductor 548, and the like are embedded in the insulator 520, the insulator 522, the insulator 524, the insulator 544, the insulator 580, the insulator 574, the insulator 581, the insulator 582, and the insulator 586.

The conductor 546 and the conductor 548 function as plugs or wirings that are connected to the capacitor 600, the transistor 500, or the transistor 550. The conductor 546 and the conductor 548 can be formed using a material similar to that for the conductor 328 and the conductor 330.

After the transistor 500 is formed, an opening may be formed to surround the transistor 500 and an insulator having a high barrier property against hydrogen or water may be formed to cover the opening. Surrounding the transistor 500 by the insulator having a high barrier property can prevent entry of moisture and hydrogen from the outside. Alternatively, a plurality of transistors 500 may be collectively surrounded by the insulator having a high barrier property against hydrogen or water. When an opening is formed to surround the transistor 500, for example, the formation of an opening reaching the insulator 522 or the insulator 514 and the formation of the insulator having a high barrier property in contact with the insulator 522 or the insulator 514 are suitable because these formation steps can also serve as some of the manufacturing steps of the transistor 500. The insulator having a high barrier property against hydrogen or water is formed using a material similar to that for the insulator 522 or the insulator 514, for example.

The capacitor 600 is provided above the transistor 500. The capacitor 600 includes a conductor 610, a conductor 620, and an insulator 630.

A conductor 612 may be provided over the conductor 546 and the conductor 548. The conductor 612 functions as a plug or a wiring that is connected to the transistor 500. The conductor 610 functions as an electrode of the capacitor 600. The conductor 612 and the conductor 610 can be formed at the same time.

The conductor 612 and the conductor 610 can be formed using a metal film containing an element selected from molybdenum, titanium, tantalum, tungsten, aluminum, copper, chromium, neodymium, and scandium; a metal nitride film containing any of the above elements as its component (a tantalum nitride film, a titanium nitride film, a molybdenum nitride film, or a tungsten nitride film); or the like. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

The conductor 612 and the conductor 610 each have a single-layer structure in this embodiment; however, the structure is not limited thereto, and a stacked-layer structure of two or more layers may be used. For example, between a conductor having a barrier property and a conductor having high conductivity, a conductor that is highly adhesive to the conductor having a barrier property and the conductor having high conductivity may be formed.

The conductor 620 is provided to overlap with the conductor 610 with the insulator 630 positioned therebetween. Note that the conductor 620 can be formed using a conductive material such as a metal material, an alloy material, or a metal oxide material. It is preferable to use a high-melting-point material that has both heat resistance and conductivity, such as tungsten or molybdenum, and it is particularly preferable to use tungsten. In the case where the conductor 620 is formed concurrently with another component such as a conductor, copper (Cu), aluminum (Al), or the like, which is a low-resistance metal material, is used.

An insulator 640 is provided over the conductor 620 and the insulator 630. The insulator 640 can be formed using a material similar to that for the insulator 320. The insulator 640 may function as a planarization film that covers a roughness thereunder.

With the use of the structure, a semiconductor device that includes a transistor including an oxide semiconductor can be miniaturized or highly integrated.

Examples of a substrate that can be used for the semiconductor device of one embodiment of the present invention include a glass substrate, a quartz substrate, a sapphire substrate, a ceramic substrate, a metal substrate (e.g., a stainless steel substrate, a substrate including stainless steel foil, a tungsten substrate, and a substrate including tungsten foil), a semiconductor substrate (e.g., a single crystal semiconductor substrate, a polycrystalline semiconductor substrate, and a compound semiconductor substrate), and a SOI (Silicon on Insulator) substrate. Alternatively, a plastic substrate having heat resistance to the processing temperature in this embodiment may be used. Examples of a glass substrate include a barium borosilicate glass substrate, an aluminosilicate glass substrate, an aluminoborosilicate glass substrate, and a soda lime glass substrate. Alternatively, crystallized glass or the like can be used.

Alternatively, a flexible substrate, an attachment film, paper including a fibrous material, a base film, or the like can be used as the substrate. Examples of a material for a flexible substrate, an attachment film, a base film, or the like include plastic typified by polyethylene terephthalate (PET), polyethylene naphthalate (PEN), polyether sulfone (PES), and polytetrafluoroethylene (PTFE). Another example is a synthetic resin such as acrylic. Other examples include polypropylene, polyester, polyvinyl fluoride, and polyvinyl chloride. Alternatively, polyamide, polyimide, an aramid resin, an epoxy resin, an inorganic vapor deposition film, and paper can be used. Specifically, the use of a semiconductor substrate, a single crystal substrate, an SOI substrate, or the like enables the manufacture of small-sized transistors with a small variation in characteristics, size, shape, or the like and with high current capability. A circuit using such transistors achieves lower power consumption or higher integration.

A flexible substrate may be used as the substrate, and a transistor, a resistor, a capacitor, and/or the like may be formed directly over the flexible substrate. Alternatively, a separation layer may be provided between the substrate and the transistor, the resistor, the capacitor, and/or the like. The separation layer can be used when part or the whole of a semiconductor device formed over the separation layer is separated from the substrate and transferred to another substrate. In such a case, the transistor, the resistor, the capacitor, and/or the like can be transferred to a substrate having low heat resistance, a flexible substrate, or the like. As the separation layer, a stack of inorganic films, namely a tungsten film and a silicon oxide film, an organic resin film of polyimide or the like formed over a substrate, or a silicon film containing hydrogen can be used, for example.

That is, a semiconductor device may be formed over one substrate and then transferred to another substrate. Examples of a substrate to which a semiconductor device is transferred include, in addition to the above-described substrates over which transistors can be formed, a paper substrate, a cellophane substrate, an aramid film substrate, a polyimide film substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupro, rayon, or regenerated polyester), or the like), a leather substrate, and a rubber substrate. With the use of any of these substrates, a flexible semiconductor device or a highly durable semiconductor device can be manufactured, high heat resistance can be provided, or a reduction in weight or thickness can be achieved.

Providing a semiconductor device over a flexible substrate can suppress an increase in weight and can produce a non-breakable semiconductor device.

Note that the transistor 550 illustrated in FIG. 22 is just an example and is not limited to the structure illustrated therein, and an appropriate transistor can be used in accordance with a circuit structure, a driving method, or the like. For example, when the semiconductor device is a single-polarity circuit using only OS transistors (which mean transistors having the same polarity, e.g., only n-channel transistors), the transistor 550 has a structure similar to that of the transistor 500.

The configuration, structure, method, and the like described in this embodiment can be used in appropriate combination with the configurations, structures, methods, and the like described in the other embodiments, examples, and the like.

Embodiment 6

In this embodiment, cross-sectional structure examples of a memory device including OS transistors, which is a DOSRAM or a NOSRAM and described in the above embodiments, are described.

Figure 24:
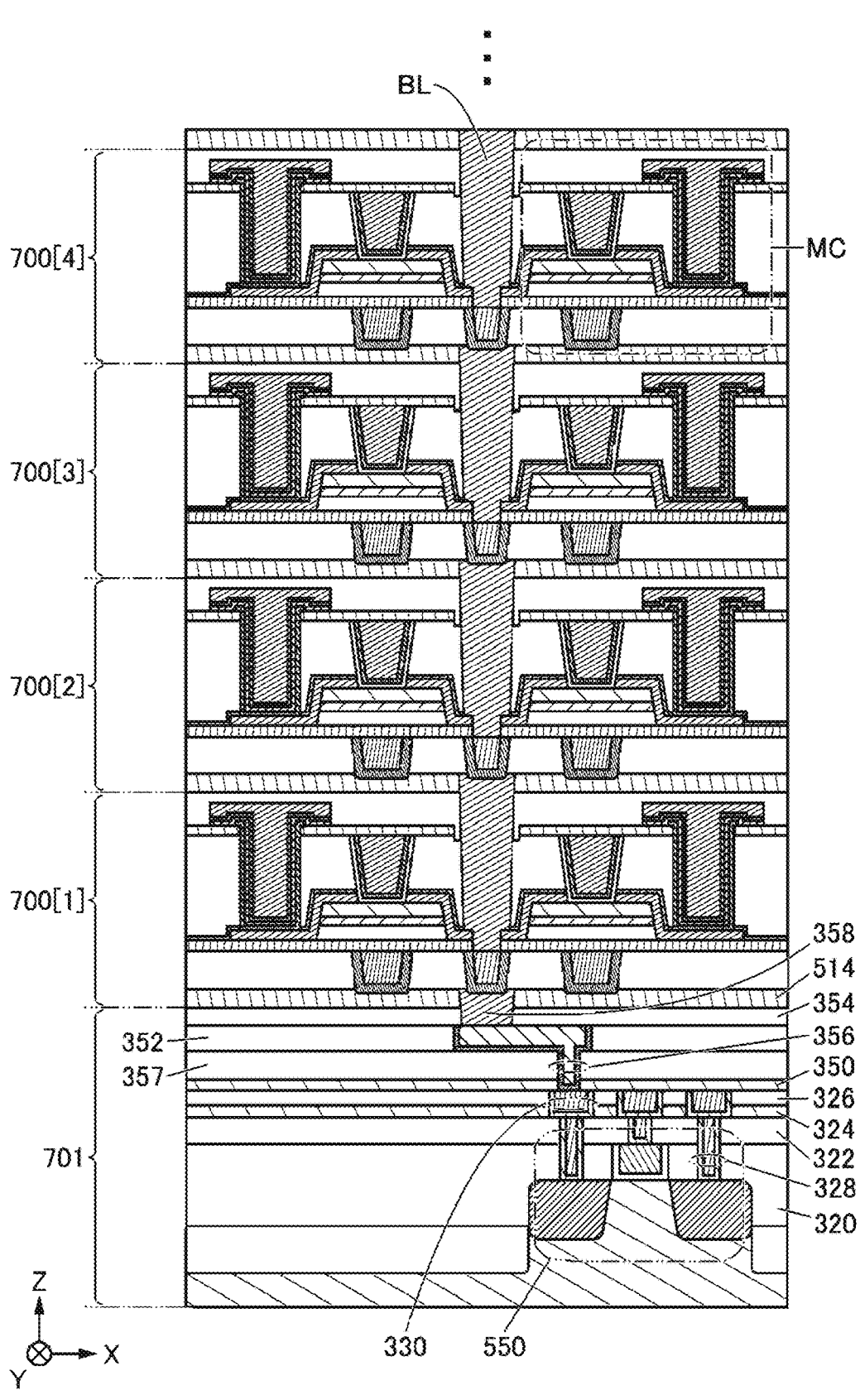
FIG. 24 is a diagram illustrating a structure example of a storage portion.

FIG. 24 illustrates a cross-sectional structure example of the case of using a DOSRAM circuit structure. In the example illustrated in FIG. 24, a storage layer 700[1] to a storage layer 700[4] are stacked over a driver circuit layer 701.

FIG. 24 illustrates the transistor 550 included in the driver circuit layer 701 as an example. The transistor 550 described in the above embodiment can be used as the transistor 550.

The transistor 550 illustrated in FIG. 24 is just an example and is not limited to the structure illustrated therein, and an appropriate transistor can be used in accordance with a circuit structure or a driving method.

A wiring layer provided with an interlayer film, a wiring, a plug, and the like may be provided between the driver circuit layer 701 and the storage layers 700 or between a k-th storage layer 700 and a (k+1)-th storage layer 700. In this embodiment and the like, the k-th storage layer 700 is referred to as the storage layer 700[k], and the (k+1)-th storage layer 700 is referred to as the storage layer 700[k+1], in some cases. Here, k is an integer greater than or equal to 1 and less than or equal to N. In this embodiment and the like, the solutions of "k+a (a is an integer greater than or equal to 1)" and "k−a" are each an integer greater than or equal to 1 and less than or equal to N.

A plurality of wiring layers can be provided in accordance with the design. Furthermore, in this specification and the like, a wiring and a plug electrically connected to the wiring may be a single component. That is, part of a conductor functions as a wiring in some cases, and part of a conductor functions as a plug in other cases.

For example, the insulator 320, the insulator 322, the insulator 324, and the insulator 326 are stacked in this order over the transistor 550 as interlayer films. The conductor 328 or the like is embedded in the insulator 320 and the insulator 322. The conductor 330 or the like is embedded in the insulator 324 and the insulator 326. Note that the conductor 328 and the conductor 330 each function as a contact plug or a wiring.

The insulator functioning as an interlayer film may function as a planarization film that covers a roughness thereunder. For example, the top surface of the insulator 320 may be planarized by planarization treatment using a chemical mechanical polishing (CMP) method or the like to increase the level of planarity.

A wiring layer may be provided over the insulator 326 and the conductor 330. For example, in FIG. 24, the insulator 350, an insulator 357, the insulator 352, and the insulator 354 are stacked in this order over the insulator 326 and the conductor 330. The conductor 356 is formed in the insulator 350, the insulator 357, and the insulator 352. The conductor 356 functions as a contact plug or a wiring.

Over the insulator 354, the insulator 514 included in the storage layer 700[1] is provided. A conductor 358 is embedded in the insulator 514 and the insulator 354. The conductor 358 functions as a contact plug or a wiring. For example, a wiring BL and the transistor 550 are electrically connected to each other through the conductor 358, the conductor 356, the conductor 330, and the like.

Figure 25A:
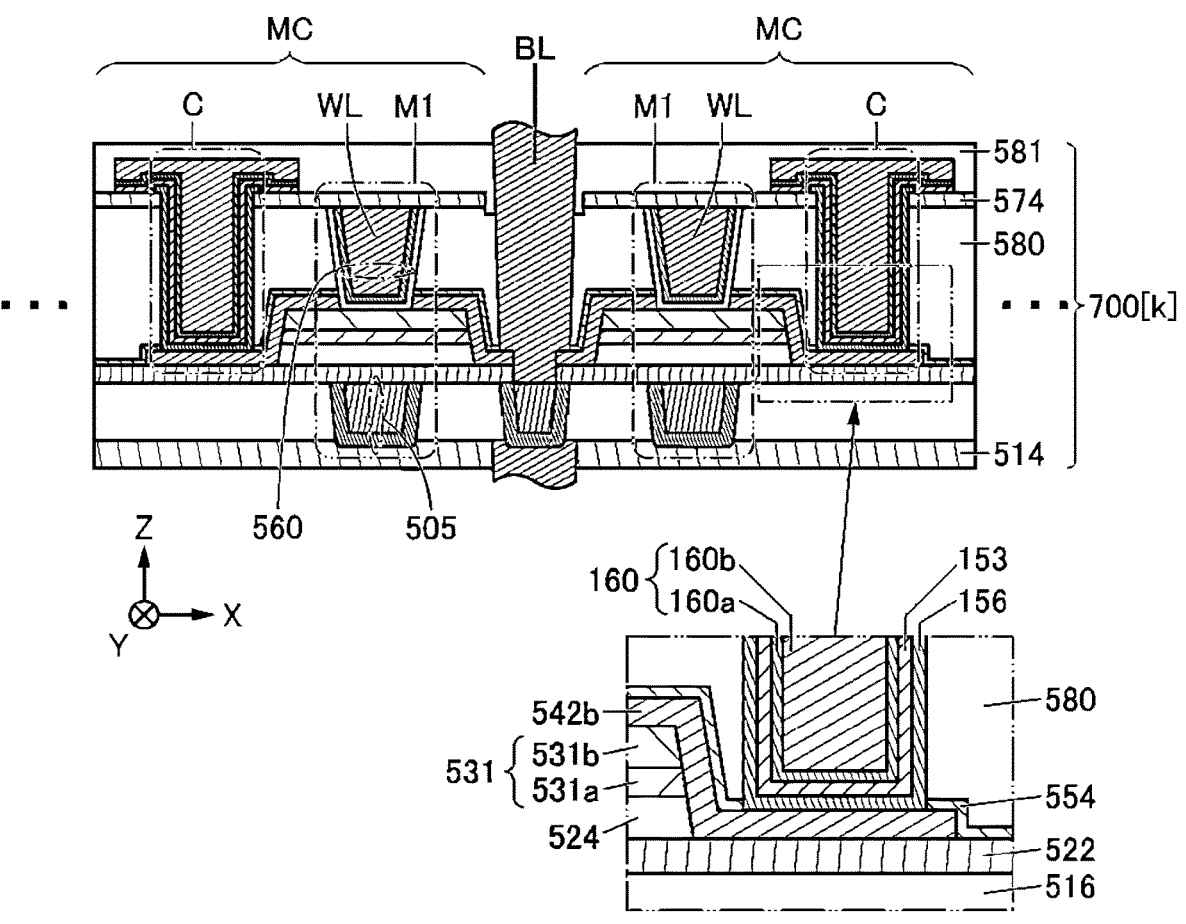
FIG. 25A is a diagram illustrating a structure example of a storage layer.
Figure 25B:
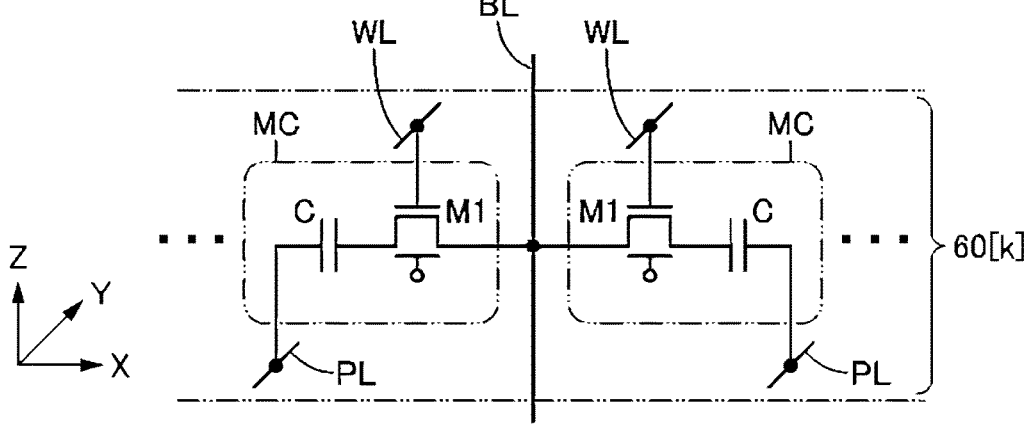
FIG. 25B is a diagram illustrating an equivalent circuit of a storage layer.

FIG. 25A illustrates a cross-sectional structure example of the storage layer 700[k]. FIG. 25B is an equivalent circuit diagram of FIG. 25A. FIG. 25A illustrates an example where two memory cells MC are electrically connected to one wiring BL.

The memory cell MC illustrated in FIG. 24 and FIG. 25A includes the transistor M1 and the capacitor C. As the transistor M1, the transistor 500 described in the above embodiment can be used.

In this embodiment, a variation of the transistor 500 is illustrated as the transistor M1. Specifically, the transistor M1 is different from the transistor 500 in that the conductor 542a and the conductor 542b extend beyond an edge of a metal oxide 531 (a metal oxide 531a and a metal oxide 531b).

The memory cell MC illustrated in FIG. 24 and FIG. 25A includes a conductor 156 functioning as one terminal of the capacitor C, an insulator 153 functioning as a dielectric, and a conductor 160 (a conductor 160a and a conductor 160b) functioning as the other terminal of the capacitor C. The conductor 156 is electrically connected to part of the conductor 542b. The conductor 160 is electrically connected to the wiring PL (not shown in FIG. 25A).

The capacitor C is formed in an opening portion that is provided by removal of part of the insulator 574, part of the insulator 580, and part of an insulator 554. Since the conductor 156, the insulator 580, and the insulator 554 are formed along a side surface of the opening portion, the conductor 156, the insulator 580, and the insulator 554 are preferably formed by an ALD method, a CVD method, or the like.

The conductor 156 and the conductor 160 may be formed using a conductor that can be used for a conductor 505 or the conductor 560. For example, the conductor 156 may be formed using titanium nitride by an ALD method. The conductor 160a may be formed using titanium nitride by an ALD method, and the conductor 160b may be formed using tungsten by a CVD method. Note that in the case where the adhesion of tungsten to the insulator 153 is sufficiently high, a single-layer film of tungsten formed by a CVD method may be used as the conductor 160.

For the insulator 153, an insulator of a high dielectric constant (high-k) material (material with a high relative permittivity) is preferably used. As the insulator of high dielectric constant material, an oxide, an oxynitride, a nitride oxide, or a nitride containing one or more kinds of metal element selected from aluminum, hafnium, zirconium, gallium, and the like can be used, for example. The above-described oxide, oxynitride, nitride oxide, and nitride may contain silicon. Insulating layers each formed of any of the above-described materials can be stacked to be used.

As the insulator of high dielectric constant material, aluminum oxide, hafnium oxide, zirconium oxide, an oxide containing aluminum and hafnium, an oxynitride containing aluminum and hafnium, an oxide containing silicon and hafnium, an oxynitride containing silicon and hafnium, an oxide containing silicon and zirconium, an oxynitride containing silicon and zirconium, an oxide containing hafnium and zirconium, an oxynitride containing hafnium and zirconium, or the like can be used, for example. Using such a high dielectric constant material allows the insulator 153 to be thick enough to inhibit a leakage current and a sufficiently high capacitance of the capacitor C to be ensured.

It is preferable to use stacked insulating layers each formed of any of the above-described materials. A stacked-layer structure using a high dielectric constant material and a material having higher dielectric strength than the high dielectric constant material is preferably used. For example, as the insulator 153, an insulating film in which zirconium oxide, aluminum oxide, and zirconium oxide are stacked in this order can be used. An insulating film in which zirconium oxide, aluminum oxide, zirconium oxide, and aluminum oxide are stacked in this order can be used, for example. An insulating film in which hafnium zirconium oxide, aluminum oxide, hafnium zirconium oxide, and aluminum oxide are stacked in this order can be used, for example. The stacking of such an insulator having relatively high dielectric strength, such as aluminum oxide, can increase the dielectric strength and inhibit electrostatic breakdown of the capacitor C.

Figure 26:
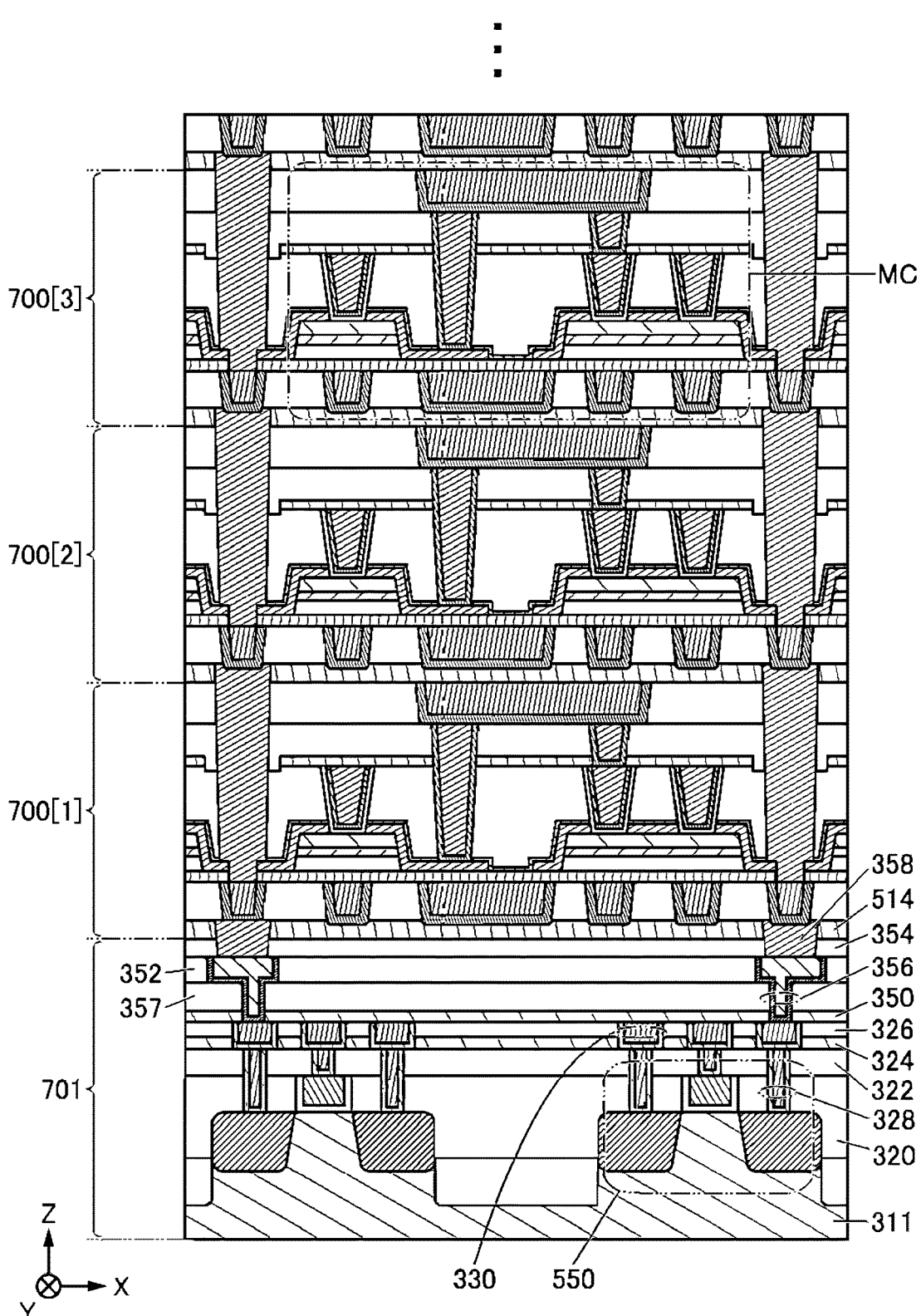
FIG. 26 is a diagram illustrating a structure example of a storage portion.
Figure 27A:
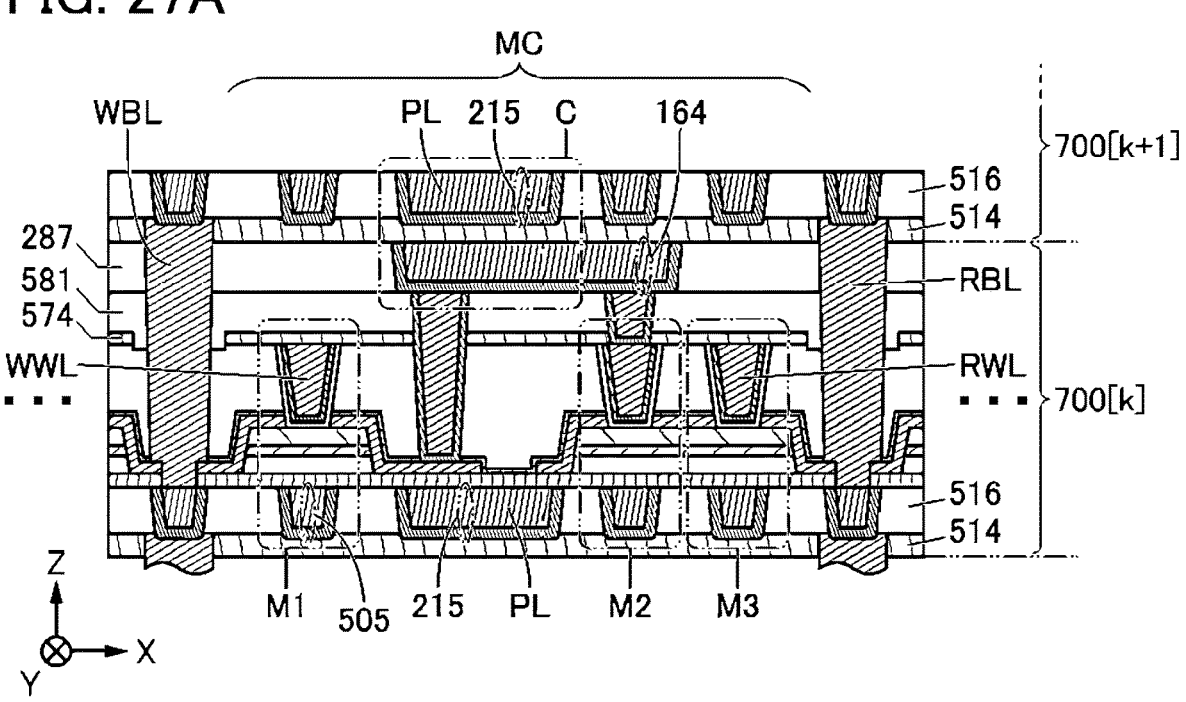
FIG. 27A is a diagram illustrating a structure example of a storage layer.
Figure 27B:
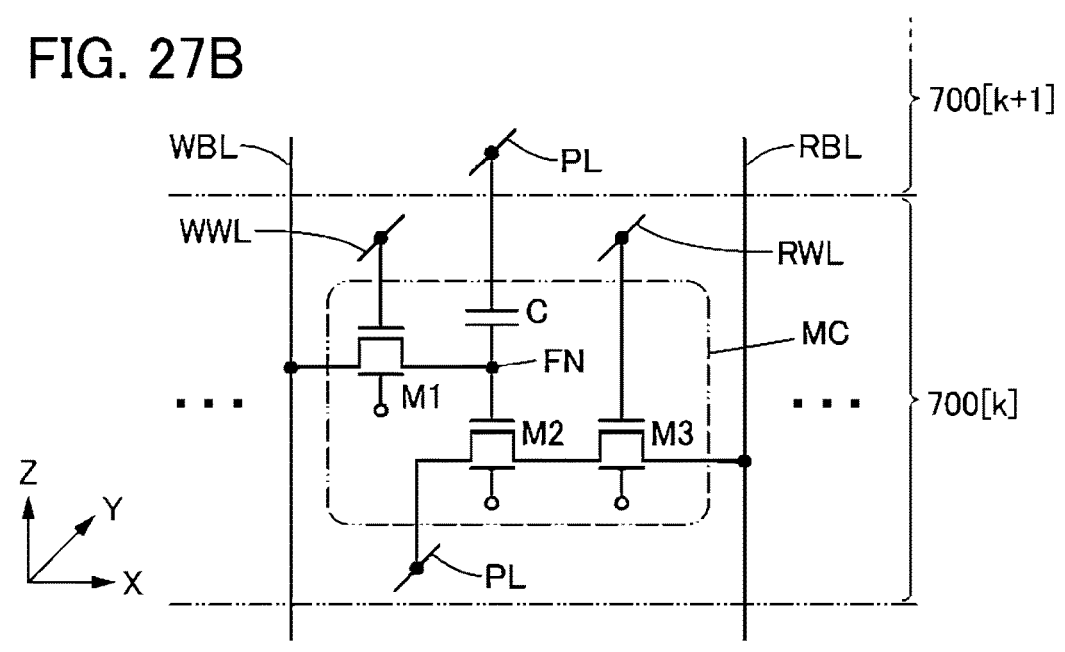
FIG. 27B is a diagram illustrating an equivalent circuit of a storage layer.

FIG. 26 illustrates a cross-sectional structure example of the case of using a NOSRAM memory cell circuit structure. FIG. 26 is also a variation of FIG. 24. FIG. 27A illustrates a cross-sectional structure example of the storage layer 700[k]. FIG. 27B is an equivalent circuit diagram of FIG. 27A.

The memory cell MC illustrated in FIG. 26 and FIG. 27A includes the transistor M1, the transistor M2, and the transistor M3 over the insulator 514. A conductor 215 is provided over the insulator 514. The conductor 215 can be formed using the same material in the same process as those of the conductor 505 at the same time.

The transistor M2 and the transistor M3 illustrated in FIG. 26 and FIG. 27A share one island-shaped metal oxide 531. In other words, a part of the one island-shaped metal oxide 531 functions as a channel formation region of the transistor M2, and another part thereof functions as a channel formation region of the transistor M3. Furthermore, the source of the transistor M2 and a drain of the transistor M3 are shared, or the drain of the transistor M2 and a source of the transistor M3 are shared. Thus, the area occupied by the transistors M2 and M3 is smaller than that of the case where the transistors M2 and M3 are independently provided.

In the memory cell MC illustrated in FIG. 26 and FIG. 27A, an insulator 287 is provided over the insulator 581, and a conductor 164 is embedded in the insulator 287. The insulator 514 of the storage layer 700[k+1] is provided over the insulator 287 and the conductor 164.

In FIG. 26 and FIG. 27A, the conductor 215 of the storage layer 700[k+1] functions as one terminal of the capacitor C, the insulator 514 of the storage layer 700[k+1] functions as a dielectric of the capacitor C, and the conductor 164 functions as the other terminal of the capacitor C. The other of the source and the drain of the transistor M1 is electrically connected to the conductor 164 through a contact plug, and the gate of the transistor M2 is electrically connected to the conductor 164 through another contact plug.

This embodiment can be implemented in combination with the other embodiments described in this specification as appropriate.

Embodiment 7

In this embodiment, an example of a display apparatus including the semiconductor device of one embodiment of the present invention will be described.

Figure 28A:
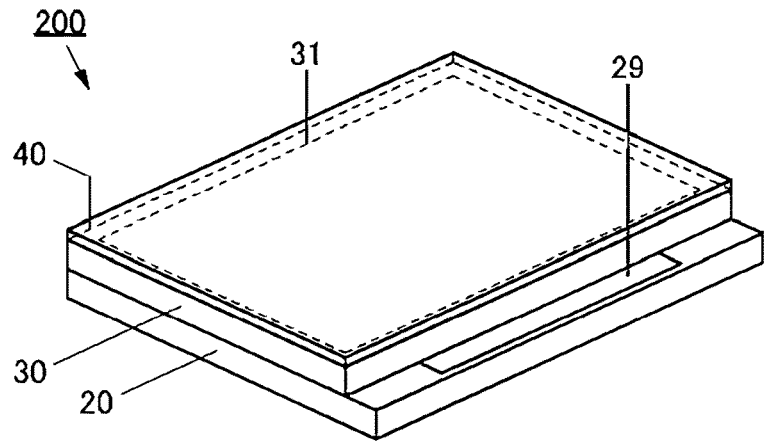
FIG. 28A and FIG. 28B are diagrams illustrating a structure example of a display apparatus.
Figure 28B:
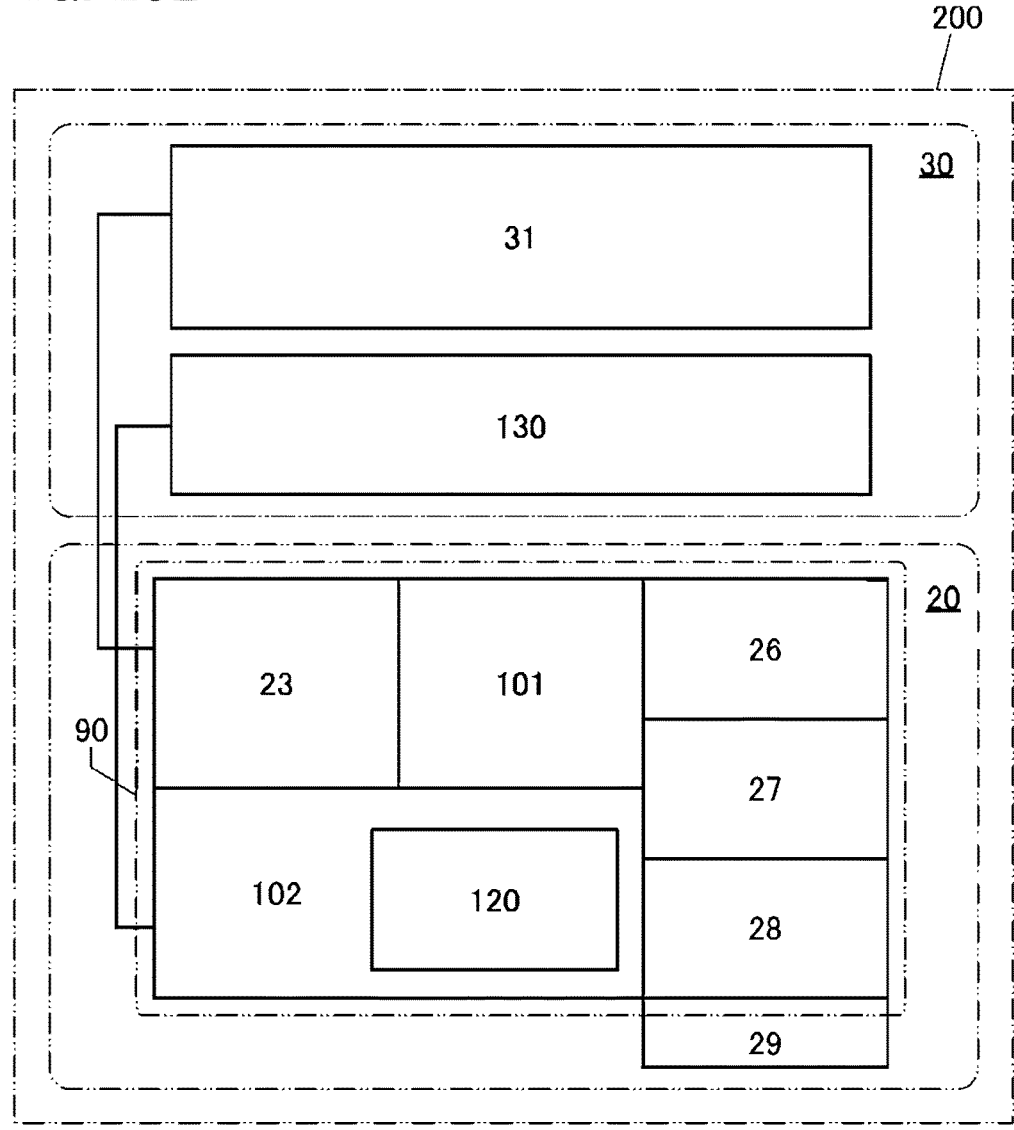
Figure 29:
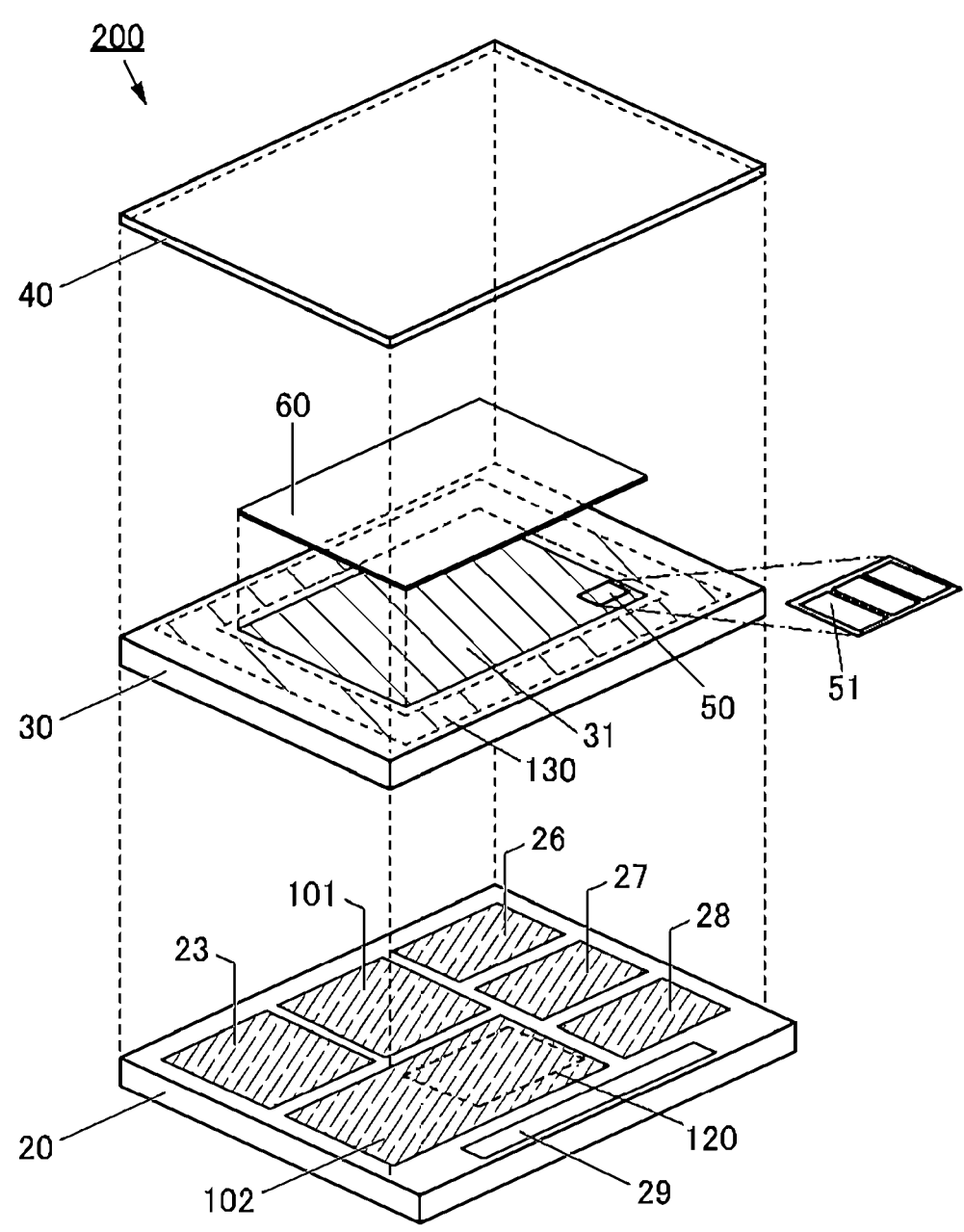
FIG. 29 is a diagram illustrating a structure example of a display apparatus.

FIG. 28A and FIG. 29 are perspective views of a display apparatus 200 of one embodiment of the present invention. FIG. 28B is a block diagram illustrating a structure of the display apparatus 200. The display apparatus 200 includes a layer 30 over a layer 20 and a sealing substrate 40 over the layer 30. The layer 30 includes the data retention circuit 130 and a display portion 31, and a layer 60 is provided between the sealing substrate 40 and the display portion 31. A structure where the data retention circuit 130 is provided around a region where the display portion 31 is provided in the layer 30 is illustrated as an example. For the structure of the display apparatus 200 to be easily understood, FIG. 29 illustrates the layer 20, the layer 30, the layer 60, the sealing substrate 40, and the like being spaced apart from one another.

The layer 20 includes a functional circuit 90 and a terminal portion 29. The functional circuit 90 includes a display portion driver circuit 23, a sensor circuit 26, a communication circuit 27, and an input/output circuit 28 in addition to the state control portion 101 and the CPU core 102 including the scan flip-flop 120 described in the above embodiments.

The functional circuit 90 is formed using Si CMOS, that is, Si transistors. The layer 20 including the functional circuit 90 is a layer including the Si transistors. When the functional circuit 90 is formed using Si transistors, circuits having functions of the state control portion 101, the display portion driver circuit 23, the CPU core 102 including the scan flip-flop 120, the sensor circuit 26, the communication circuit 27, and the input/output circuit 28 can be provided in the functional circuit 90.

The state control portion 101 has a function of controlling the state of the CPU core 102 functioning as an arithmetic device such as a CPU in accordance with a signal input to and output from the circuits of the functional circuit 90 provided in the layer 20.

In response to the control of the state control portion 101, the CPU core 102 makes data stored in the scan flip-flop 120 be stored in or read from the data retention circuit 130 provided in the layer 30; thus, data can be saved or loaded in accordance with the switch of the task in the CPU core 102.

The display portion driver circuit 23 is electrically connected to the display portion 31 included in the layer 30 and has a function of supplying image data to the display portion 31. A variety of circuits such as a shift register, a level shifter, an inverter, a latch, an analog switch, and a logic circuit can be used in the display portion driver circuit 23. The layer 60 is provided to overlap with the display portion 31 included in the layer 30. The layer 60 includes a plurality of light-emitting elements, and the emission luminance is controlled by a pixel circuit 51 provided in the display portion 31. Thus, the layer 60 can also be regarded as part of the display portion 31.

The display portion 31 includes a pixel 50 including a plurality of the pixel circuits 51. The pixel 50 includes the pixel circuits 51 and light-emitting elements (not illustrated) provided in the layer 60 over the pixel circuits 51. The pixel circuits 51 correspond to pixel circuits included in subpixels for performing color display.

Note that the three subpixels each control the emission amount or the like of red light, green light, or blue light. Note that the light colors controlled by the three subpixels are not limited to a combination of red (R), green (G), and blue (B) and may be cyan (C), magenta (M), and yellow (Y). In addition, the three subpixels do not necessarily have the same area. In the case where luminous efficiency, reliability, or the like varies depending on the emission color, the subpixel area may be changed depending on the emission color. Four subpixels may collectively function as one pixel. For example, a subpixel that controls white light may be added to the three subpixels that control red light, green light, and blue light. The addition of the subpixel that controls white light can increase the luminance of a display region.

The sensor circuit 26 has a function of obtaining information on one or more of the senses of sight, hearing, touch, taste, and smell of a human. Specifically, the sensor circuit 26 has at least one of functions of sensing or measuring force, displacement, position, speed, acceleration, angular velocity, rotational frequency, distance, light, magnetism, temperature, sound, time, electric field, current, voltage, electric power, radiation, humidity, gradient, oscillation, a smell, and infrared rays. The sensor circuit 26 may have a function other than those functions.

The communication circuit 27 has a wireless or wired communication function. In particular, the communication circuit preferably has a wireless communication function, in which case the number of parts such as a connection cable can be decreased.

In the case where the communication circuit 27 has a wireless communication function, the communication circuit 27 can perform communication via an antenna. As a communication protocol or a communication technology, a communication standard such as LTE (Long Term Evolution), GSM (Global System for Mobile Communication: registered trademark), EDGE (Enhanced Data Rates for GSM Evolution), CDMA2000 (Code Division Multiple Access 2000), or W-CDMA (registered trademark), or an IEEE communication standard such as Wi-Fi (registered trademark), Bluetooth (registered trademark), or ZigBee (registered trademark) can be used.

The communication circuit 27 can perform input/output of information by connecting the display apparatus 200 to another device via a computer network such as the Internet, which is an infrastructure of the World Wide Web (WWW), an intranet, an extranet, a PAN (Personal Area Network), a LAN (Local Area Network), a CAN (Campus Area Network), a MAN (Metropolitan Area Network), a WAN (Wide Area Network), or a GAN (Global Area Network).

The input/output circuit 28 has a function of distributing signals supplied to the display apparatus 200 through the terminal portion 29 to circuits such as the state control portion 101. In addition, the input/output circuit 28 has a function of distributing signals supplied to the display apparatus 200 through the communication circuit 27 to the circuits such as the state control portion 101.

The input/output circuit 28 has a function of outputting signals to the outside through the terminal portion 29. The input/output circuit 28 has function of outputting signals to the outside through the communication circuit 27.

An FPC (Flexible printed circuits) or the like is electrically connected to the terminal portion 29. Thus. The layer 30 and the sealing substrate 40 are not formed in a region overlapping with the terminal portion 29.

The layer 30 is a layer including OS transistors. With this structure, the data retention circuit 130 and the display portion 31 including OS transistors can be stacked over the layer 20.

An OS transistor has a characteristic of an extremely low off-state current. Thus, with the use of OS transistors as the transistors provided in the data retention circuit 130 as described above, a potential corresponding to data retained in the data retention circuit 130 can be retained for a long time. Similarly, when an OS transistor is used as a transistor provided in a pixel circuit, analog data written to the pixel circuit can be retained for a long period.

The data retention circuit 130 and the pixel circuits 51 included in the display portion 31 can be provided in the layer 30. With the structure in which the data retention circuit 130 and the display portion 31 are placed in the same layer, the data retention circuit 130 can be placed utilizing a region of the layer 30 where the display portion 31 is not provided.

In the structure illustrated in FIG. 29, the data retention circuit 130 is provided around the region where the display portion 31 is provided. Note that the data retention circuit 130 may be provided in at least part of the region around the display portion 31. With this structure, the data retention circuit 130 can be placed to fill a region where the display portion 31 is not provided in the layer 30. Thus, the data retention circuit 130 can be placed without reducing the display quality, e.g., without narrowing the area of the display portion 31.

The configuration, structure, method, and the like described in this embodiment can be used in appropriate combination with the configurations, structures, methods, and the like described in the other embodiments, examples, and the like.

Embodiment 8

In this embodiment, an example of a chip including the semiconductor device of one embodiment of the present invention and an example of a module of an electronic device will be described.

Figure 30A:
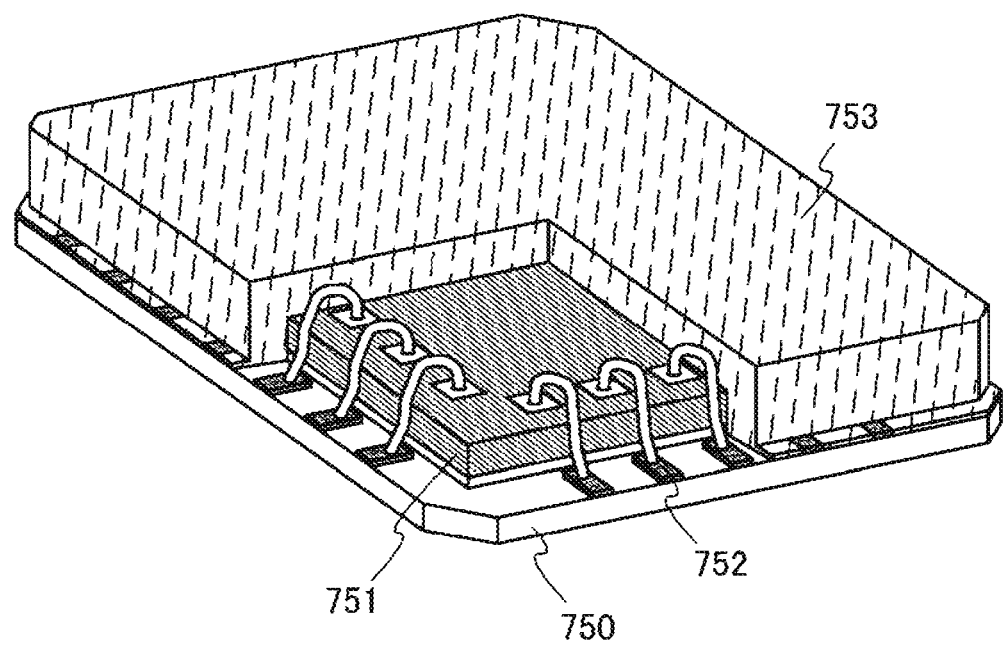
FIG. 30A and FIG. 30B are diagrams illustrating a structure example of a semiconductor device.

FIG. 30A is a perspective view illustrating a cross-sectional structure of a package using a lead frame interposer.

In the package illustrated in FIG. 30A, a chip 751 corresponding to the semiconductor device of one embodiment of the present invention is connected to a terminal 752 over an interposer 750 by a wire bonding method. The terminal 752 is placed on a surface of the interposer 750 on which the chip 751 is mounted. The chip 751 can be sealed by a mold resin 753, in which case the chip 751 is sealed so that part of each of the terminals 752 is exposed.

Figure 30B:
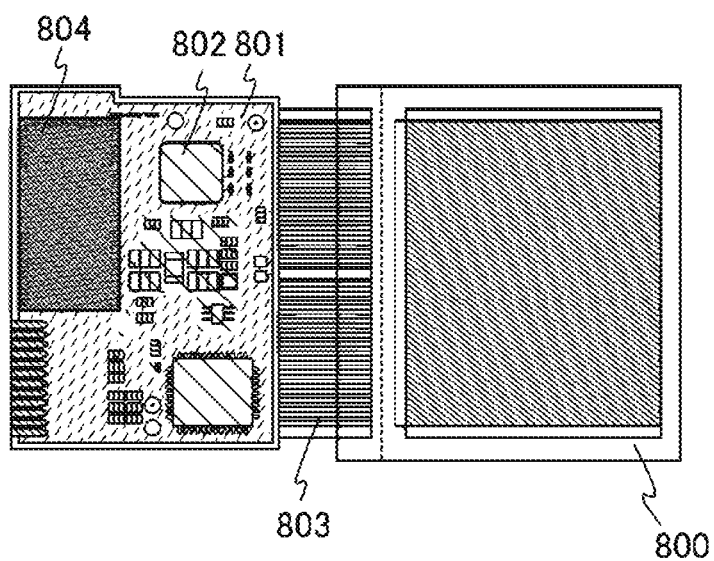

FIG. 30B illustrates a structure of a module of an electronic device in which the package is mounted on a circuit board.

In the module of a mobile phone illustrated in FIG. 30B, a package 802 and a battery 804 are mounted on a printed wiring board 801. In addition, the printed wiring board 801 is mounted on a panel 800 including a display element by an FPC 803.

The structure described above in this embodiment can be used in combination with the structures described in the other embodiments as appropriate.

Embodiment 9

A semiconductor device of one embodiment of the present invention can be used for a display device, a personal computer, or an image reproducing device provided with recording media (typically, devices that reproduce the content of recording media such as digital versatile discs (DVDs) and have displays for displaying the reproduced images). Other examples of electronic devices that can use the semiconductor device of one embodiment of the present invention are mobile phones, game consoles including portable game consoles, portable information terminals, e-book readers, cameras such as video cameras or digital still cameras, goggle-type displays (head mounted displays), navigation systems, audio reproducing devices (e.g., car audio units and digital audio players), copiers, facsimiles, printers, multifunction printers, automated teller machines (ATM), and vending machines. FIG. 31 illustrates specific examples of such electronic devices.

FIG. 31A illustrates a portable game console that includes a housing 5001, a housing 5002, a display portion 5003, a display portion 5004, a microphone 5005, a speaker 5006, an operation key 5007, a stylus 5008, and the like. The semiconductor device of one embodiment of the present invention can be used for a variety of integrated circuits included in a portable game console. Note that although the portable game console illustrated in FIG. 31A has the two display portions 5003 and 5004, the number of display portions included in the portable game console is not limited thereto.

FIG. 31B illustrates a portable information terminal that includes a first housing 5601, a second housing 5602, a first display portion 5603, a second display portion 5604, a joint 5605, an operation key 5606, and the like. The first display portion 5603 is provided in the first housing 5601, and the second display portion 5604 is provided in the second housing 5602. Furthermore, the first housing 5601 and the second housing 5602 are connected to each other with the joint 5605, and the angle between the first housing 5601 and the second housing 5602 can be changed with the joint 5605. Images on the first display portion 5603 may be changed in accordance with the angle at the joint 5605 between the first housing 5601 and the second housing 5602. The semiconductor device of one embodiment of the present invention can be used for a variety of integrated circuits included in a portable information terminal. Moreover, a display apparatus with a function of a position input device may be used as at least one of the first display portion 5603 and the second display portion 5604. Note that the function of the position input device can be added through providing a touch panel to a display apparatus. Alternatively, the function of the position input device can be added through providing a photoelectric conversion element called a photosensor in a pixel portion of a display apparatus.

FIG. 31C illustrates a laptop personal computer that includes a housing 5401, a display portion 5402, a keyboard 5403, a pointing device 5404, and the like. The semiconductor device of one embodiment of the present invention can be used for a variety of integrated circuits included in a laptop personal computer.

FIG. 31D illustrates an electric refrigerator-freezer that includes a housing 5301, a refrigerator door 5302, a freezer door 5303, and the like. The semiconductor device of one embodiment of the present invention can be used for a variety of integrated circuits included in an electric refrigerator-freezer.

FIG. 31E illustrates the video camera that includes a first housing 5801, a second housing 5802, a display portion 5803, operation keys 5804, a lens 5805, a joint 5806, and the like. The operation keys 5804 and the lens 5805 are provided in the first housing 5801, and the display portion 5803 is provided in the second housing 5802. The semiconductor device of one embodiment of the present invention can be used for a variety of integrated circuits included in a video camera. Furthermore, the first housing 5801 and the second housing 5802 are connected to each other with the joint 5806, and the angle between the first housing 5801 and the second housing 5802 can be changed with the joint 5806. Images on the display portion 5803 may be changed in accordance with the angle at the joint 5806 between the first housing 5801 and the second housing 5802.

FIG. 31F illustrates an automobile that includes a car body 5101, wheels 5102, a dashboard 5103, lights 5104, and the like. The semiconductor device of one embodiment of the present invention can be used for a variety of integrated circuits included in an automobile.

The configuration, structure, method, and the like described in this embodiment can be used in appropriate combination with the configurations, structures, methods, and the like described in the other embodiments, examples, and the like.

<Supplementary Notes on Description in this Specification and the Like>

The following are notes on the description of the foregoing embodiments and the structures in the embodiments.

One embodiment of the present invention can be constituted by appropriately combining the structure described in an embodiment with any of the structures described in the other embodiments. In addition, in the case where a plurality of structure examples is described in one embodiment, some of the structure examples can be combined as appropriate.

Note that a content (or part thereof) described in one embodiment can be applied to, combined with, or replaced with another content (or part thereof) described in the embodiment and/or a content (or part thereof) described in another embodiment or other embodiments, for example.

Note that in each embodiment, a content described in the embodiment is a content described using a variety of diagrams or a content described with text disclosed in the specification.

Note that by combining a diagram (or part thereof) described in one embodiment with another part of the diagram, a different diagram (or part thereof) described in the embodiment, and/or a diagram (or part thereof) described in another embodiment or other embodiments, much more diagrams can be formed.

In this specification and the like, components are classified according to their functions, and illustrated as blocks independent of one another in block diagrams. However, in an actual circuit or the like, it is difficult to separate components on the basis of the functions, and there is such a case where one circuit is associated with a plurality of functions or a case where a plurality of circuits is associated with one function. Therefore, the blocks in the block diagrams are not limited by the components described in the specification, and the description can be changed appropriately depending on the situation.

In drawings, the size, the layer thickness, or the region is illustrated arbitrarily for description convenience. Therefore, the size, the layer thickness, or the region is not limited to the illustrated scale. Note that the drawings are schematically shown for clarity, and embodiments of the present invention are not limited to shapes, values, or the like illustrated in the drawings. For example, variations in a signal, a voltage, or a current due to noise, variations in a signal, a voltage, or a current due to difference in timing, or the like can be included.

In this specification and the like, the terms "one of a source and a drain" (or a first electrode or a first terminal) and "the other of the source and the drain" (or a second electrode or a second terminal) are used to describe the connection relationship of a transistor. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

In addition, in this specification and the like, the term "electrode" or "wiring" does not limit a function of the component. For example, an "electrode" is used as part of a "wiring" in some cases, and vice versa. Furthermore, for example, the term "electrode" or "wiring" also includes the case where a plurality of "electrodes" or "wirings" are formed in an integrated manner.

In this specification and the like, voltage and potential can be replaced with each other as appropriate. Voltage refers to a potential difference from a reference potential, and when the reference potential is a ground potential, for example, voltage can be replaced with potential. The ground potential does not necessarily mean 0 V. Potentials are relative values, and a potential supplied to a wiring or the like is sometimes changed depending on the reference potential.

In this specification and the like, the terms "film" and "layer" can be interchanged with each other depending on the case or circumstances. For example, the term "conductive layer" can be replaced with the term "conductive film" in some cases. For another example, the term "insulating film" can be replaced with the term "insulating layer" in some cases.

In this specification and the like, a switch is in a conduction state (on state) or in a non-conduction state (off state) to determine whether a current flows therethrough or not. A switch has a function of selecting and changing a current path.

In this specification and the like, the channel length refers to, for example, the distance between a source and a drain in a region where a semiconductor (or a portion where a current flows in a semiconductor when a transistor is in an on state) and a gate overlap with each other or a region where a channel is formed in a top view of the transistor.

In this specification and the like, the channel width refers to, for example, the length of a portion where a source and a drain face each other in a region where a semiconductor (or a portion where a current flows in a semiconductor when a transistor is in an on state) and a gate electrode overlap with each other or a region where a channel is formed.

In this specification and the like, the expression "A and B are connected" means the case where A and B are electrically connected as well as the case where A and B are directly connected. Here, the expression "A and B are electrically connected" means the case where electric signals can be transmitted and received between A and B when an object having any electric action is present between A and B.

In this specification and the like, a device formed using a metal mask or an FMM (fine metal mask, high-resolution metal mask) may be referred to as a device having an MM (metal mask) structure. In this specification and the like, a device fabricated without using a metal mask or an FMM may be referred to as a device having an MML (a metal maskless) structure.

In this specification and the like, a structure where light-emitting layers in light-emitting devices of different colors (here, blue (B), green (G), and red (R)) are separately formed or separately patterned is sometimes referred to as an SBS (Side By Side) structure. In this specification and the like, a light-emitting device capable of emitting white light may be referred to as a white-light-emitting device. Note that a combination of white light-emitting devices with coloring layers (e.g., color filters) enables a full-color display device.

Light-emitting devices can be classified roughly into a single structure and a tandem structure. A device having a single structure includes one light-emitting unit between a pair of electrodes, and the light-emitting unit preferably includes one or more light-emitting layers. To obtain white light emission, two or more light-emitting layers are selected so that a white color can be produced by light emission of the light-emitting layers. For example, when two colors are used, by making the emission color of a first light-emitting layer and the emission color of a second light-emitting layer complementary colors, the light-emitting device can be configured to emit white light as a whole. Furthermore, in the case where white light emission is obtained using three or more light-emitting layers, the light-emitting device is configured to be able to emit white light as a whole by combining the emission colors of the three or more light-emitting layers.

A device having a tandem structure includes two or more light-emitting units between a pair of electrodes, and each light-emitting unit preferably includes one or more light-emitting layers. To obtain white light emission, the structure is made so that light from light-emitting layers of the plurality of light-emitting units can be combined to be white light. Note that a structure for obtaining white light emission is similar to the structure of the case of a single structure. In a device with a tandem structure, an intermediate layer such as a charge-generation layer is suitably provided between a plurality of light-emitting units.

When the above white light-emitting device (having a single structure or a tandem structure) and the above light-emitting device having an SBS structure are compared with each other, the light-emitting device having an SBS structure can have lower power consumption than the white light-emitting device. To reduce power consumption, the light-emitting device having an SBS structure is suitably used. Meanwhile, the white light-emitting device is suitable in terms of lower manufacturing cost or higher manufacturing yield because the manufacturing process of the white light-emitting device is simpler than that of the light-emitting device having an SBS structure.

REFERENCE NUMERALS

100: semiconductor device, 101: state control portion, 102: CPU core, 103A: register file, 103B: pipeline register, 103C: pipeline register, 103: register portion, 104: arithmetic portion, 105: register bank, 106: general register, 110: register, 120: scan flip-flop, 121: selector, 122: flip-flop, 130: data retention circuit, 131[1]: memory circuit, 131[2]: memory circuit, 131[3]: memory circuit, 131[4]: memory circuit, 131: memory circuit, 132: transistor, 133: transistor, 134: transistor, 135: capacitor, 151: wiring, 152: wiring, 153: standard cell, 161: control circuit, 162: PC, 163: bus interface, 171: memory device

The invention claimed is:

1. A semiconductor device comprising a state control portion and a processor core,
wherein the processor core comprises an arithmetic portion and a register portion comprising a register configured to retain data that is input to or output from the arithmetic portion,
wherein the register comprises a flip-flop and a plurality of data retention circuits,
wherein the flip-flop comprises a first transistor comprising silicon in a channel formation region,
wherein an input terminal of the flip-flop is electrically connected to each of output terminals of the plurality of data retention circuits,
wherein an output terminal of the flip-flop is electrically connected to each of input terminals of the plurality of data retention circuits,
wherein the plurality of data retention circuits comprises a second transistor comprising an oxide semiconductor in a channel formation region,
wherein each of the plurality of data retention circuits is configured to retain a potential corresponding to data that corresponds to a plurality of tasks executed by the processor core when the second transistor is in a non-conduction state, and
wherein the state control portion is configured to rewrite data that the flip-flop has on the basis of the data retained in the plurality of data retention circuits in accordance with the plurality of tasks executed by the processor core.

2. The semiconductor device according to claim 1, wherein the plurality of data retention circuits comprises a region overlapping with the flip-flop in a plan view.

3. The semiconductor device according to claim 1, wherein the flip-flop is apart from another flip-flop in a plan view.

4. The semiconductor device according to claim 1, wherein the oxide semiconductor comprises In, Ga and Zn.

5. The semiconductor device according to claim 1, further comprising a memory device,
wherein the memory device is over a layer comprising the data retention circuits.

6. The semiconductor device according to claim 1, further comprising a product-sum operation device,
wherein the product-sum operation device comprises a data retention portion in a layer comprising the plurality of data retention circuits.

7. A display apparatus comprising:
the semiconductor device according to claim 1; and
a display portion,
wherein the display portion comprises a pixel circuit, and
wherein a transistor included in the pixel circuit comprises an oxide semiconductor in a channel formation region.

8. A data processing system to perform data processing with switching between a plurality of tasks using the semiconductor device according to claim 1,
wherein even after an operation in which another task interrupts and a yet another task interrupts is executed during program processing by the plurality of tasks, processing of the original task is resumed on the basis of interrupted data.

9. A control system of a semiconductor device involving switching between an active state and a power gating state using the semiconductor device according to claim 1, the control system comprising:
a plurality of peripheral circuits;
a plurality of state control portions corresponding to the plurality of peripheral circuits; and
a plurality of buffer registers corresponding to the plurality of state control portions,
wherein each of the plurality of state control portions is configured to control a state of a respective peripheral circuit that is an active state or a power gating state,
wherein the buffer registers are configured to retain setting data written to setting registers included in the plurality of state control portions, and
wherein switching between the active state and the power gating state in each of the plurality of peripheral circuits is executed by transferring the setting data from the buffer registers to the setting registers all at once.

* * * * *